(12) United States Patent
Go et al.

(10) Patent No.: US 12,541,145 B2
(45) Date of Patent: Feb. 3, 2026

(54) PHOTOMASK, OPTICAL-WAVEGUIDE, OPTICAL CIRCUIT AND METHOD OF MANUFACTURING AN OPTICAL-WAVEGUIDE

(71) Applicant: NTT, Inc., Tokyo (JP)

(72) Inventors: Takashi Go, Musashino (JP); Ai Yanagihara, Musashino (JP); Keita Yamaguchi, Musashino (JP); Kenya Suzuki, Musashino (JP)

(73) Assignee: NTT, Inc., Tokyo (JP)

( * ) Notice: Subject to any disclaimer, the term of this patent is extended or adjusted under 35 U.S.C. 154(b) by 497 days.

(21) Appl. No.: 18/040,034

(22) PCT Filed: Aug. 5, 2020

(86) PCT No.: PCT/JP2020/030071
§ 371 (c)(1),
(2) Date: Jan. 31, 2023

(87) PCT Pub. No.: WO2022/029939
PCT Pub. Date: Feb. 10, 2022

(65) Prior Publication Data
US 2023/0259017 A1    Aug. 17, 2023

(51) Int. Cl.
*G03F 1/42* (2012.01)
*G02B 6/13* (2006.01)
*G03F 9/00* (2006.01)

(52) U.S. Cl.
CPC ............ *G03F 1/42* (2013.01); *G02B 6/13* (2013.01); *G03F 9/7076* (2013.01); *G03F 9/708* (2013.01)

(58) Field of Classification Search
CPC .......................................... G03F 1/42
See application file for complete search history.

(56) References Cited

U.S. PATENT DOCUMENTS

2004/0017974 A1*   1/2004   Balch ............... G02B 6/4228
                                                                 385/50

FOREIGN PATENT DOCUMENTS

JP    H08-122551 A    5/1996
JP    2005-534964 A   11/2005

OTHER PUBLICATIONS

Akira Himeno, et al., *Silica-Based Planar Lightwave Circuits*, IEEE Journal of Selected Topics in Quantum Electronics, Vo. 4, No. 6, Nov./Dec. 1998, pp. 913-924.

(Continued)

*Primary Examiner* — Chanceity N Robinson
(74) *Attorney, Agent, or Firm* — Workman Nydegger

(57) ABSTRACT

In an optical circuit divided into a plurality of partial circuits, an optical waveguide having a low optical loss at a connection portion is provided. A photomask in which a waveguide pattern of an optical circuit is divided into a plurality of regions and drawn, the photomask including a waveguide pattern for drawing a joint region in which a waveguide width changes as a waveguide goes toward an outer peripheral portion, to connect a plurality of the waveguides divided and drawn to each other, in which the waveguides are connected to each other by overlapping the joint regions of two of the photomasks and performing exposure.

8 Claims, 42 Drawing Sheets

(56) References Cited

OTHER PUBLICATIONS

Takashi Goh, et al., *Low Loss and High Extinction Ratio Strictly Non-Blocking 16×16 Thermooptic Matrix Switch on 6—In Wafer Using Silica-Based Planar Lightwave Circuit Technology*, IEEE Journal of Lightwave Technology, vol. 19, No. 3, Mar. 2001, pp. 371-379.

Toshio Watanabe, et al., *Compact PLC-based transponder aggregator for colorless and directionless ROADM*, in Proceedings, Optical Fiber Communication Conference and NFOEC 2011, paper OTuD3, Mar. 2011, pp. 1-4.

Tae Joon Seok, et al., 240×240 Wafer-Scale Silicon Photonic Switches, in Proceedings, Optical Fiber Communication Conference 2019, paper Th1E.5, Mar. 2019, pp. 1-3.

\* cited by examiner

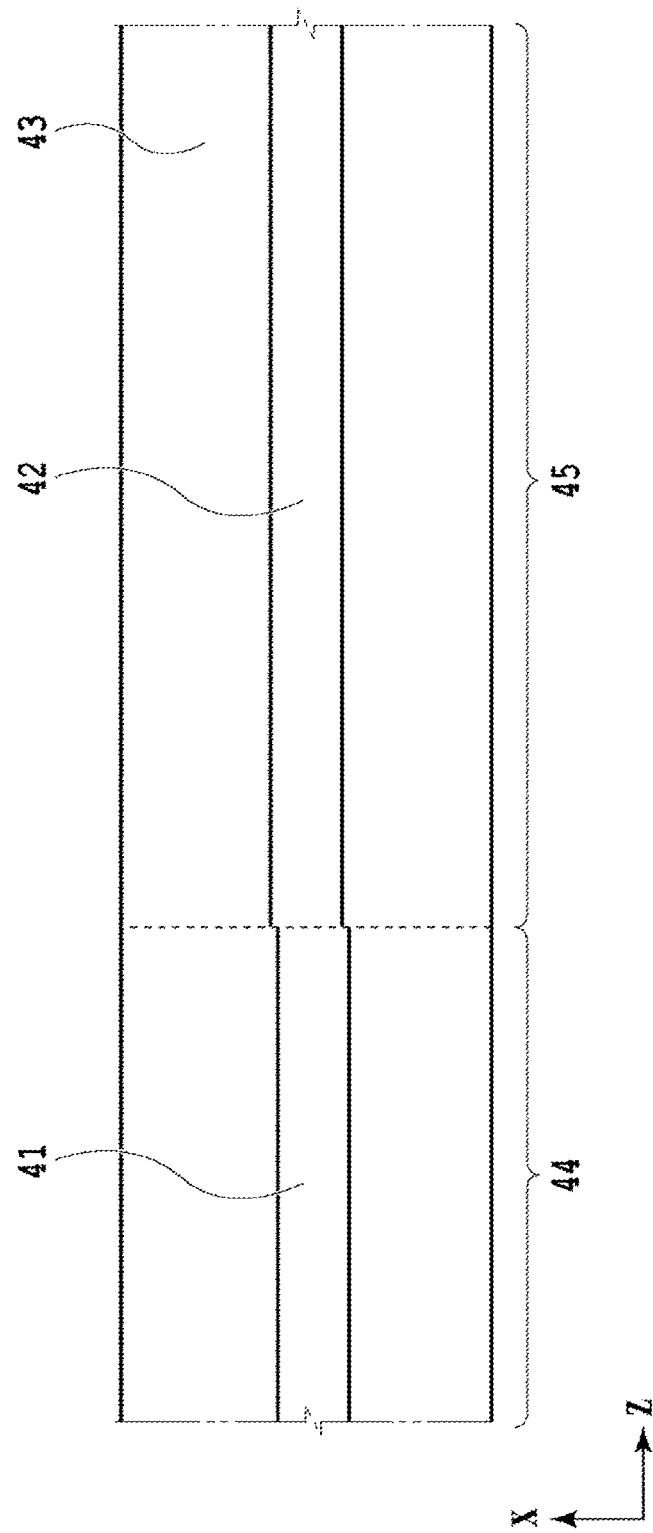

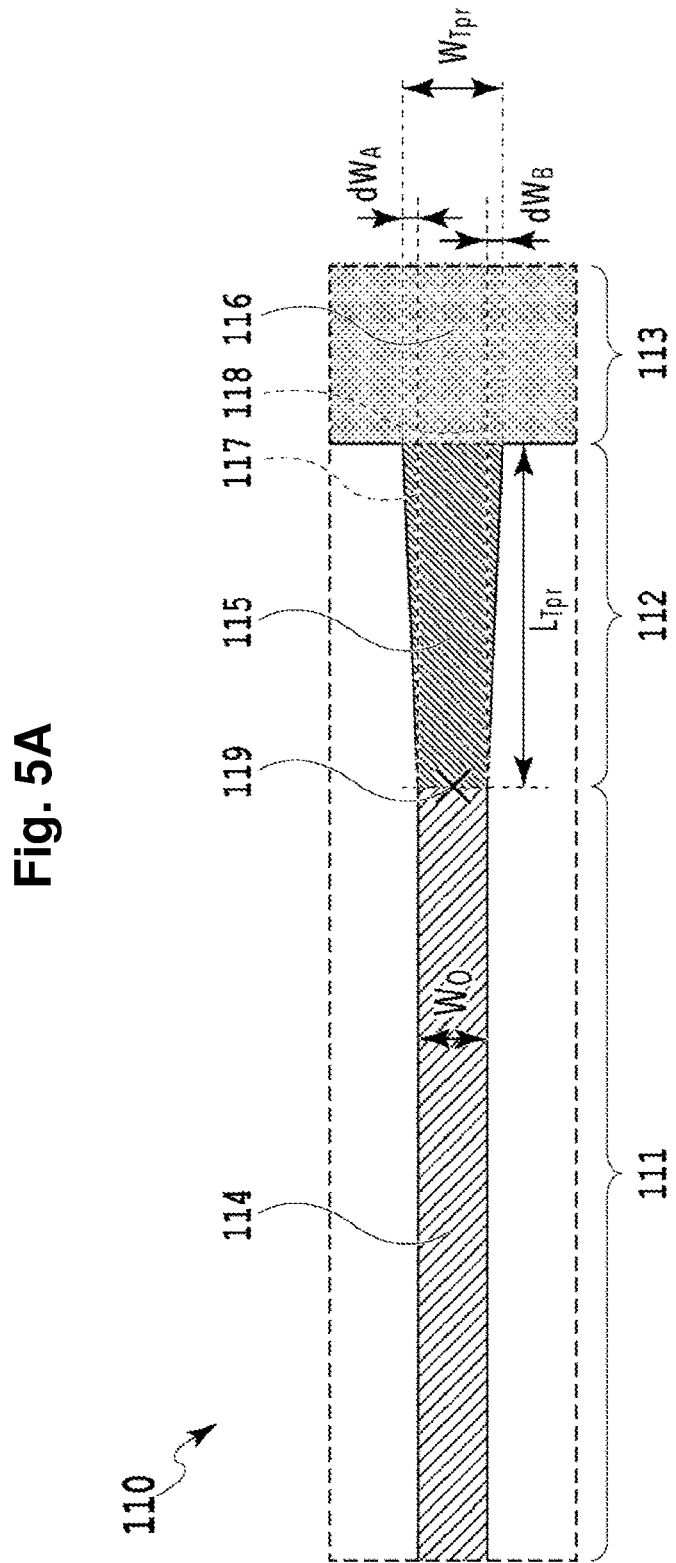

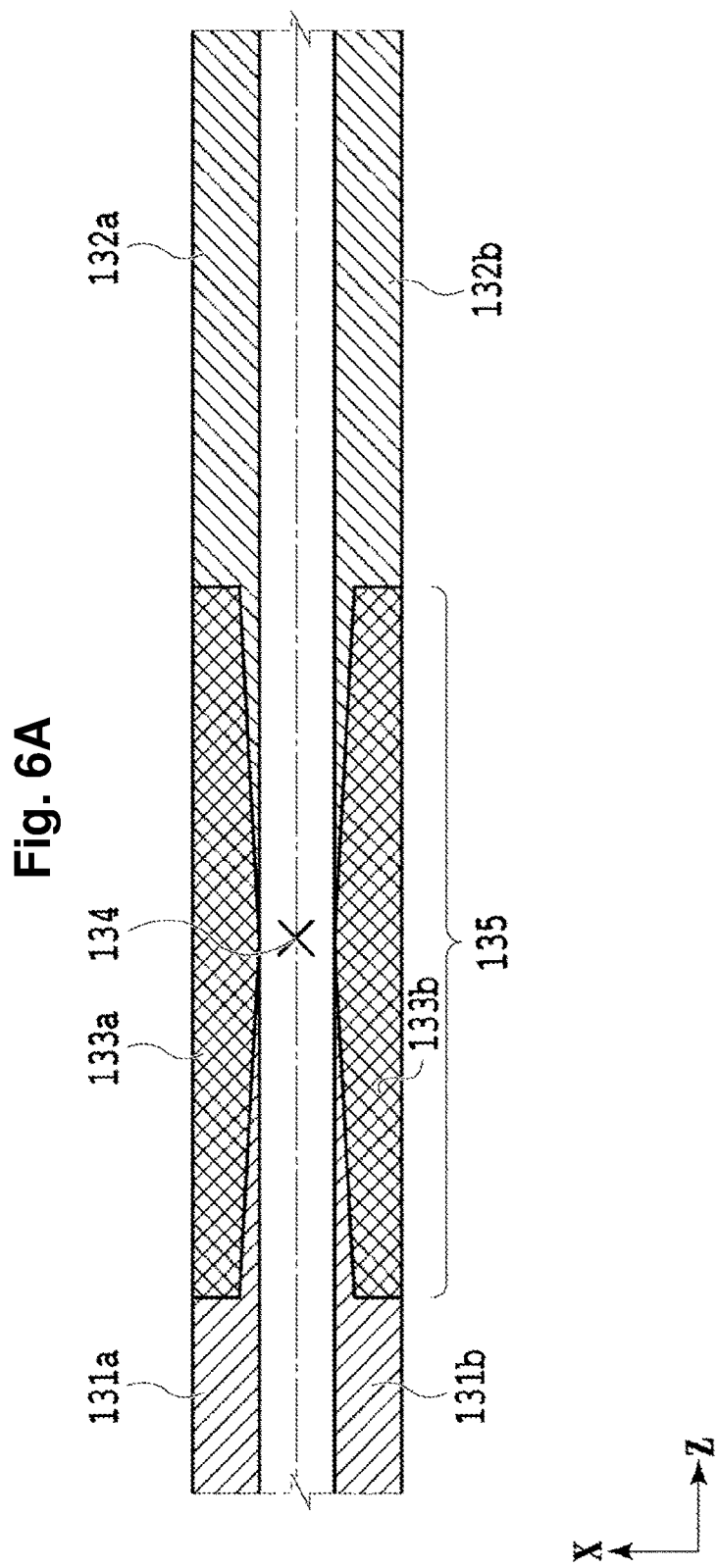

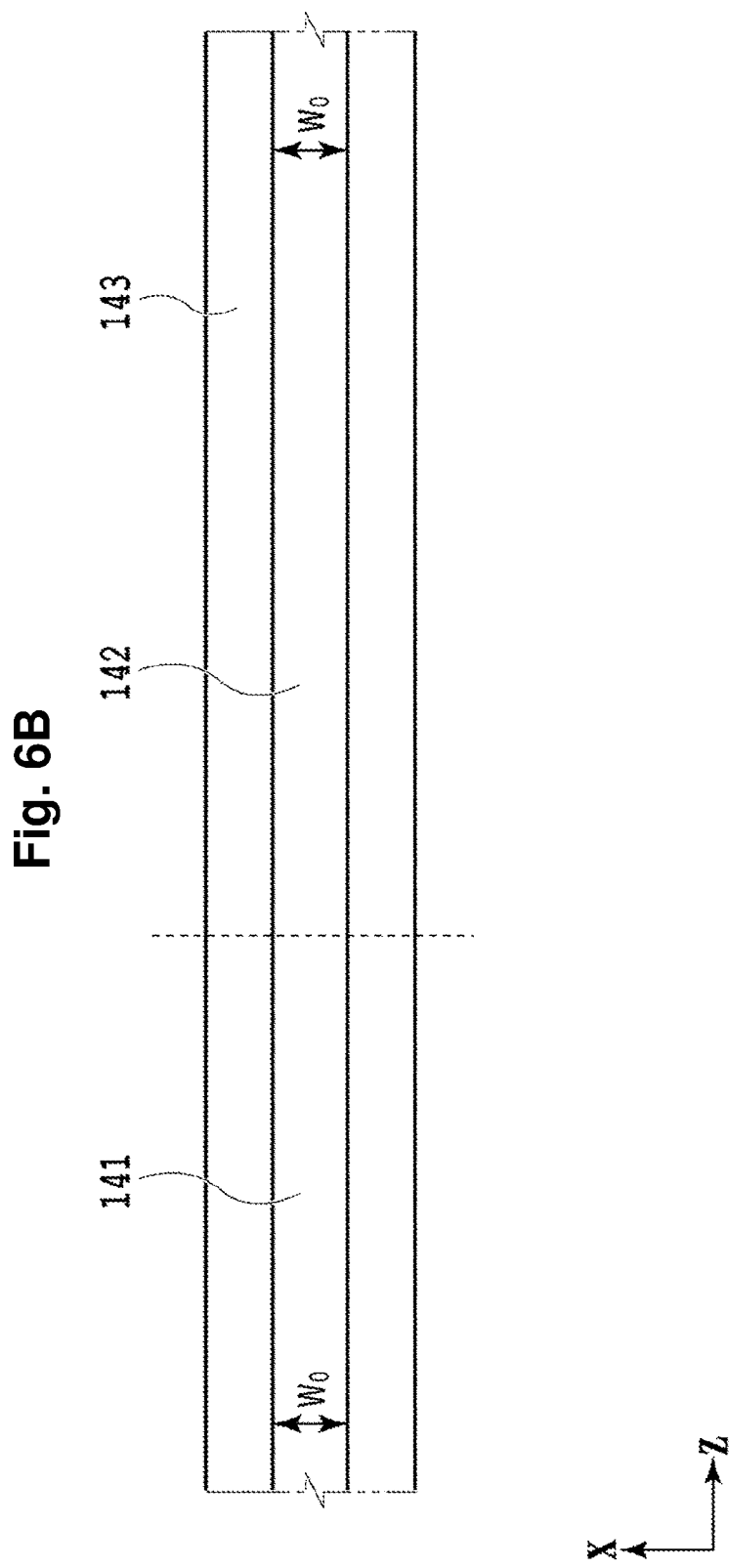

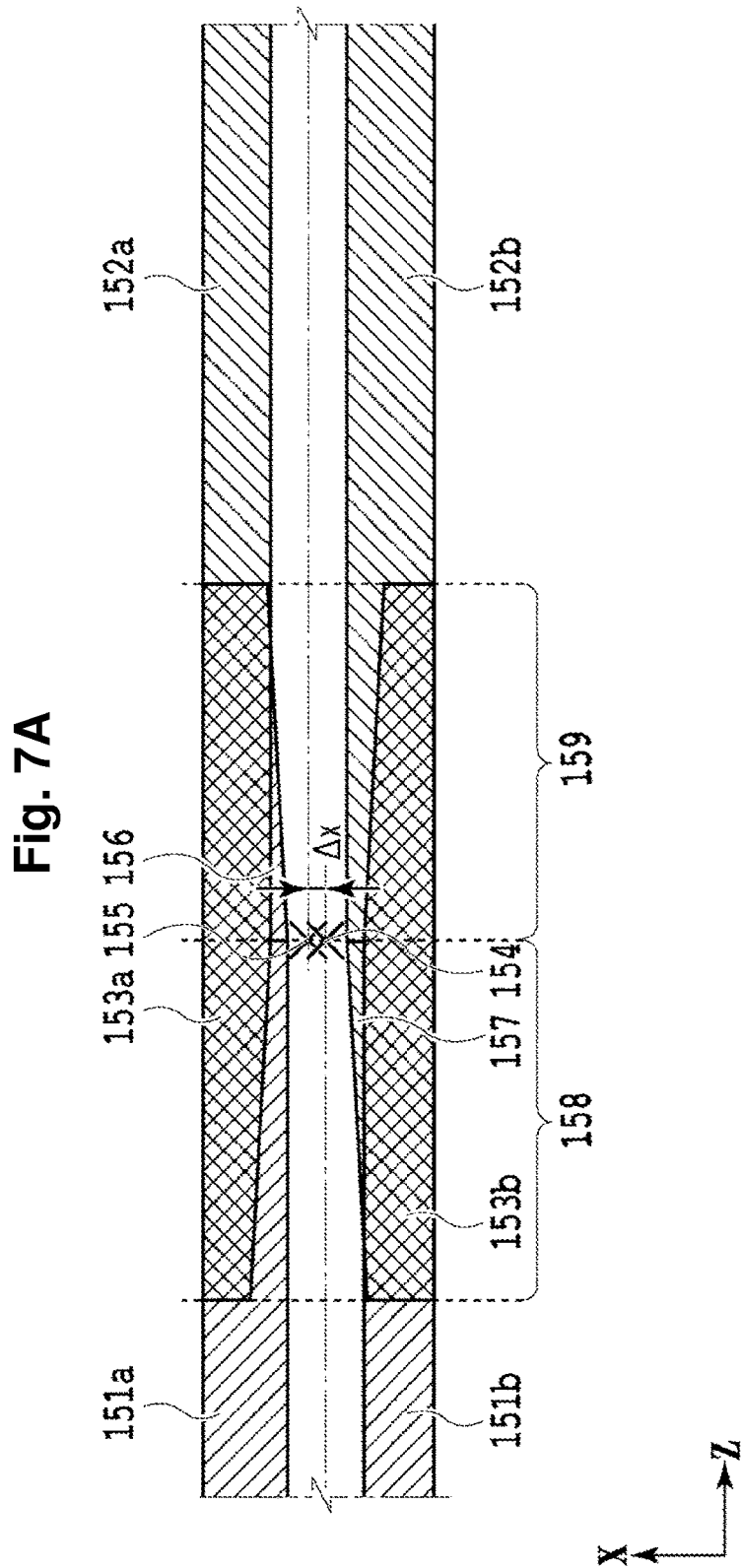

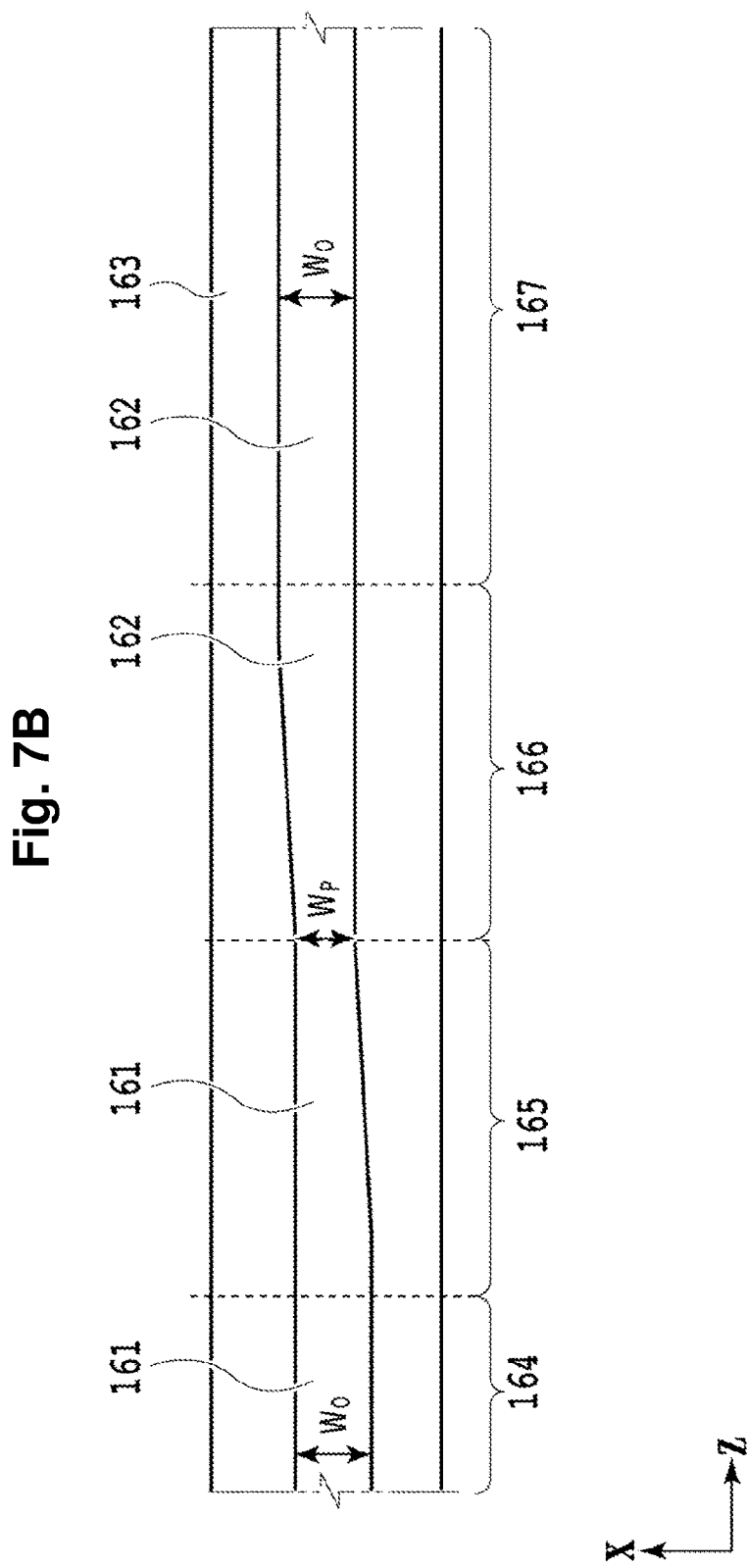

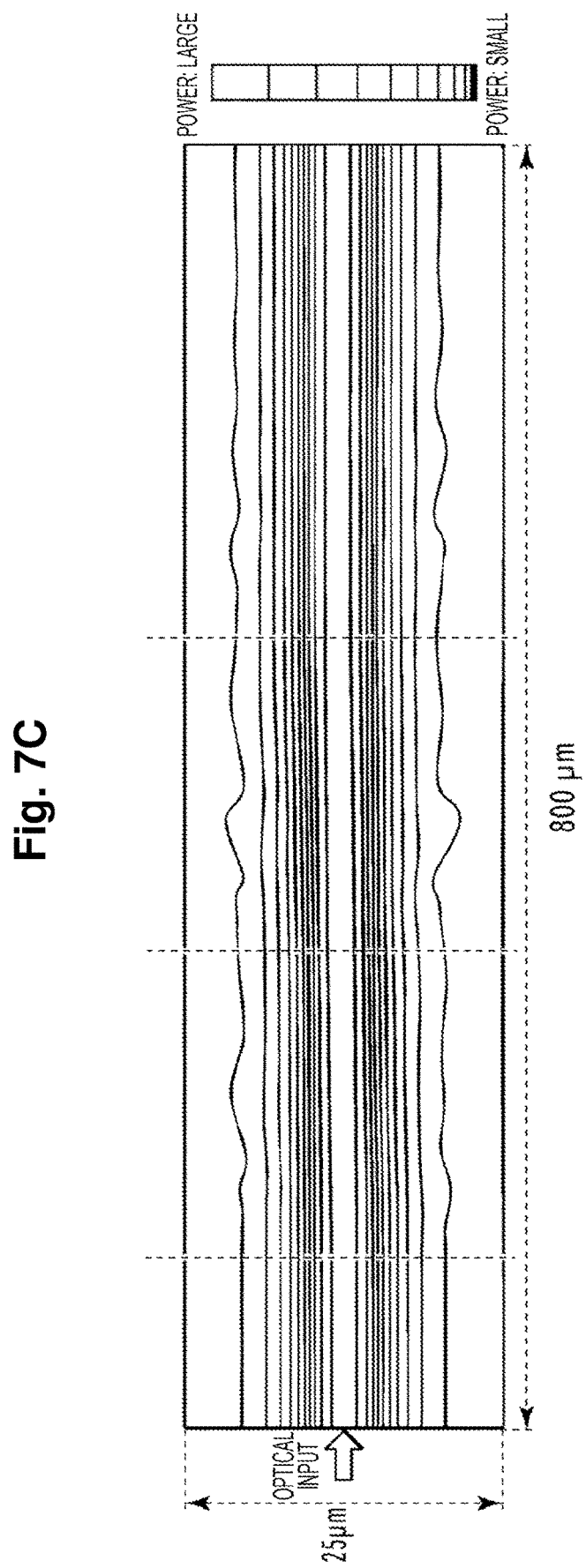

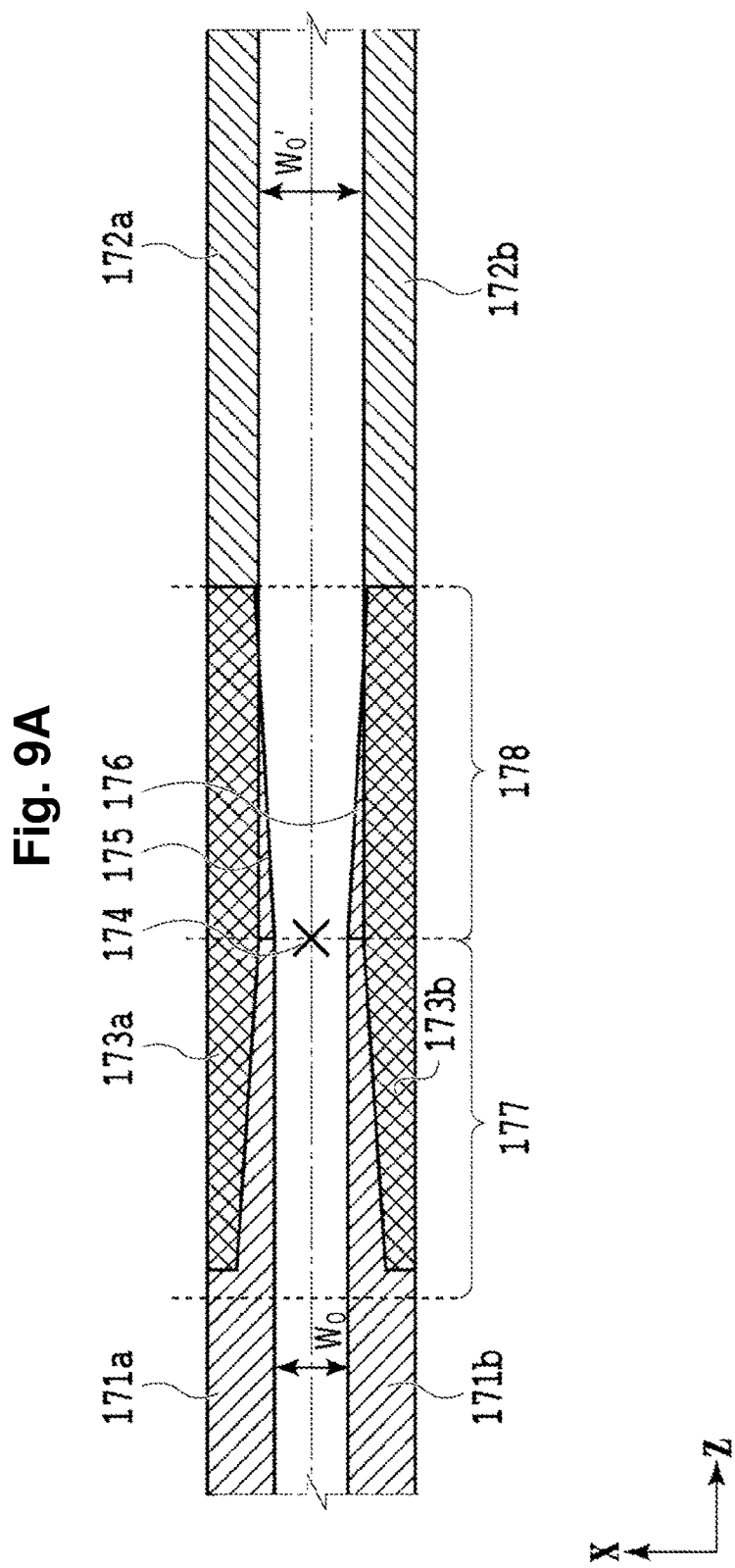

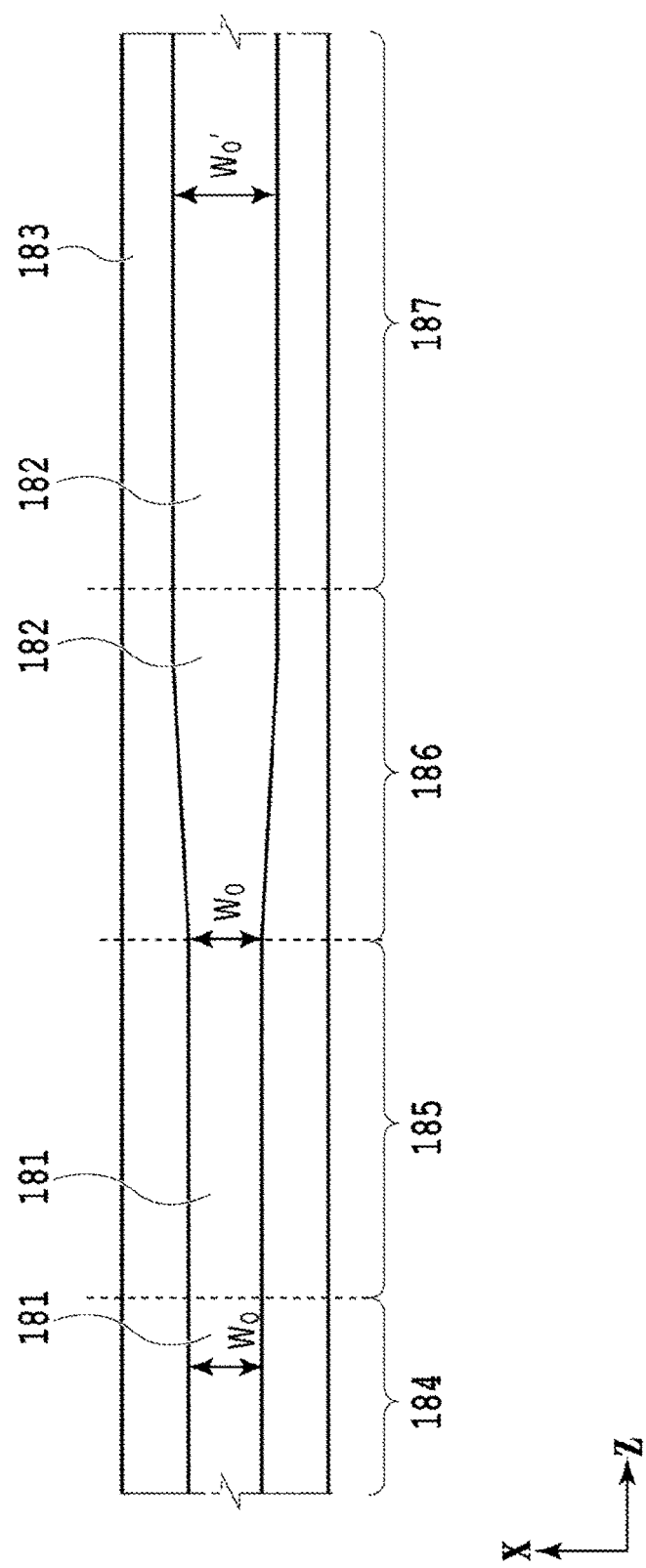

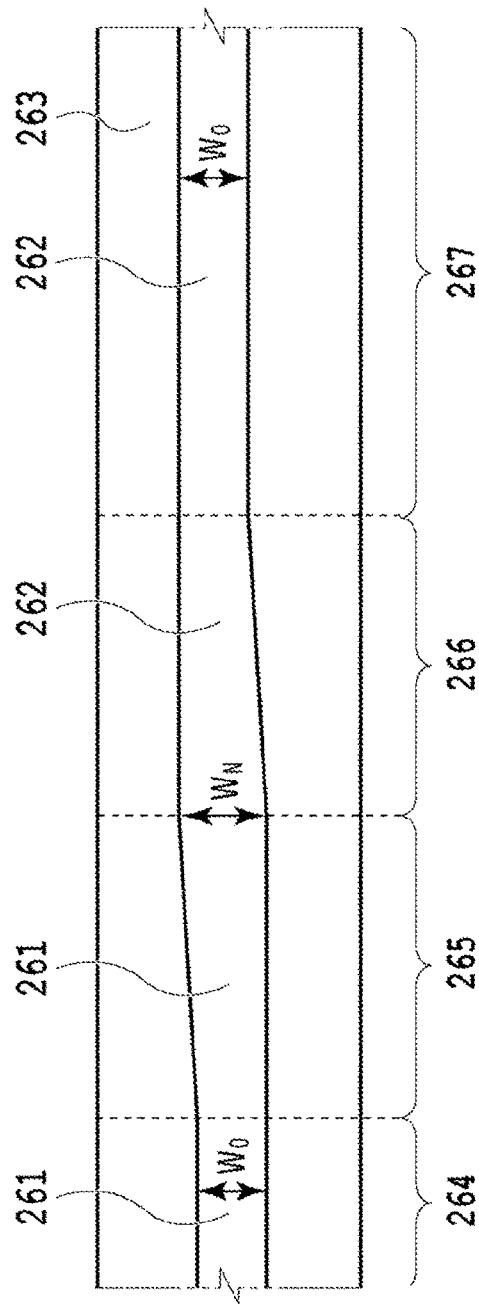

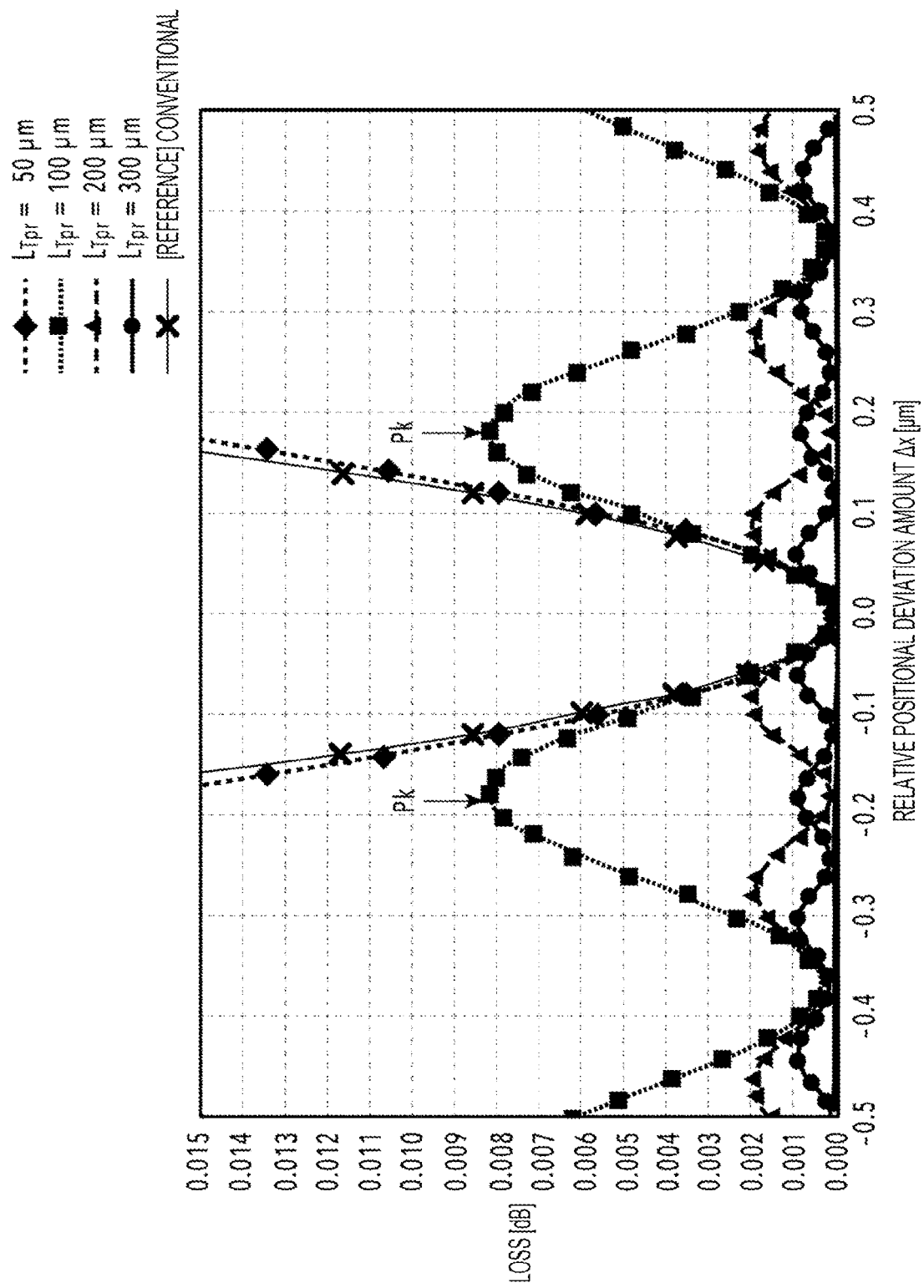

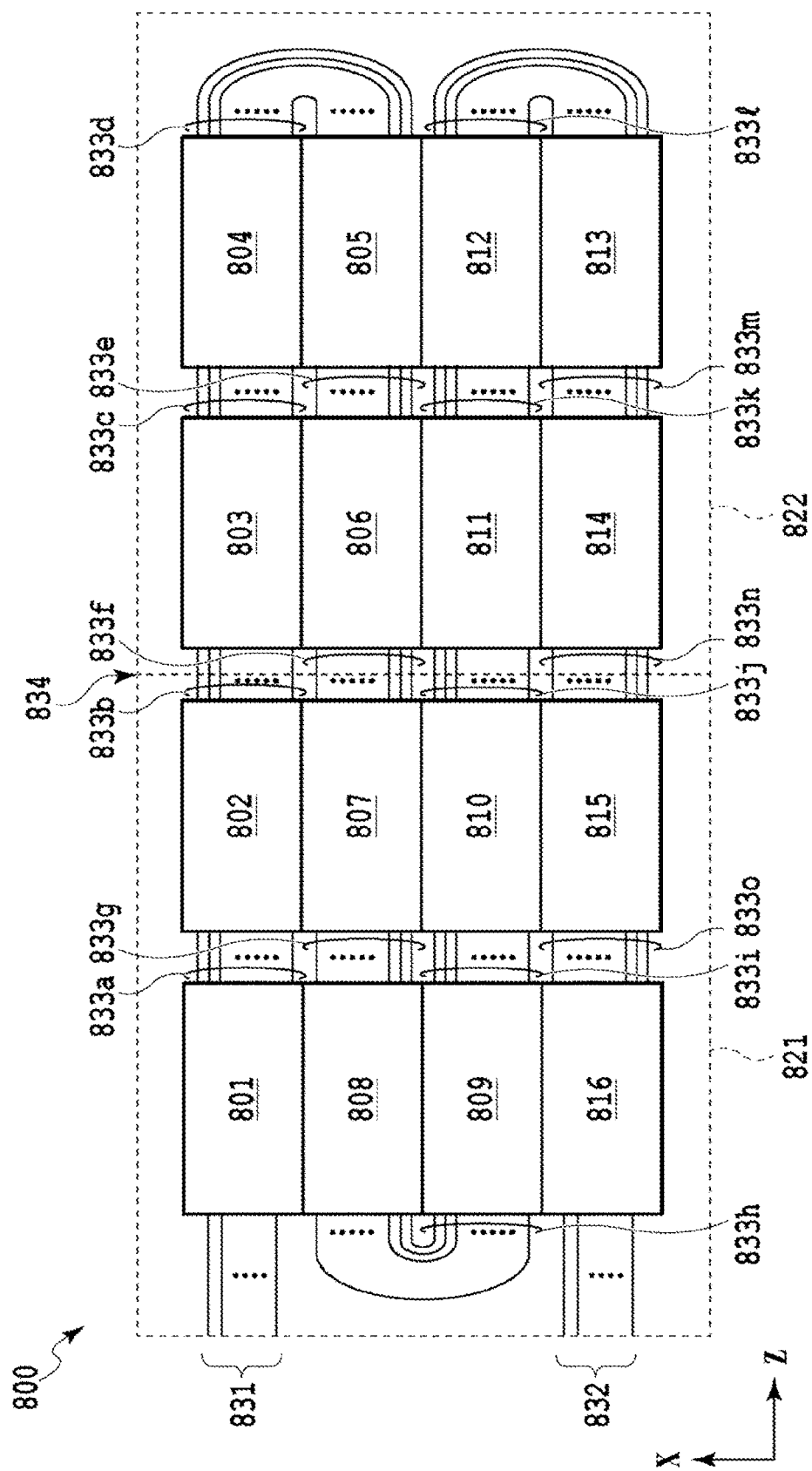

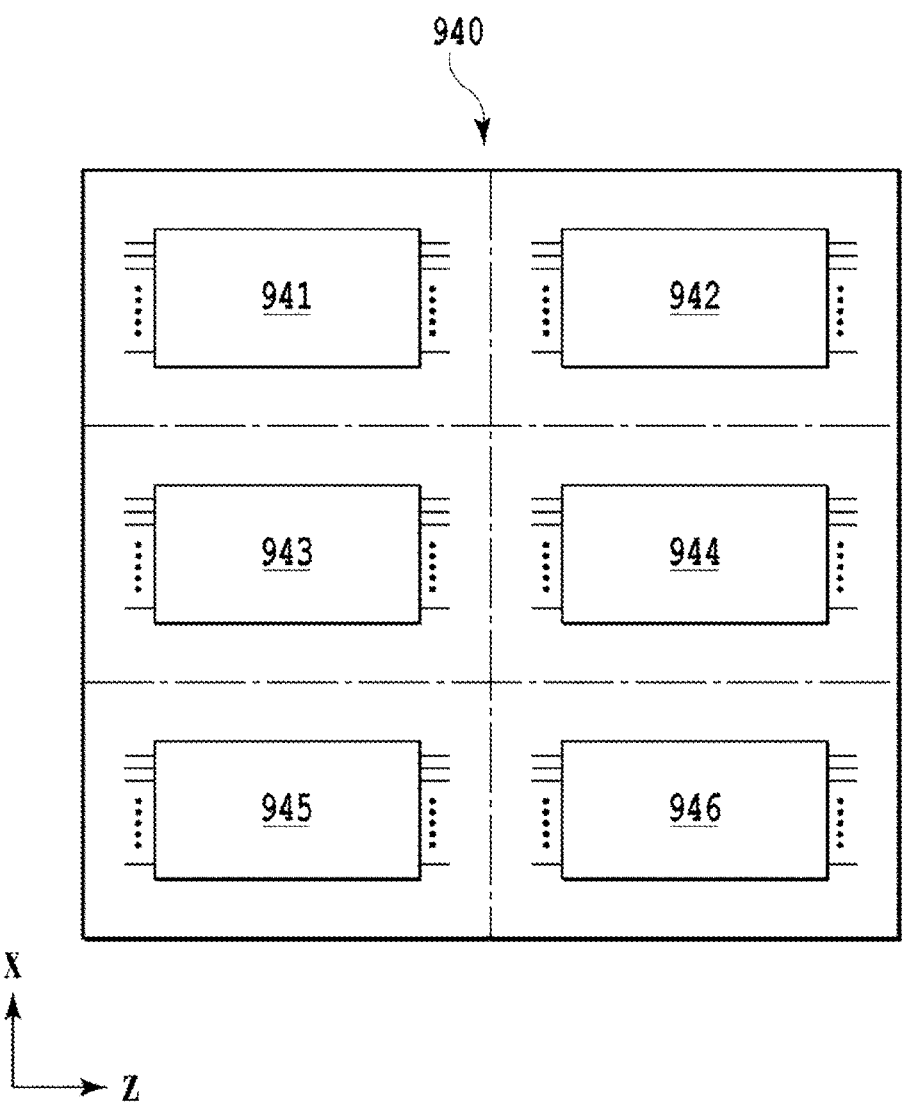

PHOTOMASK, OPTICAL-WAVEGUIDE, OPTICAL CIRCUIT AND METHOD OF MANUFACTURING AN OPTICAL-WAVEGUIDE

TECHNICAL FIELD

The present invention relates to an optical waveguide, an optical circuit, and a method of manufacturing the optical waveguide, and more particularly to an optical waveguide manufactured using a divided photomask, an optical circuit to which the waveguide is applied, and a method of manufacturing the optical waveguide.

BACKGROUND ART

An optical circuit of a waveguide optical type using an optical waveguide formed on a substrate is compact and excellent in integration as compared with an optical circuit of a free space optical type in which bulk optical components such as lenses and prisms are assembled. In addition, the optical circuit of the waveguide optical type is characterized by high long-term stability and reliability, and is widely used in practical systems such as optical communication devices. For example, in an optical circuit using a silica-based waveguide, a wavelength multiplexer/demultiplexer called an arrayed waveguide grating in which a large number of waveguides are arranged in an array, an optical switch including a Mach-Zehnder interferometer with a variable phase shifter, and the like have been put into practical use (see, for example, Non Patent Literatures 1 to 3). In addition, in an optical circuit using a waveguide made of a dielectric material such as lithium niobate or a semiconductor material such as indium phosphorus or silicon, an optical modulator, a demodulator, and the like have been put into practical use. In these optical circuits, a circuit pattern is formed by a pattern transfer step using a photomask to cope with mass production manufacturing. For example, in the silica-based waveguide, an optical circuit is formed in the following steps.

FIGS. 1A to 1D are cross-sectional views illustrating steps of manufacturing an optical circuit using a conventional silica-based waveguide. As illustrated in FIG. 1A, an underclad 11 and a core layer 12 are sequentially deposited on a substrate 10, and a photoresist 13 is applied thereon. Next, the optical circuit pattern on the photomask is transferred to the photoresist 13 in exposure/development steps. At this time, in a case where a positive photoresist is used, a photomask in which a pattern that shields a portion to be a core and transmits other portions is drawn is used. On the other hand, in a case where a negative photoresist is used, a photomask in which a pattern that transmits the portion to be the core and shields the other portions is drawn is used. In either case, as illustrated in FIG. 1B, a photoresist 14 on the upper portion of the portion to be the core remains in the development step. Then, using the pattern-transferred photoresist 14 as a mask material, the core layer 12 is subjected to etching processing to form a waveguide core 15 as illustrated in FIG. 1C. As illustrated in FIG. 1D, finally, an overclad 16 is deposited after the photoresist 14 is removed, and the optical circuit in which the waveguide core 15 is embedded is completed. In this way, the optical circuit having the same pattern as the pattern drawn on the photomask is manufactured. Note that, by using a reduction projection exposure machine at the time of the exposure described above, the pattern drawn on the photomask may be reduced and transferred to manufacture an optical circuit having a fine circuit pattern.

In a current optical circuit technology, it is difficult to bend light with a small bending radius to have a low loss, and the size of the optical circuit therefore tends to be larger than that of an electronic circuit. In a large-scale optical circuit, a circuit pattern may not fit in one photomask. For this reason, the circuit pattern is divided into appropriate partial circuit patterns, and these partial circuit patterns are divided into a plurality of photomasks and drawn. In the exposure step, the partial circuit patterns are joined together to synthesize the original circuit pattern, whereby a desired optical circuit is manufactured.

FIGS. 2A and 2B illustrate examples of manufacturing a large-scale optical circuit using a plurality of photomasks. As illustrated in FIG. 2A, a desired large-scale circuit 20 has a configuration in which a large number of various element circuits are connected to each other by a waveguide. In this example, the large-scale circuit 20 connects partial circuit patterns 21 to 24 together at a plurality of connection portions (for example, a connection portion 25 in FIG. 2A). As illustrated in FIG. 2B, photomasks 31 to 34 are used in which the partial circuit patterns 21 to 24 are enlarged and drawn, and these partial circuit patterns are joined together and transferred by a reduction projection exposure machine, whereby the large-scale circuit 20 is manufactured. By using the plurality of photomasks for reduction projection obtained by division drawing, it is possible to manufacture a high-precision optical circuit even in a large-scale optical circuit.

As described above, in a case where an optical circuit is manufactured by joining partial circuit patterns drawn on a plurality of photomasks together in the exposure step, relative alignment accuracy of each photomask in the exposure step becomes a problem. When the relative alignment accuracy is low, a relative positional deviation occurs in each partial circuit pattern in the manufactured optical circuit, and a deviation occurs in a pattern of the waveguide at a joint portion of each partial circuit pattern.

FIG. 3A is a top view illustrating an example of a waveguide pattern at a joint portion in a case where there is a relative positional deviation of each photomask at the time of exposure. For example, it is assumed to be an enlarged view of the connection portion 25 of the partial circuit patterns 21 and 22 of the large-scale circuit 20 illustrated in FIG. 2A. A pattern is formed using the photomask 31 in a pattern region 44 on the left side including a waveguide core 41, and a pattern is formed using the photomask 32 in a pattern region 45 on the right side including a waveguide core 42. The relative positional deviation in the x direction perpendicular to a waveguide direction as illustrated in FIG. 3A means that an optical axis positional deviation occurs between the waveguides before and after the joint, that is, between the waveguide cores 41 and 42. For this reason, mismatch occurs in a field distribution of guided light before and after the joint, and a loss occurs. Note that a direction of the relative positional deviation of each partial circuit pattern can basically occur in any direction. Even in a case where a relative positional deviation in the z direction parallel to the waveguide direction occurs and the joint portion is separated and a gap is generated in the waveguide pattern, a loss occurs; however, in the case of the same amount of deviation, the loss to be generated by the optical axis positional deviation is larger than that generated by the gap.

FIG. 3B is a diagram illustrating a state of propagation of light in the waveguide pattern at the joint portion illustrated in FIG. 3A. The state of light propagation has been calculated by a beam propagation method (BPM) on the assumption that the optical axis positional deviation has occurred by 0.5 μm in a silica-based waveguide having a relative refractive index difference Δ of 2%, a core height of 3.4 μm, and a waveguide width of 5 μm, and guided light having a wavelength of 1.55 μm. Note that the scale, the waveguide width, and the amount of optical axis positional deviation in FIG. 3A are also illustrated in accordance with this assumption. In addition, since a binary image is illustrated, a state in which the power increases at a position closer to the waveguide center and decreases as the distance from the center increases is illustrated by simulating contour lines. To represent a region with small power in detail, contour lines are spaced at unequal intervals with respect to the power.

As can be seen from FIG. 3B, it can be seen that the light meanders after the joint portion. This is because a part of the guided light propagated in a fundamental mode is converted into a higher order mode or a radiation mode due to the optical axis positional deviation at the joint portion, and inter-mode interference between the converted light and the remaining guided light of the fundamental mode is visible. When the loss is calculated in this calculation, it can be seen that a loss of about 0.15 dB occurs at an optical axis positional deviation of 0.5 μm, and a loss of about 0.024 dB occurs at an optical axis positional deviation of 0.2 μm. Although this loss value seems to be not so large, since a plurality of joints are generated in a large-scale optical circuit, the total loss value is a non-negligible value. In addition, in a waveguide having a large relative refractive index difference such as a silicon waveguide, since the size of the core is small, the loss value for the same optical axis positional deviation is further increased.

To suppress of the loss due to pattern deviation of the waveguide at the joint portion, some avoidance means and mitigation means have been proposed. For example, in the method described in Patent Literature 1, a circuit pattern is divided so that a joint portion corresponds a slab waveguide, whereby the loss is prevented from occurring due to pattern deviation of the waveguide. This is because the slab waveguide does not confine light in the lateral direction unlike the channel waveguide, and thus the influence of the positional deviation of the joint portion is small. In addition, in the method described in Non Patent Literature 4, the waveguide width at the joint portion is made wider than the normal waveguide width, and the size in the lateral direction of the field distribution of the guided light is increased. As a result, the magnitude of the optical axis positional deviation is relatively reduced, and the influence of the pattern deviation of the waveguide on the loss is reduced.

However, the avoidance means and the mitigation means described in the above prior art have the following problems. Since the method described in Patent Literature 1 is based on the premise of using the slab waveguide, there has been a problem that the method can be applied only to an optical circuit including the slab waveguide in the optical circuit, such as an arrayed waveguide grating multiplexer/demultiplexer. In addition, even in the optical circuit including the slab waveguide, since a place where the circuit pattern is divided is limited to a slab waveguide portion, there has been also a problem that it is difficult to efficiently divide the circuit pattern into each photomask.

In the method described in Patent Literature 2, there has been a problem that a waveguide width needs to be considerably wider than a standard waveguide width to obtain a sufficient loss reduction effect against optical axis positional deviation.

FIG. 4 is a diagram illustrating a loss value with respect to an optical axis positional deviation amount Δx when a waveguide width W is changed in the waveguide pattern at the joint portion. Similarly to the above, the calculation condition is the silica-based waveguide having the relative refractive index difference Δ of 2% and the core height of 3.4 μm, and the wavelength of the guided light is 1.55 μm. Unless otherwise specified, similar conditions are used for subsequent loss calculation and BPM calculation. When the optical axis positional deviation of 0.5 μm is allowed, it is necessary to widen the waveguide width to about 30 μm to reduce the loss to less than or equal to 0.01 dB. In such a waveguide having a wide core width, there may be many higher order modes, and thus the guided light of the fundamental mode may be converted into a higher order mode by a slight disturbance such as side wall roughness of the waveguide. In addition, when the waveguide width is widened from a standard width of 5μm to a width of 30 μm, it is necessary to provide a long conversion length to change the waveguide width very slowly to suppress that the guided light in the fundamental mode is converted into a higher order mode. For example, in a case where a width change rate, that is, a ratio dw/dL of a change dw of the width to a conversion length dL is suppressed to less than or equal to 1%, the conversion length needs to be 2500 μm to change the waveguide width from 5 μm to 30 μm. This means that a large region for the joint is required in the circuit chip, which is not preferable.

CITATION LIST

Patent Literature

Patent Literature 1: Japanese Laid-Open Patent Publication No. Hei8-122551

Non Patent Literature

Non Patent Literature 1: Akira Himeno, et al., "Silica-based planar lightwave circuits," IEEE Journal of Selected Topics in Quantum Electronics, vo. 4, no. 6, pp. 913-924, November/December 1998.

Non Patent Literature 2: Takashi Goh, et al., "Low loss and high extinction ratio strictly non-blocking 16×16 thermooptic matrix switch on 6-in wafer using silica-based planar lightwave circuit technology," IEEE Journal of Lightwave Technology, vol. 19, no. 3, pp. 371-379, March 2001.

Non Patent Literature 3: Toshio Watanabe, et al., "Compact PLC-based transponder aggregator for colorless and directionless ROADM," in Proceedings, Optical Fiber Communication Conference and NFOEC 2011, paper OTuD3, March 2011.

Non Patent Literature 4: Tae Joon Seok, et al., "240×240 wafer-scale silicon photonic switches," in Proceedings, Optical Fiber Communication Conference 2019, paper Th1E.5, March 2019.

SUMMARY OF INVENTION

An object of the present invention is to provide an optical waveguide having a low optical loss at a connection portion in an optical circuit divided into a plurality of partial circuits.

In the present invention, to achieve such an object, an embodiment is a photomask in which a waveguide pattern of an optical circuit is divided into a plurality of regions and drawn, the photomask including, in order to connect waveguides divided and drawn to each other, a waveguide pattern for drawing a joint region in which a width of each waveguide changes as the each waveguide goes toward an outer peripheral portion, wherein the waveguides are connected to each other by overlapping the joint regions of two of the photomasks and performing exposure.

In addition, in the waveguide pattern, the width of each waveguide changes such that overlapping of the joint regions decreases.

Further, the waveguide pattern is a linear taper pattern in which the width of each waveguide changes linearly as the each waveguide goes toward the outer peripheral portion or a non-linear taper pattern in which the width of each waveguide changes non-linearly.

Further, in the linear taper pattern and the non-linear taper pattern, the width of each waveguide changes as the each waveguide goes from an alignment position where the two photomasks overlap each other toward the outer peripheral portion.

Further, the waveguide width of the waveguide pattern is set such that a field distribution of a propagation mode of light changes adiabatically with propagation in the joint region.

Further, in the waveguide pattern, a waveguide direction in the joint region may be laid out obliquely ($\theta \neq 90°$) with respect to a division boundary line.

Further, in the waveguide pattern, the joint region may be a part of a bent waveguide.

Further, a waveguide width of the joint region exposed with the two photomasks in an overlapping manner is different from a waveguide width of another region depending on an amount of exposure.

Further, the waveguide may be a single mode waveguide.

An embodiment of the optical waveguide is manufactured with the photomask described above.

In an embodiment of the optical circuit, the photomask is divided into a first photomask including waveguide patterns of a plurality of optical function circuits, and a second photomask including a waveguide pattern of a waveguide connected to each of the optical function circuits, the waveguide patterns of the optical function circuits have different circuit characteristic parameters or different functions, and the optical circuit is manufactured by combining the first photomask of an optical function circuit selected from the plurality of optical function circuits with the second photomask.

In addition, a drawing magnification of the first photomask is different from a drawing magnification of the second photomask.

In an embodiment of a method of manufacturing an optical waveguide, a photomask in which a waveguide pattern of an optical circuit is divided into a plurality of regions and drawn includes, in order to connect waveguides divided and drawn to each other, a waveguide pattern for drawing a joint region in which a width of each waveguide changes as the each waveguide goes toward an outer peripheral portion and drawn to each other, and the optical waveguide is manufactured by overlapping the joint regions of two of the photomasks and performing exposure.

According to the above-described embodiments, in a case where a desired optical circuit is manufactured by joining a plurality of partial circuit patterns together in an exposure step, even if alignment accuracy of each partial circuit pattern is low, in any channel waveguide, a loss at a joint portion can be suppressed to be extremely low, and an area of a region of the joint portion can be suppressed to be small.

Another embodiment of the present invention is an optical waveguide manufactured with a photomask in which a waveguide pattern of an optical circuit is divided into a plurality of regions and drawn, in which joint regions of two photomasks are overlapped and exposure is performed, the divided regions are connected together, and a field distribution of a propagation mode changes adiabatically with propagation of light, in the joint region.

The propagation mode may be a single mode.

In the joint region, the waveguide width changes as the waveguide goes toward the outer peripheral portion of the photomask. Preferably, the waveguide width changes such that overlapping of the joint regions decreases.

In addition, it is a linear taper pattern in which the waveguide width changes linearly as the waveguide goes toward the outer peripheral portion or a non-linear taper pattern in which the waveguide width changes non-linearly.

Further, in the linear taper pattern and the non-linear taper pattern, the waveguide width changes as the waveguide goes from an alignment position where the two photomasks overlap each other toward the outer peripheral portion.

Further, the waveguide direction in the joint region may be laid out obliquely ($\theta \neq 90°$) with respect to the division boundary line.

Further, in the waveguide pattern, the joint region may be a part of a bent waveguide.

Further, the waveguide width of the joint region exposed with the two photomasks in an overlapping manner is different from the waveguide width of another region depending on an amount of exposure.

Still another embodiment of the present invention is an optical circuit manufactured with a photomask in which a waveguide pattern is divided into a plurality of regions and drawn, in which the optical circuit includes an optical waveguide in which joint regions of two photomasks are overlapped and exposure is performed, and the divided regions are connected together.

In the optical waveguide, the field distribution of the propagation mode changes adiabatically with propagation of light, in the joint region. The propagation mode may be a single mode.

In the joint region, the waveguide width changes as the waveguide goes toward the outer peripheral portion of the photomask. Preferably, the waveguide width changes such that overlapping of the joint regions decreases.

In addition, it is a linear taper pattern in which the waveguide width changes linearly as the waveguide goes toward the outer peripheral portion or a non-linear taper pattern in which the waveguide width changes non-linearly.

Further, in the linear taper pattern and the non-linear taper pattern, the waveguide width changes as the waveguide goes from an alignment position where the two photomasks overlap each other toward the outer peripheral portion.

Further, the optical waveguide may be laid out obliquely ($\theta \neq 90°$) with respect to the division boundary line.

Further, the optical waveguide may be a bent waveguide in the joint region.

Further, the waveguide width of the joint region exposed with the two photomasks in an overlapping manner is different from the waveguide width of another region depending on an amount of exposure.

Still another embodiment of the present invention is a method for manufacturing an optical circuit, with a photomask in which a waveguide pattern obtained by division into a plurality of regions is drawn, in which waveguides divided and drawn are connected to each other by using the photomask including the waveguide pattern for drawing a joint region in which a waveguide width changes as the waveguide goes toward an outer peripheral portion, to connect the waveguides divided and drawn to each other, and overlapping the joint regions of two of the photomasks and performing exposure.

In addition, in the waveguide pattern, the waveguide width changes such that overlapping of the joint regions decreases.

Further, the waveguide pattern is a linear taper pattern in which the waveguide width changes linearly as the waveguide goes toward the outer peripheral portion or a non-linear taper pattern in which the waveguide width changes non-linearly.

Further, in the linear taper pattern and the non-linear taper pattern, the waveguide width changes as the waveguide goes from an alignment position where the two photomasks overlap each other toward the outer peripheral portion.

Further, the waveguide width of the waveguide pattern is set such that a field distribution of a propagation mode of light changes adiabatically with propagation in the joint region.

Further, in the waveguide pattern, the waveguide direction in the joint region may be laid out obliquely ($\theta \neq 90°$) with respect to the division boundary line.

Further, in the waveguide pattern, the joint region may be a part of a bent waveguide.

Further, the waveguide width of the joint region exposed with the two photomasks in an overlapping manner is different from the waveguide width of another region depending on an amount of exposure.

BRIEF DESCRIPTION OF DRAWINGS

FIG. 3A is a top view illustrating an example of a waveguide pattern at a joint portion in a case where there is a relative positional deviation of each photomask at the time of exposure.

FIG. 5A is a diagram illustrating a photomask pattern in a joint portion of a waveguide of a partial circuit pattern divided into each photomask according to a first embodiment of the present invention.

FIG. 6A is a diagram illustrating a state of an exposure pattern in a case where there is no relative positional deviation of each photomask at the time of exposure.

FIG. 6B is a top view illustrating a waveguide pattern at a joint portion manufactured with the exposure pattern illustrated in FIG. 6A.

FIG. 7A is a diagram illustrating a state of an exposure pattern in a case where there is a relative positional deviation of each photomask at the time of exposure.

FIG. 7B is a top view illustrating a waveguide pattern at a joint portion manufactured with the exposure pattern illustrated in FIG. 7A.

FIG. 7C is a diagram illustrating a state of propagation of light in the waveguide pattern at the joint portion illustrated in FIG. 7B.

FIG. 9A is a diagram illustrating a state of an exposure pattern in a case where an amount of exposure is different in each photomask at the time of exposure.

FIG. 9B is a top view illustrating a waveguide pattern at a joint portion manufactured with the exposure pattern illustrated in FIG. 9A.

FIG. 11B is a top view illustrating a waveguide pattern at a joint portion manufactured with the exposure pattern illustrated in FIG. 7A.

FIG. 12B is a diagram in which the scale of the vertical axis in FIG. 12A is multiplied by 10.

FIG. 18 is a diagram illustrating a configuration of an optical circuit in Example 1 of the present invention.

FIG. 19B is a diagram illustrating a layout on a photomask of a switch element array of Example 2.

DESCRIPTION OF EMBODIMENTS

Hereinafter, embodiments of the present invention will be described in detail with reference to the drawings. In the present embodiments, an example will be shown in which a silica-based waveguide is used; however, a pattern shape drawn on a photomask or a pattern shape of a waveguide to be manufactured does not specify a material of the waveguide. Thus, the present invention can be applied not only to the silica-based waveguide but also to a case of using another material-based waveguide such as a silicon (Si) waveguide, an indium phosphide (InP)-based waveguide, or a polymer-based waveguide. In addition, as a specific design example of the waveguide, a waveguide having a relative refractive index difference Δ of 2%, a core height of 3.4 and a basic waveguide width of 5 μm will be described, but the present invention is not limited to these waveguide basic parameters, and a similar idea can be applied in the case of other parameters.

First Embodiment: Basic Form in Case of Using Positive Resist

Figure 2A:
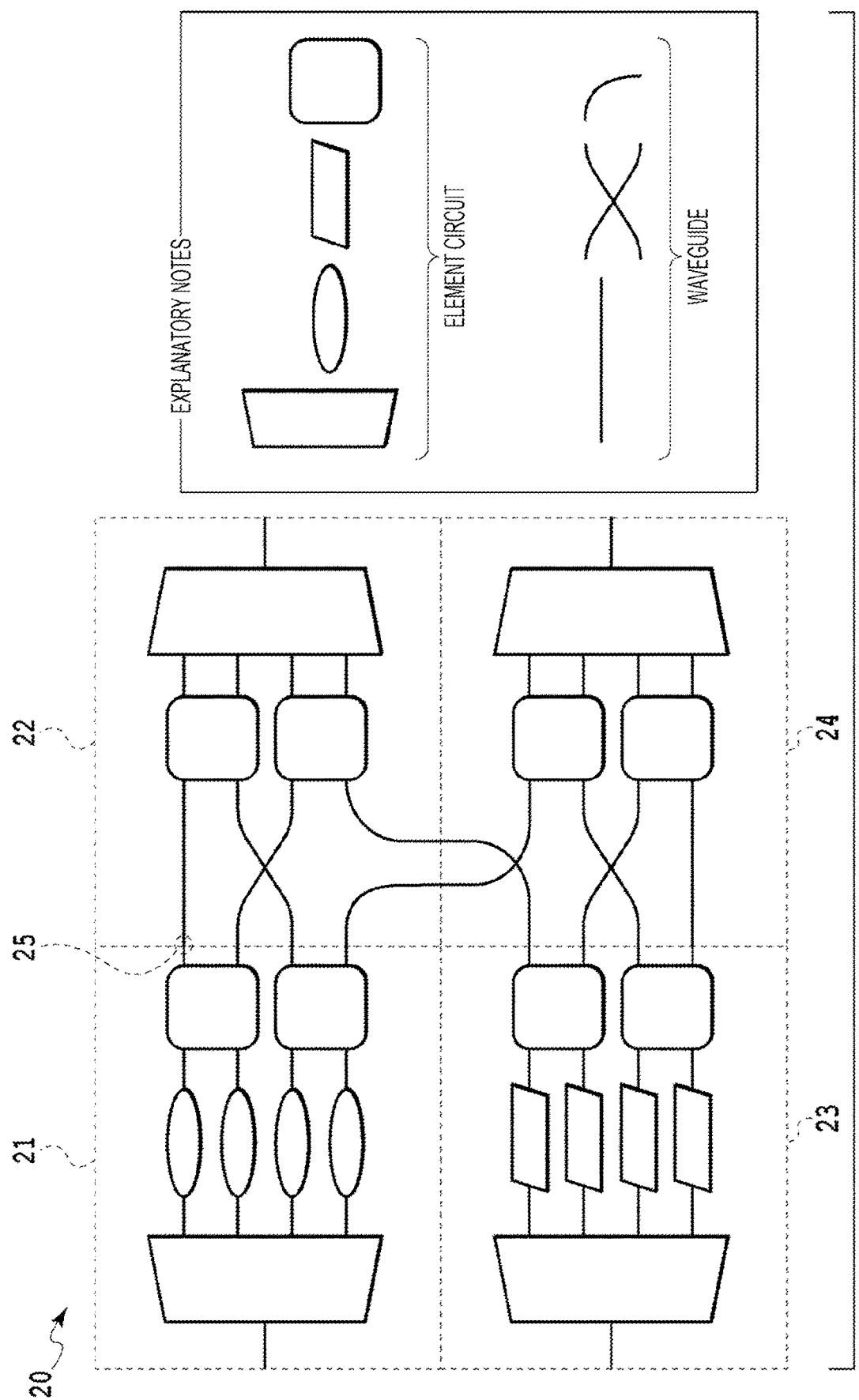
FIG. 2A is a diagram illustrating an example of manufacturing a large-scale optical circuit using a plurality of photomasks.
Figure 2B:
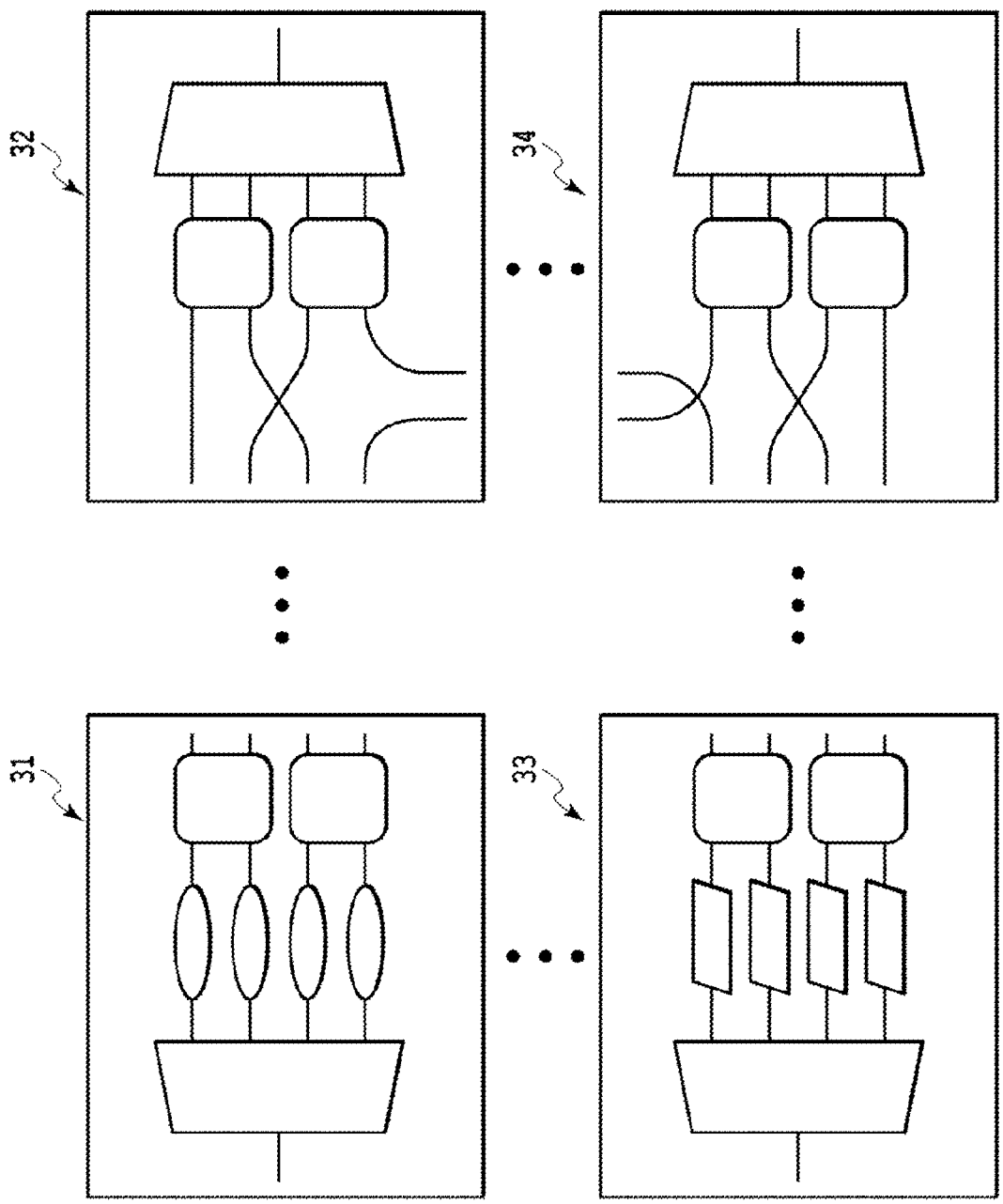
FIG. 2B is a diagram illustrating an example of manufacturing the large-scale optical circuit using the plurality of photomasks.
Figure 3B:
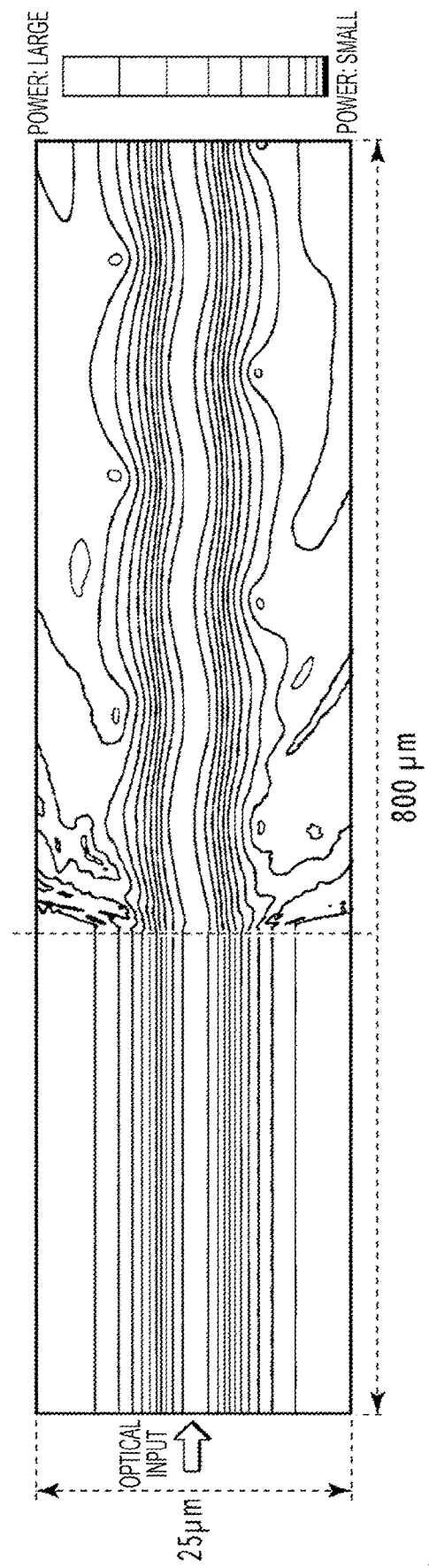
FIG. 3B is a diagram illustrating a state of propagation of light in the waveguide pattern at the joint portion illustrated in FIG. 3A.
Figure 4:
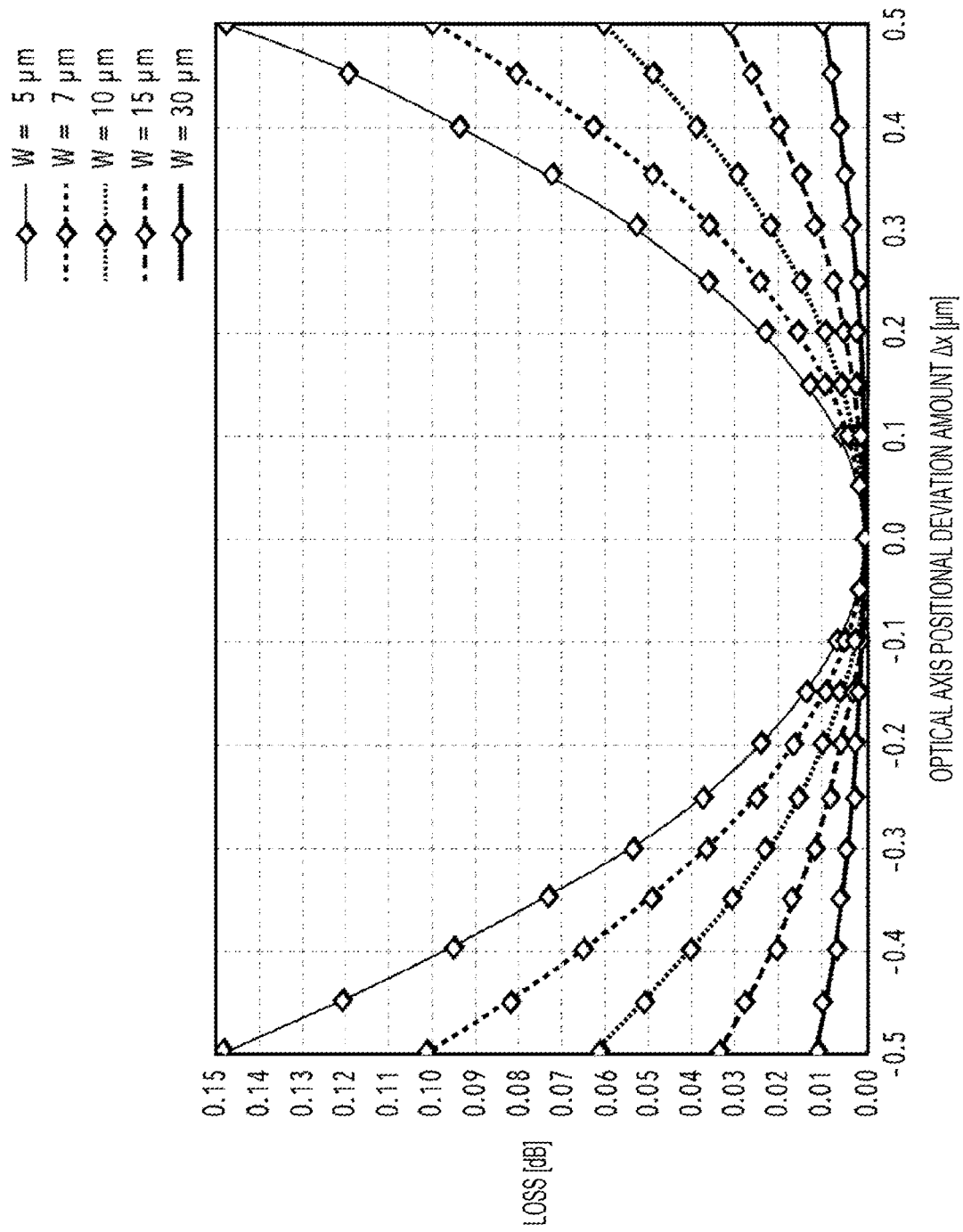
FIG. 4 is a diagram illustrating a loss value with respect to an optical axis positional deviation amount $\Delta x$ when a waveguide width W is changed in the waveguide pattern at the joint portion.
Figure 5B:
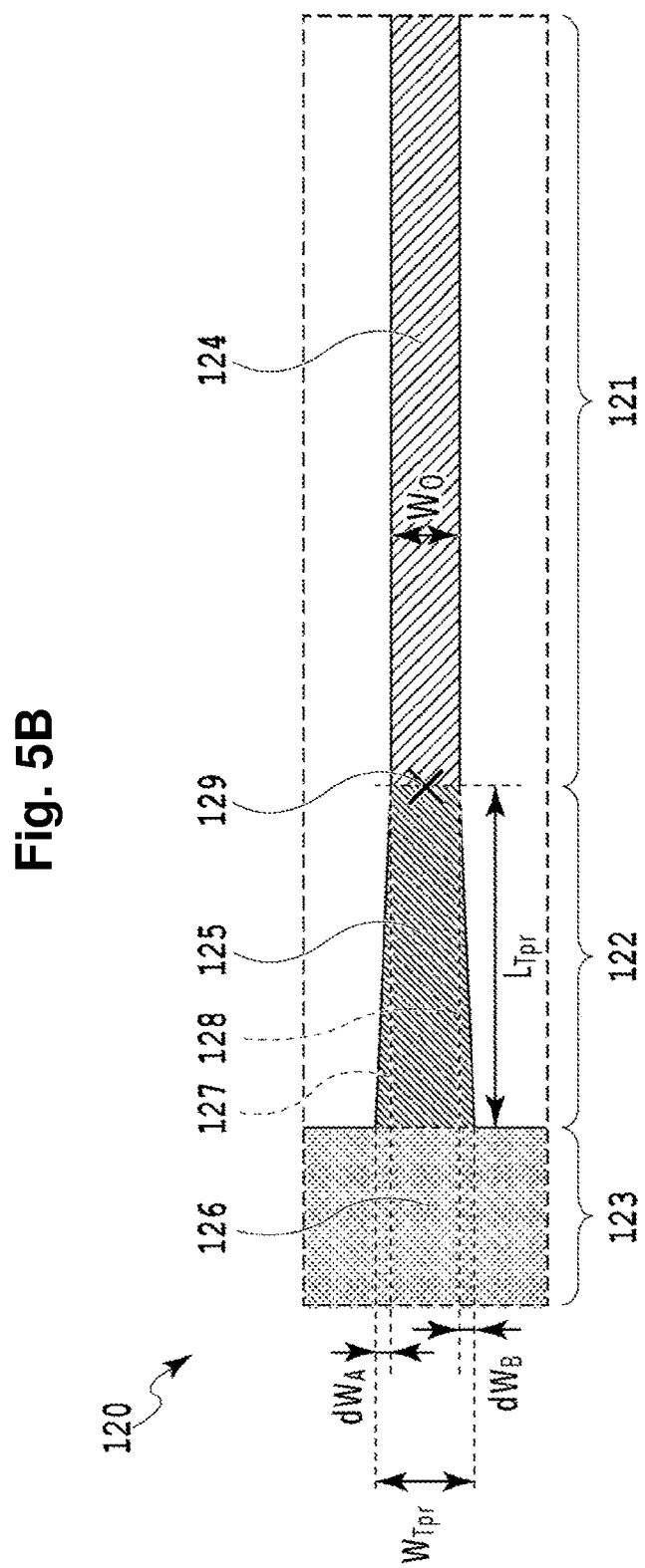
FIG. 5B is a diagram illustrating a photomask pattern in the joint portion of the waveguide of a partial circuit pattern divided into each photomask according to the first embodiment of the present invention.

Each of FIGS. 5A and 5B is a diagram illustrating a photomask pattern in a joint portion of a waveguide of a partial circuit pattern divided into each photomask according to a first embodiment of the present invention. It is an enlarged view of a connection portion of a waveguide in a photomask in which a waveguide pattern of an optical circuit is divided into a plurality of regions and drawn. The photomask pattern is, for example, a photomask pattern for forming a connection portion 25 in a large-scale circuit 20 illustrated in FIG. 2A, and is a waveguide pattern for connecting waveguides divided and drawn to each other.

A photomask 110 corresponds to a photomask 31, and a photomask 120 corresponds to a photomask 32. Here, it is assumed that the connection portion 25 is a straight waveguide having a waveguide width Wo. The pattern of each of the photomasks 110 and 120 has a pattern shape for which a positive photoresist is assumed to be used in an exposure step. A hatched portion is a light shielding pattern, and the other portion is a transmissive pattern. Hereinafter, a drawing pattern in the photomask 110 illustrated in FIG. 5A will be described in detail; however, a drawing pattern in the photomask 120 illustrated in FIG. 5B also has a similar shape and characteristics as those of the photomask 110 and is different only in directions.

In the photomask 110, a waveguide pattern 114 as a partial circuit pattern 21 is drawn in a normal drawing region 111. In a joint extension region 112, a taper pattern 115 is drawn following the waveguide pattern 114, and a solid pattern 116 of an outer peripheral portion 113 is subsequently drawn. The waveguide width of the waveguide pattern 114 is $W_0$. The taper pattern 115 has a shape whose width gradually widens from Wo at a portion connected to the waveguide pattern 114 to a taper width $W_{Tpr}$ at a portion connected to the solid pattern 116 ($W_{Tpr}>W_0$). The portion where the waveguide pattern 114 and the taper pattern 115 are connected to each other is an alignment position 119 described later. Further, a boundary position of the taper pattern 115 at the portion connected to the solid pattern 116 is located outside an upper boundary extension line 117 and a lower boundary extension line 118 obtained by extending upper and lower pattern boundary lines of the waveguide pattern 114 as they are to the outer peripheral portion 113 ($dW_A>0$, $dW_B>0$).

In a conventional photomask pattern, there is no joint extension region 112, and the waveguide pattern 114 drawn in the normal drawing region 111 is directly connected to the solid pattern 116 of the outer peripheral portion 113. As described above, the first embodiment is largely different from the conventional photomask pattern in that the joint extension region 112 is provided and the taper pattern 115 is drawn. Further, the taper pattern 115 is different from a pattern obtained by simply extending the waveguide pattern 114 in that the width gradually increases from $W_0$ to $W_{Tpr}$ as the pattern goes from the normal drawing region 111 side toward the outer peripheral portion 113 side.

As will be described later with reference to FIGS. 6 to 7, the photomasks 110 and 120 are used in an overlapping manner such that the alignment position 119 and an alignment position 129 are at the same position in the exposure step, and the waveguides drawn on both sides are connected to each other. Thus, the taper pattern 115 overlaps a waveguide pattern 124 of the photomask 120 in a form of covering the waveguide pattern 124. Since the waveguide width of the waveguide pattern 124 is $W_0$, the upper boundary extension line 117 and the lower boundary extension line 118 overlap the upper and lower pattern boundary lines of the waveguide pattern 124. Thus, the boundary position of the taper pattern 115 is the same as a boundary position of the waveguide pattern 124 at the portion connected to the waveguide pattern 114. As the taper pattern 115 goes toward the outer peripheral portion 113, the taper pattern 115 is gradually wider than the upper and lower pattern boundary lines of the waveguide pattern 124, and a difference from the upper and lower pattern boundary lines also increases. The taper pattern 115 of the joint extension region 112 has such a characteristic.

In FIG. 5A, the waveguide pattern 114, the taper pattern 115, and the solid pattern 116 are drawn such that the patterns are continuously joined to each other. However, even if there is a gap or a dip that is not resolved in the exposure step, the patterns reflected in the photoresist are continuously joined to each other, and thus are considered to be the same pattern. In addition, even if there is a gap or a depression that is resolved in the exposure step, as described above, since the loss in a case where the gap occurs is smaller than the loss due to the optical axis positional deviation, reduction of the loss due to the optical axis positional deviation, which is a main effect, can be obtained. Of course, it is desirable that there is no unnecessary gap or dip.

Figure 1A:
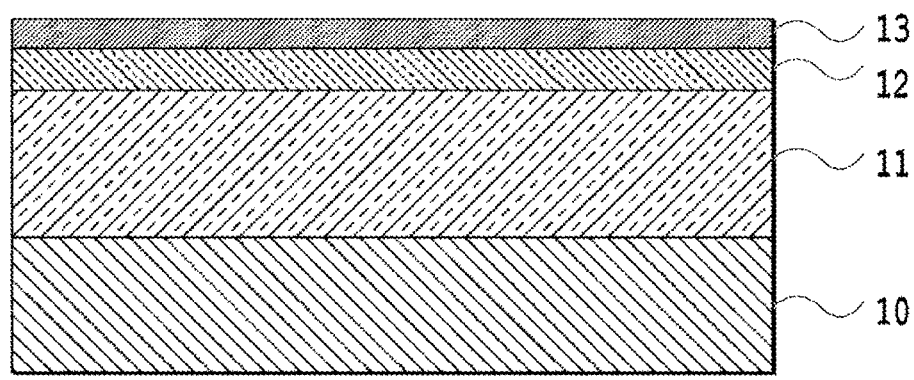
FIG. 1A is a cross-sectional view illustrating a step of manufacturing an optical circuit using a conventional silica-based waveguide.
Figure 1B:
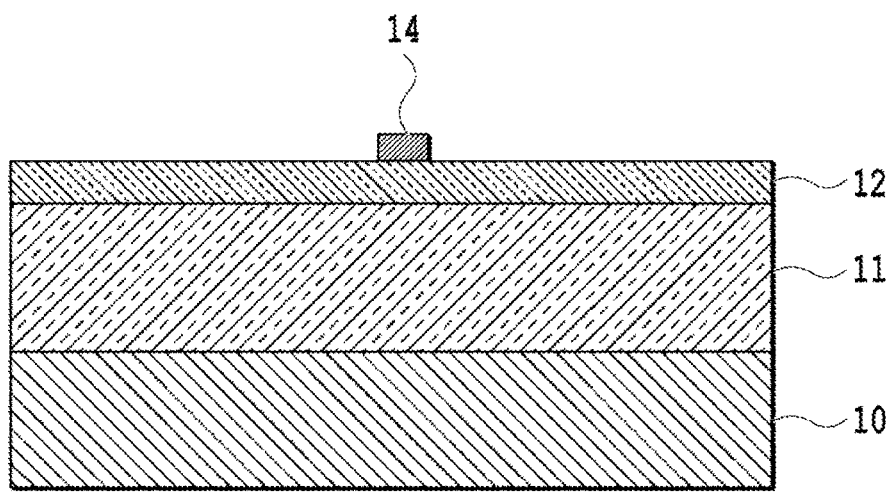
FIG. 1B is a cross-sectional view illustrating a step of manufacturing the optical circuit using the conventional silica-based waveguide.
Figure 1C:
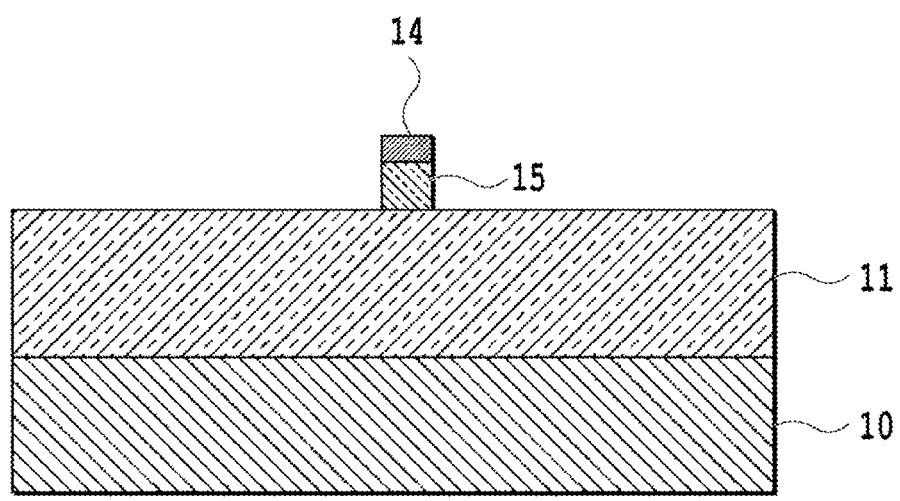
FIG. 1C is a cross-sectional view illustrating a step of manufacturing the optical circuit using the conventional silica-based waveguide.
Figure 1D:
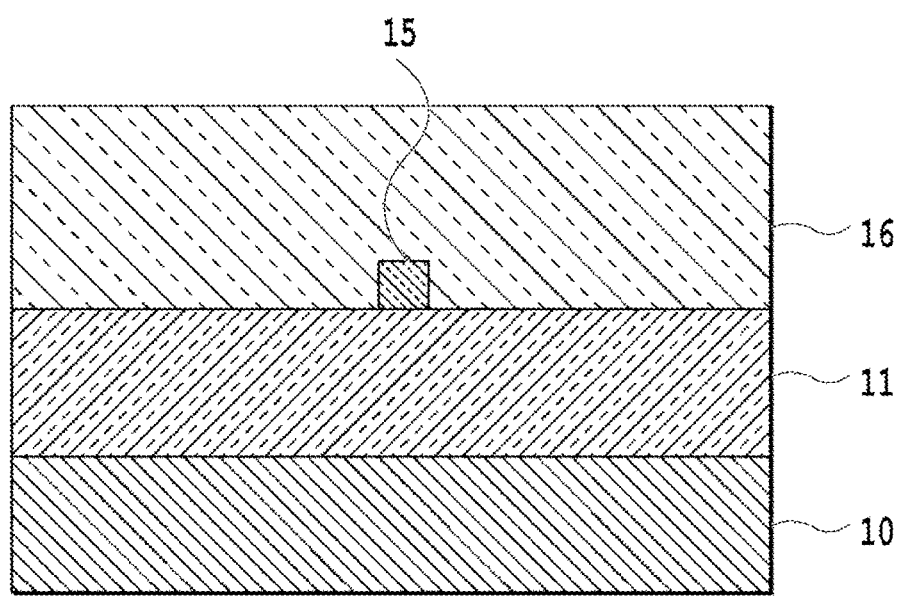
FIG. 1D is a cross-sectional view illustrating a step of manufacturing the optical circuit using the conventional silica-based waveguide.

FIG. 6A is a diagram illustrating a state of an exposure pattern in a case where there is no relative positional deviation of each photomask at the time of exposure. It is an enlarged view of a connection portion when the optical circuit is viewed from above in the manufacturing step illustrated in FIG. 1A. A state is illustrated in which a pattern is exposed to a photoresist 13 in accordance with the drawing pattern of the photomask. Each pattern is exposed such that the alignment position 119 of the photomask 110 and the alignment position 129 of the photomask 120 are both at an exposure position 134 on the photoresist 13, and the photomasks 110 and 120 are used at relative positions as designed. Exposed portions 131 and 132 are portions exposed only with the photomasks 110 and 120, respectively, and an exposed portion 133 is a portion exposed with both the photomasks 110 and 120. An overlapping region 135 including the exposed portion 133 is a region where exposure is performed with the two photomasks 110 and 120 in an overlapping manner due to presence of the joint extension regions 112 and 122, and the waveguide pattern is formed. In the overlapping region 135, the waveguide width changes such that overlapping of the joint regions decreases.

In the first embodiment, since the positive photoresist is used as the photoresist, the photoresist of the exposed portions 131 to 133 is dissolved and removed in the development step. Thus, in an etching step for the core layer 12, the core layer 12 on the exposed portions 131 to 133 is etched, and this portion finally becomes clad 16 (143). On the other hand, a portion not exposed with any photomask, that is, the core layer 12 on other than the exposed portions 131 to 133 remains as a core 15 (141, 142).

FIG. 6B is a top view illustrating a waveguide pattern at a joint portion manufactured with the exposure pattern illustrated in FIG. 6A. Since there is no relative positional deviation in the exposure pattern illustrated in FIG. 6A, a boundary of the exposed portions 131 to 133 is a straight line as designed. That is, the pattern reflects the waveguide pattern 114 of the photomask 110 and the waveguide pattern 124 of the photomask 120 as they are. Thus, the waveguide core 141 becomes a waveguide having the waveguide width $W_0$ reflecting the waveguide pattern 114 of the photomask 110, and the waveguide core 142 becomes a waveguide having the waveguide width $W_0$ reflecting the waveguide pattern 124 of the photomask 120. The waveguide manufactured with the photomasks 110 and 120 has the waveguide width $W_0$, and is one straight waveguide as designed.

FIG. 7A is a diagram illustrating a state of an exposure pattern in a case where there is a relative positional deviation of each photomask at the time of exposure. Each pattern is exposed such that the alignment position 119 of the photomask 110 is at an exposure position 154, and the alignment position 129 of the photomask 120 is at an exposure position 155 on a wafer. The exposure positions 154 and 155 have a relative positional deviation of $\Delta x$ in the x direction perpendicular to the waveguide direction. That is, photomasks 110 and 120 are used at relative positions where the optical axis positional deviation of $\Delta x$ occurs. Similarly to FIG. 6A, exposed portions 151 and 152 are portions exposed only with the photomasks 110 and 120, respectively, and an exposed portion 153 is a portion exposed with both the photomasks 110 and 120. Overlapping regions 158 and 159 including the exposed portion 153 are regions where the two photomasks 110 and 120 overlap and the pattern is formed due to the presence of the joint extension regions 112 and 122. Since the positive photoresist is used, a portion including these exposed portions 151 to 153 finally becomes the clad 16 (163), and a portion not exposed with any photomask, that is, a portion other than the exposed portions 151 to 153 becomes the core 15 (161, 162).

When the photomask pattern according to the first embodiment is used, a characteristic feature of the exposure pattern is that tapered portions 156 and 157 surrounded by triangular frames in the figure are formed. An exposed portion in a range of the overlapping region 159 in the exposed portion 151 is formed by reflecting the taper pattern 115 of the joint extension region 112 of the photomask 110. Similarly, an exposed portion in a range of the overlapping region 158 in the exposed portion 152 is formed by reflecting a taper pattern 125 of the joint extension region 122 of the photomask 120. That is, the tapered portions 156 and 157 are formed by the joint extension regions 112 and 122, respectively. In the conventional photomask pattern, since there are no joint extension regions 112 and 122, there are no overlapping regions 158 and 159. For this reason, the tapered portions 156 and 157 are not formed, and a step of $\Delta x$ is generated in the exposure pattern at a boundary portion between the overlapping region 158 and the overlapping region 159.

FIG. 7B is a top view illustrating a waveguide pattern at a joint portion manufactured with the exposure pattern illustrated in FIG. 7A. The waveguide core 161 of a pattern region 164 is a waveguide having the waveguide width $W_0$ reflecting the waveguide pattern 114 of the photomask 110. In the waveguide core 161 of a pattern region 165, the waveguide width changes from $W_0$ to $W_P$ ($=W_0-\Delta x$) reflecting the tapered portion 157, and a position of the waveguide center in the x direction is shifted by $\Delta x/2$. The waveguide core 162 of a pattern region 166 reflects the tapered portion 156, the waveguide width changes from $W_P$ to $W_0$, and the position of the waveguide center in the x direction is further shifted by $\Delta x/2$. The waveguide core 162 of a pattern region 167 is a waveguide having the waveguide width $W_0$ reflecting the waveguide pattern 124 of the photomask 120. As described above, the positions in the x direction of the waveguide centers of the waveguide cores 161 and 162 are gradually shifted without being rapidly changed due to the pattern regions 165 and 166 reflecting the tapered portions 156 and 157, and the relative positional deviation $\Delta x$ in the x direction of each photomask at the time of exposure is absorbed. In addition, in the pattern regions 165 and 166 reflecting the tapered portions 156 and 157, the waveguide width changes, but this also changes slowly instead of changing rapidly.

FIG. 7C is a diagram illustrating a state of propagation of light in the waveguide pattern at the joint portion illustrated in FIG. 7B. Assuming a case where the relative positional deviation $\Delta x$ of 0.5 μm occurs in the x direction, calculation has been performed by a beam propagation method. Design values of the photomasks 110 and 120 are set to the waveguide width $W_0$=5 the taper length $L_{Tpr}$=200 μm, the taper width $W_{Tpr}$=6 μm, and $dW_A=dW_B=(W_{Tpr}-W_0)/2$. Note that the scale, the waveguide width, and the amount of the relative positional deviation $\Delta x$ in FIG. 7B are also illustrated in accordance with this assumption. In addition, since a binary image is illustrated, a state in which the power increases at a position closer to the waveguide center and decreases as the distance from the center increases is illustrated by simulating contour lines. To represent a region with small power in detail, contour lines are spaced at unequal intervals with respect to the power. As can be seen from FIG. 7C, a center position in the x direction of propagated light is gradually shifted in the pattern regions 165 and 166, and it can be seen that the light propagates obediently with almost no meandering even after the pattern region 167.

This indicates that the guided light propagated in the fundamental mode is also propagated in the pattern regions 165, 166, and 167 as the fundamental mode, and there has been almost no conversion into a higher order mode or a radiation mode. That is, since the position of the waveguide center in the x direction and the waveguide width change slowly in the pattern regions 165 and 166, the field distribution of the propagation mode of light changes adiabatically, and conversion from the fundamental mode to another mode is suppressed. A loss value calculated in this propagation light calculation is about 0.0001 dB. When compared with a loss value of 0.15 dB in a conventional waveguide pattern at the joint portion, it can be seen that the loss value with respect to the relative positional deviation $\Delta x$ is greatly reduced.

As described above, by using the photomask pattern including the joint extension regions 112 and 122, even if the relative positional deviation of each photomask occurs in the x direction perpendicular to the waveguide direction at the time of exposure, the loss value at the joint portion can be reduced. However, since the normal drawing regions 111 and 121 that can be drawn on the photomasks 110 and 120 are narrowed by the areas of the joint extension regions 112 and 122, it is desirable that the areas of the joint extension regions 112 and 122 are as small as possible.

Independent design parameters of the taper patterns 115 and 125 of the joint extension regions 112 and 122 are the taper length $L_{Tpr}$ and the taper width $W_{Tpr}$. The waveguide width $W_0$ is given, and $dW_A = dW_B = (W_{Tpr} - W_0)/2$. As described above, in a case where there is the relative positional deviation $\Delta x$ in the x direction between the photomasks at the time of exposure, it is important to form the tapered portions 156 and 157 for suppressing the loss. Thus, when the maximum value of the assumed relative positional deviation $\Delta x$ is $\Delta x_{Max}$, it is necessary that $dW_A = dW_B \geq \Delta x_{Max}$. Thus, it is sufficient that the taper width $W_{Tpr}$ satisfies $W_{Tpr} \geq W_0 + 2\Delta x_{Max}$. For example, in the case of $\Delta x_{Max} = 0.5$ μm and $W_0 = 5$ μm, since $W_{Tpr} > 6$ μm is a requirement, it is sufficient that $W_{Tpr} = 6$ μm is set from a viewpoint of making the areas of the joint extension regions 112 and 122 as small as possible.

In addition, even in a case where there is the relative positional deviation $\Delta x$ in the x direction between the photomasks at the time of exposure, it is important for the positions in the x direction of the waveguide centers of the waveguide cores 161 and 162 to be gradually shifted without being changed rapidly, for suppressing the loss. Thus, it is also necessary that a ratio $(W_{Tpr} - W_0)/L_{Tpr}$ of a change amount $(W_{Tpr} - W_0)$ of the pattern width to the taper length $L_{Tpr}$ of the taper patterns 115 and 125, that is, a width change rate is sufficiently small.

Figure 8A:
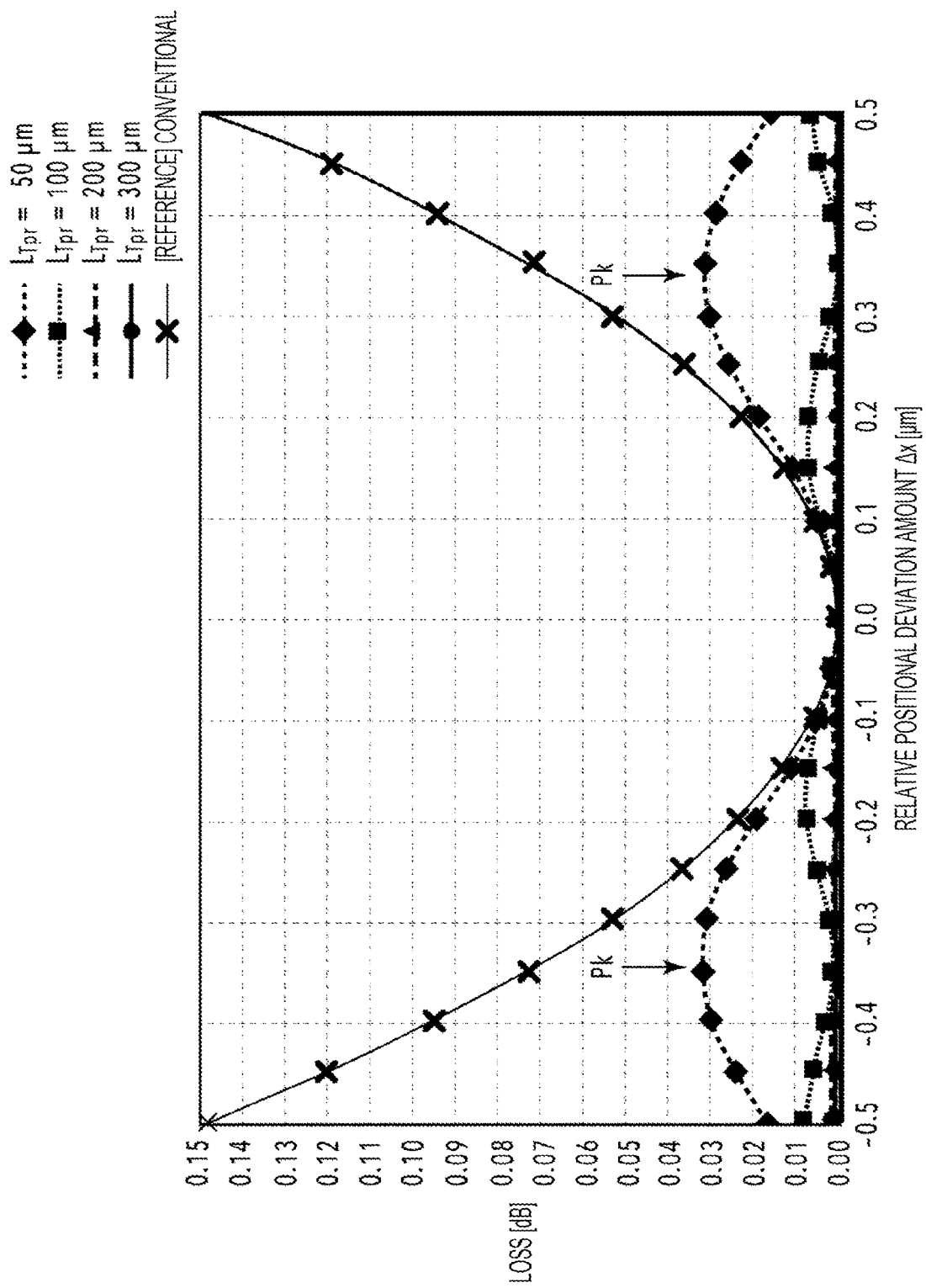
FIG. 8A is a diagram illustrating relative positional deviation amount $\Delta x$ dependency of the loss value in the waveguide pattern of the first embodiment.
Figure 8B:
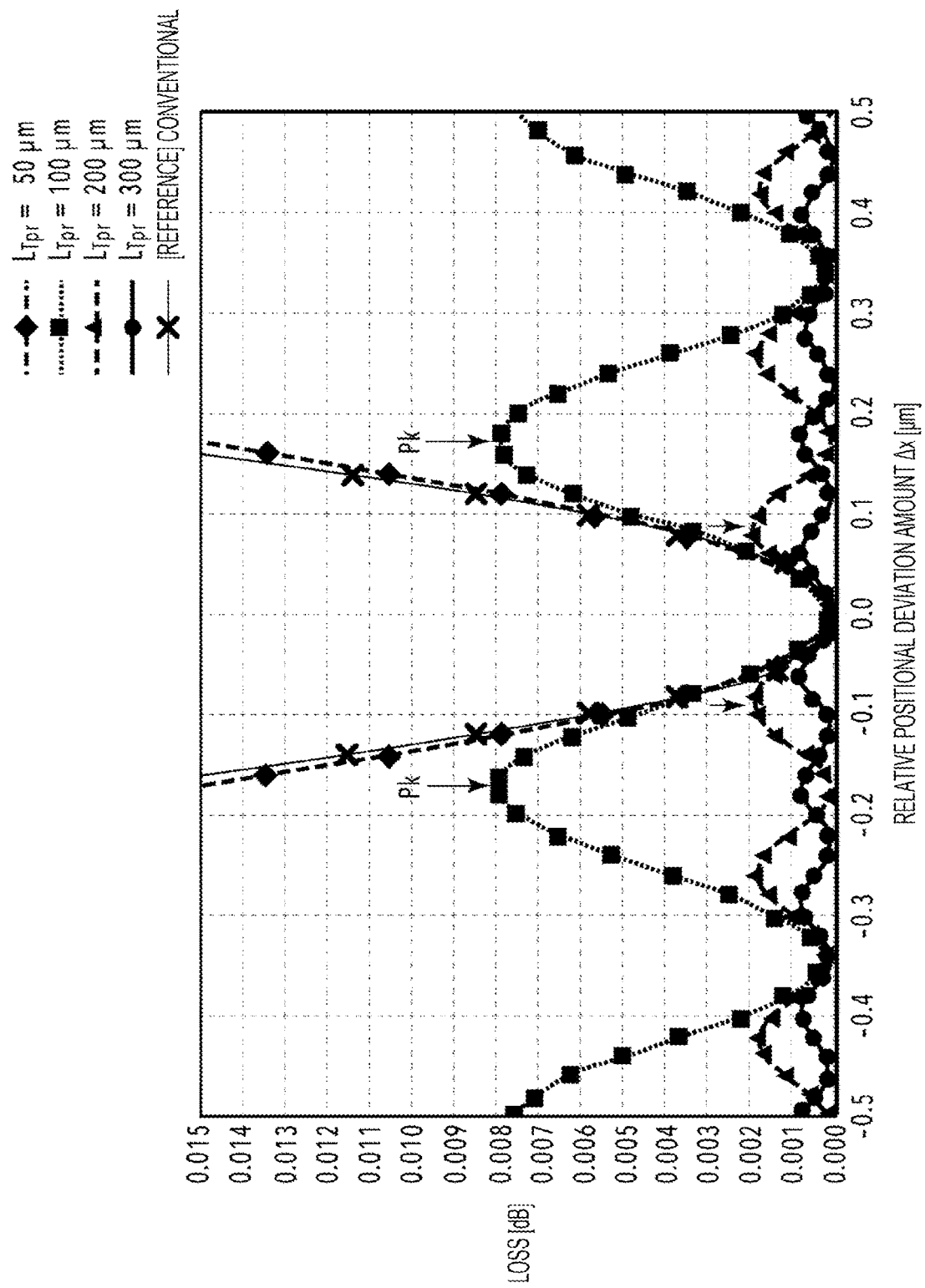
FIG. 8B is a diagram in which the scale of the vertical axis in FIG. 8A is multiplied by 10.

FIG. 8A is a diagram illustrating relative positional deviation amount $\Delta x$ dependency of the loss value in the waveguide pattern of the first embodiment. FIG. 8B is a diagram in which the scale of the vertical axis in FIG. 8A is multiplied by 10. In the photomasks 110 and 120, the waveguide width $W_0 = 5$ μm, $W_{Tpr} = 6$ μm, and taper length $L_{Tpr} = 50, 100, 200, 300$ μm are set. In each of the taper lengths $L_{Tpr}$, a loss value with respect to the relative positional deviation amount $\Delta x$ in the x direction is calculated by the beam propagation method. In addition, a loss value in the conventional waveguide pattern at the joint portion is also indicated by x plot. It can be seen that the loss value in the waveguide pattern of the present embodiment is smaller than the loss value in the conventional waveguide pattern at the joint portion for any taper length $L_{Tpr}$ and relative positional deviation amount $\Delta x$. In addition, in the waveguide pattern of the present embodiment, it can be seen that the loss changes in an oscillatory manner with respect to the relative positional deviation amount $\Delta x$, and has the largest loss value (first peak loss value) at the first peak (first peak) Pk in a range where $\Delta x$ is small. That is, the first peak loss value becomes the worst case loss value in a range of $\Delta x$ that is likely to occur as the relative positional deviation between the photomasks, at least in a range of −0.5 to +0.5 μm.

Figure 8C:
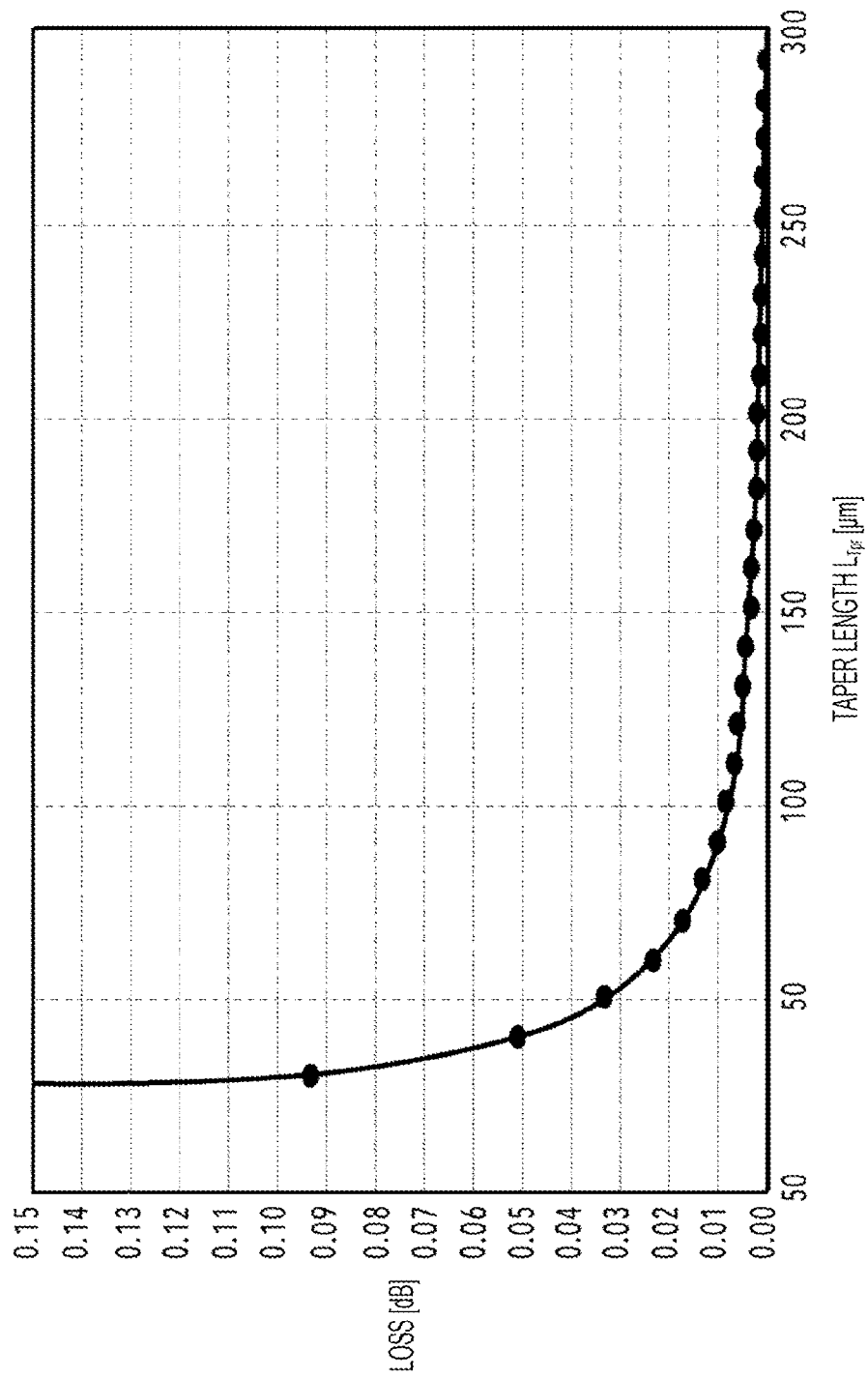
FIG. 8C is a diagram illustrating taper length LTpr dependency of a first peak loss value in the waveguide pattern of the first embodiment.
Figure 8D:
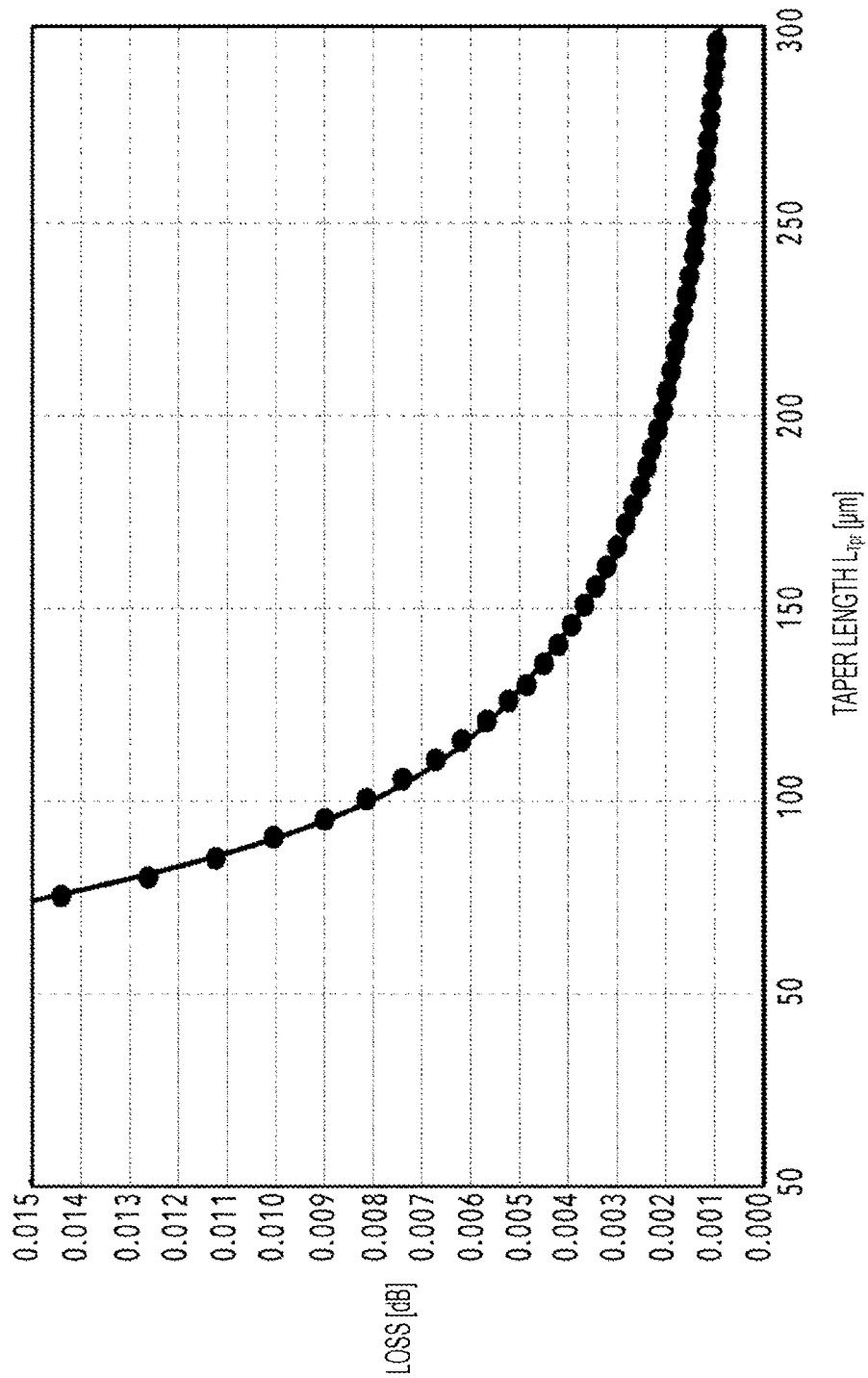
FIG. 8D is a diagram in which the scale of the vertical axis in FIG. 8C is multiplied by 10.

FIG. 8C is a diagram illustrating taper length $L_{Tpr}$ dependency of the first peak loss value in the waveguide pattern of the first embodiment. FIG. 8D is a diagram in which the scale of the vertical axis in FIG. 8C is multiplied by 10. In the waveguide pattern of the present embodiment, it can be seen that the first peak loss value decreases as the taper length $L_{Tpr}$ increases, that is, as the width change rate decreases. Thus, it is sufficient that the taper length $L_{Tpr}$ is determined depending on an allowable loss value. For example, even if the relative positional deviation $\Delta x$ between the photomasks occurs in any case of −0.5 to +0.5 μm, if it is desired to suppress the loss at the joint to less than or equal to 0.002 dB, the taper length $L_{Tpr} \geq$ about 200 μm is a requirement. From the viewpoint of making the areas of the joint extension regions 112 and 122 as small as possible, it is sufficient that the taper length $L_{Tpr} =$ about 200 μm is set. When arrangement is performed with the width change rate $dW/dL = (W_{Tpr} - W_0)/L_{Tpr}$, $dW/dL \leq 0.5\%$ is a requirement in the case of $W_0 = 5$ μm and $W_{Tpr} = 6$ μm, and thus it is sufficient that $dW/dL = 0.5\%$ is set. Similarly, if it is desired to suppress the loss at the joint to less than or equal to 0.01 dB, it is sufficient that the taper length $L_{Tpr} =$ about 100 μm and $dW/dL = 1\%$ are set. Since these values vary depending on the relative refractive index difference, the core size, and the operating wavelength of the waveguide, it is sufficient that optimization is performed for each waveguide by a similar method.

Since the photomask pattern according to the first embodiment includes the joint extension regions 112 and 122, even if the relative positional deviation of each photomask occurs in the z direction parallel to the waveguide direction at the time of exposure, the loss at the joint portion can be suppressed.

In the conventional photomask pattern, there are no joint extension regions 112 and 122, and thus, when the relative positional deviation occurs in a direction in which both the photomasks are separated from each other, the solid patterns that are the outer peripheral portions are arranged to overlap each other in both the photomasks. Of course, there is no common exposed portion in both the photomasks, but a gap is generated between an exposed portion of one photomask and an exposed portion of the other photomask. Since the positive photoresist is used, this gap portion remains as a core. That is, an unnecessary waveguide core is formed across the original waveguide core perpendicularly to the original waveguide core at a portion to be the clad originally at the joint portion. Presence of the unnecessary waveguide core crossing the original waveguide core is undesirable because it causes a loss at the joint.

In the photomask pattern according to the first embodiment, even if the relative positional deviation occurs in a direction in which both the photomasks 110 and 120 are separated from each other, the joint extension regions 112 and 122 function as margin regions. Thus, the solid patterns 116 and 126 that are the outer peripheral portions 113 and 123 are not arranged to overlap each other in both the photomasks, and the exposed portions 131 to 132 are always continuous. Thus, the unnecessary waveguide core crossing the original waveguide core is not formed, and a loss caused by the unnecessary waveguide core is not generated. As described above, by having the joint extension regions 112 and 122, in the photomask pattern according to the present embodiment, even if the relative positional deviation of each photomask occurs in any direction at the time of exposure, it is possible to suppress the loss value at the joint portion to be small.

The photomask pattern according to the first embodiment can suppress not only the loss at the joint in a case where there is the relative positional deviation of each photomask at the time of exposure, but also the loss at the joint even in a case where an amount of exposure is different in each photomask at the time of exposure. Usually, the amount of exposure is the same in each photomask, but in a case where an appropriate amount of exposure is different depending on a type of a circuit drawn in each photomask, as described later, in a case where different exposure machines are used in respective photomasks, the amount of exposure may be different in each photomask.

FIG. 9A is a diagram illustrating a state of an exposure pattern in a case where the amount of exposure is different in each photomask at the time of exposure. Each pattern is exposed such that the alignment position 119 of the photomask 110 and the alignment position 129 of the photomask 120 are both at an exposure position 174 on the photoresist 13, and the photomasks 110 and 120 are used at relative positions as designed. However, it is assumed that the amount of exposure of the photomask 120 at the time of exposure is smaller than usual. Similarly to the case of FIG. 6A, exposed portions 171 and 172 are portions exposed only with the photomasks 110 and 120, respectively, and an exposed portion 173 is a portion exposed with both the photomasks 110 and 120. In the exposed portions 172 and 173, the effective pattern is reduced by δW reflecting the small amount of exposure. Thus, a boundary of the exposed portion 172 becomes $W_0'(=W_0+\delta W)$ wider than the width $W_0$ of the waveguide pattern 124 of the photomask 120. Since the positive photoresist is used, the exposed portions 171 to 173 finally becomes a region of the clad 16 (183), and a portion not exposed with any photomask, that is, a portion other than the exposed portions 171 to 173 becomes the core 15 (181, 182).

In a case where the amount of exposures is different as described above, when the photomask pattern according to the first embodiment is used, a characteristic feature of the exposure pattern is that tapered portions 175 and 176 indicated by regions surrounded by triangular frames in the drawing are formed. An exposed portion in a range of an overlapping region 178 in the exposed portion 171 is formed by reflecting the taper pattern 115 of the joint extension region 112 of the photomask 110. That is, the tapered portions 175 and 176 are formed by the joint extension regions 112. In the conventional photomask pattern, since there is no joint extension region 112, the tapered portions 175 and 176 are not formed, and a difference δW occurs in the width of the exposure pattern at a boundary portion between an overlapping region 177 and the overlapping region 178.

FIG. 9B is a top view illustrating a waveguide pattern at a joint portion manufactured with the exposure pattern illustrated in FIG. 9A. The waveguide core 181 of pattern regions 184 and 185 is a waveguide having the waveguide width $W_0$ reflecting the waveguide pattern 114 of the photomask 110. The waveguide core 182 of a pattern region 186 reflects the tapered portions 175 and 176, and the waveguide width changes from $W_0$ to $W_0'$. The waveguide core 182 of a pattern region 187 becomes a waveguide having the waveguide width $W_0'$ reflecting the width of the boundary of the exposed portion 172 described above. As described above, although the width $W_0$ of the waveguide core 181 of the pattern region 184 and the width $W_0'$ of the waveguide core 182 of the pattern region 176 are different from each other due to the pattern region 186 reflecting the tapered portions 175 and 187, the width of the waveguide slowly changes without changing rapidly. The waveguide width changes slowly as described above, whereby the magnitude of the field distribution of the propagating fundamental mode also slowly changes adiabatically, and conversion from the fundamental mode to another mode such as a higher order mode or a radiation mode hardly occurs, and a loss increase at the joint is suppressed.

The same applies to a case where the amount of exposure of the photomask 110 at the time of exposure is smaller than usual and the amount of exposure of the photomask 110 at the time of exposure is usual. An exposed portion in a range of the overlapping region 177 in the exposed portion 172 is formed by reflecting the taper pattern 125 of the joint extension region 122 of the photomask 120, and a tapered portion is formed in the overlapping region 177. Thus, in the pattern region 185, a waveguide taper is formed in which the waveguide width changes from $W_0'$ to $W_0$. In any case, since the waveguide width changes slowly without changing rapidly due to the tapered portion, the loss increase at the joint is suppressed.

Second Embodiment: Basic Form in Case of Using Negative Resist

Figure 10A:
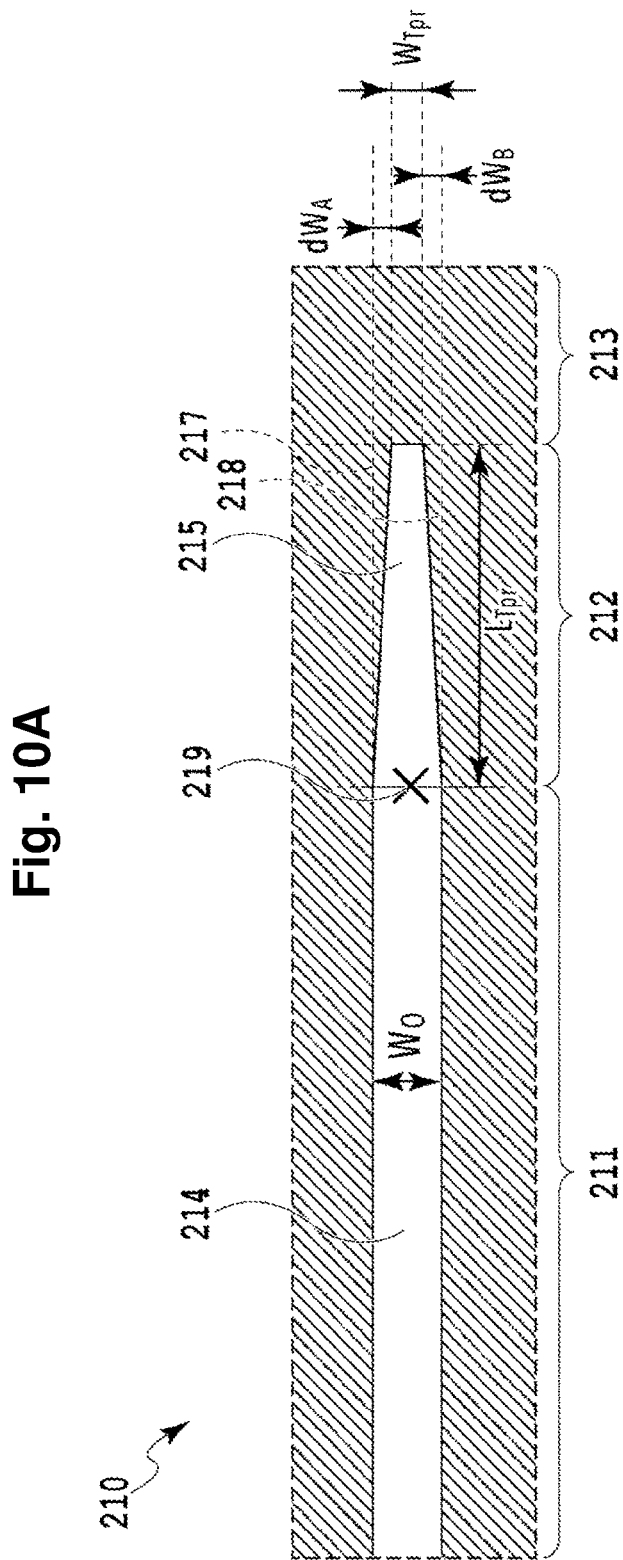
FIG. 10A is a diagram illustrating a photomask pattern in a joint portion of a waveguide of a partial circuit pattern divided into each photomask according to a second embodiment of the present invention.
Figure 10B:
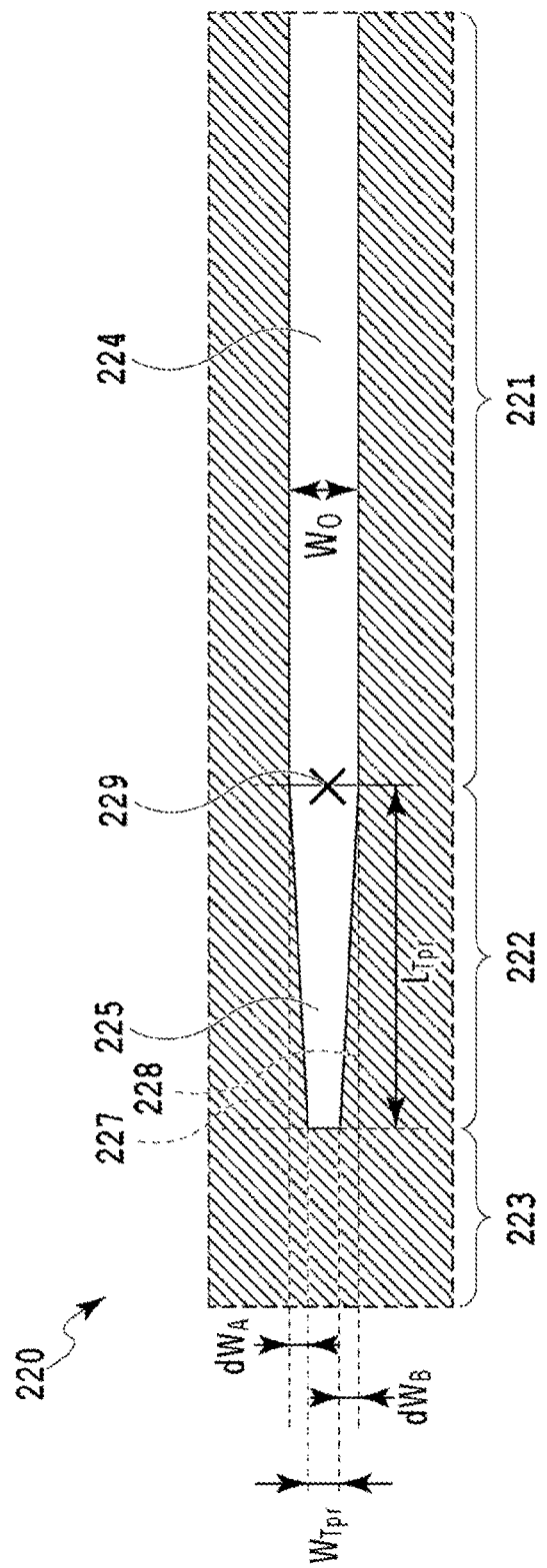
FIG. 10B is a diagram illustrating a photomask pattern in the joint portion of the waveguide of a partial circuit pattern divided into each photomask according to the second embodiment of the present invention.

Each or FIGS. 10A and 10B is a diagram illustrating a photomask pattern in a joint portion of a waveguide of a partial circuit pattern divided into each photomask according to a second embodiment of the present invention. It is an enlarged view of a connection portion of a waveguide in a photomask in which a waveguide pattern of an optical circuit is divided into a plurality of regions and drawn. The photomask pattern is the same as the photomask pattern according to the first embodiment in the basic idea of the configuration of the photomask pattern, and the method of using the photomask pattern, but is different in that the photomask pattern has a pattern shape for which a negative photoresist is assumed to be used in the exposure step. The photomasks 110 and 120 described in the first embodiment respectively correspond to photomasks 210 and 220 in the second embodiment. In the patterns of these photomasks 210 and 220, a hatched portion is a light shielding pattern, and the other portion is a transmissive pattern. In a photomask for which the negative photoresist is assumed to be used, a light shielding pattern is used as a base, and a waveguide portion is drawn to be a transmissive pattern. Hereinafter, a drawing pattern in the photomask 210 will be described in detail; however, a drawing pattern in the photomask 220 also has a similar shape and characteristics as those of the photomask 210 and is different only in directions.

In the photomask 210, a waveguide pattern 214 as the partial circuit pattern 21 is drawn in a normal drawing region 211 in a transmissive pattern. In a joint extension region 212, a taper pattern 215 is drawn in a transmissive pattern following the waveguide pattern 214. An outer peripheral portion 213 remains in the light shielding pattern of the base. The waveguide width of the waveguide pattern 214 is $W_0$. The taper pattern 215 has a shape whose width gradually narrows from $W_0$ at a portion connected to the waveguide pattern 214 to a taper width $W_{Tpr}$ at a portion in contact with the outer peripheral portion 213 ($W_{Tpr} < W_0$). The portion where the waveguide pattern 214 and the taper pattern 215 are connected to each other is an alignment position 119 described later. Further, a boundary position of the taper pattern 215 at the portion in contact with the outer peripheral portion 213 is located inside an upper boundary extension line 217 and a lower boundary extension line 218 obtained by extending upper and lower pattern boundary lines of the waveguide pattern 214 as they are to the outer peripheral portion 213 ($dW_A > 0$, $dW_B > 0$).

In the conventional photomask pattern, there is no joint extension region 212, only the waveguide pattern 214 drawn in the normal drawing region 211 is drawn, and the waveguide pattern 214 is terminated at the outer peripheral portion 213. As described above, a point that the joint extension region 212 is provided and the taper pattern 215 is drawn is largely different from the conventional photomask pattern. Further, the taper pattern 215 is different from a pattern obtained by simply extending the waveguide pattern 214 in that the width gradually decreases from $W_0$ to $W_{Tpr}$ as the pattern goes from the normal drawing region 211 side toward the outer peripheral portion 213 side.

As will be described later with reference to FIGS. 11A and 11B, the photomasks 210 and 220 are used in an overlapping manner such that positions of the alignment positions 219 and 229 are the same in the exposure step, and the waveguides drawn on both sides are connected to each other. Thus, the taper pattern 215 overlaps a waveguide pattern 224 of the photomask 220 in a form of being hidden in the waveguide pattern 224. Since the waveguide width of the waveguide pattern 224 is Wo, the upper boundary extension line 217 and the lower boundary extension line 218 overlap the upper and lower pattern boundary lines of the waveguide pattern 224. Thus, the boundary position of the taper pattern 215 is the same as a boundary position of the waveguide pattern 224 at the portion connected to the waveguide pattern 214. As the taper pattern 215 goes toward the outer peripheral portion 213, the taper pattern 215 is gradually narrower than the boundary position of the waveguide pattern 224, and a difference from the boundary position also increases. The taper pattern 215 of the joint extension region 212 has such a characteristic.

In FIG. 10A, the waveguide pattern 214 and the taper pattern 215 are drawn such that the patterns are continuously joined to each other, but even if there are lines and protrusions that are not resolved in the exposure step, the patterns reflected in the photoresist are continuously joined to each other, and thus are considered to be the same pattern. In addition, even if there is a line or a protrusion that is resolved in the exposure step and there is a gap and a depression in the waveguide after the waveguide pattern processing, as described above, since the loss in a case where the gap occurs is smaller than the loss due to the optical axis positional deviation, reduction of the loss due to the optical axis positional deviation, which is a main effect, can be obtained. Of course, it is desirable that there is no unnecessary line or protrusion in the mask pattern.

Figure 11A:
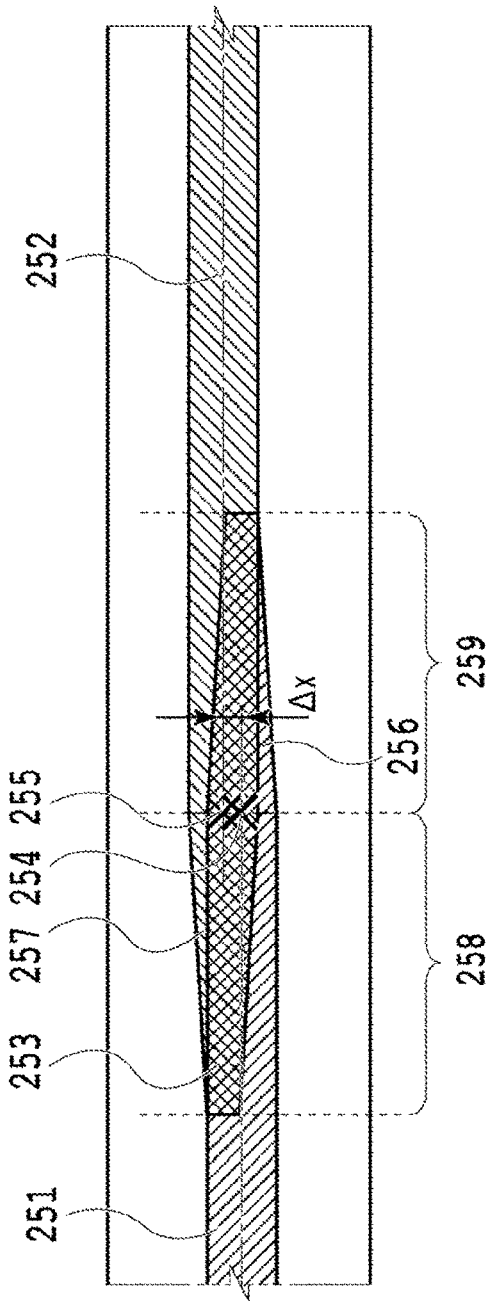
FIG. 11A is a diagram illustrating a state of an exposure pattern in a case where there is a relative positional deviation of each photomask at the time of exposure.

FIG. 11A is a diagram illustrating a state of an exposure pattern in a case where there is a relative positional deviation of each photomask at the time of exposure. It is an enlarged view of a connection portion when the optical circuit is viewed from above in the manufacturing step illustrated in FIG. 1A. A state is illustrated in which a pattern is exposed to the photoresist 13 in accordance with the drawing pattern of the photomask. Each pattern is exposed such that the alignment position 219 of the photomask 210 is at an exposure position 254, and the alignment position 229 of the photomask 220 is at an exposure position 255 on a wafer. The exposure positions 254 and 255 have a relative positional deviation of Δx in the x direction perpendicular to the waveguide direction. That is, photomasks 210 and 220 are used at relative positions where the optical axis positional deviation of Δx occurs. Exposed portions 251 and 252 are portions exposed only with the photomasks 210 and 220, respectively, and an exposed portion 253 is a portion exposed with both the photomasks 210 and 220. Overlapping regions 258 and 259 including the exposed portion 253 are regions where exposure is performed with the two photomasks 210 and 220 in an overlapping manner due to presence of the joint extension regions 212 and 222, and the waveguide pattern is formed. In the overlapping regions 258 and 259, the waveguide width changes such that overlapping of the joint regions decreases.

In the second embodiment, since the negative photoresist is used for the photoresist, a portion not exposed with any photomask, that is, the photoresist other than the exposed portions 251 to 253 are dissolved and removed in the development step. Thus, in the etching step for the core layer 12, the core layer 12 other than these exposed portions 251 to 253 is etched, and this portion finally becomes the clad 16 (263), and the core layer 12 of the exposed portions 251 to 153 remains as the core 15 (261, 262).

When the photomask pattern according to the second embodiment is used, a characteristic feature of the exposure pattern is that tapered portions 256 and 257 surrounded by triangular frames in the figure are formed. An exposed portion in a range of the overlapping region 259 in the exposed portion 251 is formed by reflecting the taper pattern 215 of the joint extension region 212 of the photomask 210. Similarly, an exposed portion in a range of the overlapping region 258 in the exposed portion 252 is formed by reflecting a taper pattern 225 of the joint extension region 222 of the photomask 220. That is, the tapered portions 256 and 257 are formed by the joint extension regions 212 and 222, respectively. In the conventional photomask pattern, since there are no joint extension regions 212 and 222, there are no overlapping regions 258 and 259. For this reason, the tapered portions 256 and 257 are not formed, and a step of Δx is generated in the exposure pattern at a boundary portion between the overlapping region 258 and the overlapping region 259.

FIG. 11B is a top view illustrating a waveguide pattern at a joint portion manufactured with the exposure pattern illustrated in FIG. 11A. The waveguide core 261 of a pattern region 264 is a waveguide having the waveguide width $W_0$ reflecting the waveguide pattern 214 of the photomask 210. In the waveguide core 261 of a pattern region 265, the waveguide width changes from $W_0$ to $W_N (=W_0+\Delta x)$ reflecting the tapered portion 257, and a position of the waveguide center in the x direction is shifted by Δx/2. The waveguide core 262 of a pattern region 266 reflects the tapered portion 256, the waveguide width changes from $W_N$ to $W_0$, and the position of the waveguide center in the x direction is further shifted by Δx/2. The waveguide core 262 of a pattern region 267 is a waveguide having the waveguide width $W_0$ reflecting the waveguide pattern 224 of the photomask 220. As described above, the positions in the x direction of the waveguide centers of the waveguide cores 261 and 262 are gradually shifted without being rapidly changed due to the pattern regions 265 and 266 reflecting the tapered portions 256 and 257, and the relative positional deviation $\Delta x$ in the x direction of each photomask at the time of exposure is absorbed. In addition, in the pattern regions 265 and 266 reflecting the tapered portions 256 and 257, the waveguide width changes, but this also changes slowly instead of changing rapidly.

Also in the waveguide pattern at the joint portion in the second embodiment, the state of propagation of light is calculated by the beam propagation method. Similarly to the waveguide pattern at the joint portion in the first embodiment, the center position in the x direction of the propagated light is gradually shifted in the pattern regions 265 and 266, and the light propagates obediently with almost no meandering even after the pattern region 267. Also in the second embodiment, since the position of the waveguide center in the x direction and the waveguide width change slowly in the pattern regions 265 and 266, the propagation mode of light changes adiabatically, and conversion from the fundamental mode to another mode is suppressed. A loss value calculated in this propagation light calculation is about 0.0015 dB. When compared with a loss value of 0.15 dB in a conventional waveguide pattern at the joint portion, it can be seen that the loss value with respect to the relative positional deviation $\Delta x$ is greatly reduced.

As described above, by using the photomask pattern including the joint extension regions 212 and 222, even if the relative positional deviation of each photomask occurs in the x direction perpendicular to the waveguide direction at the time of exposure, the loss value at the joint portion can be reduced. However, since the normal drawing regions 211 and 221 that can be drawn on the photomasks 210 and 220 are narrowed by the areas of the joint extension regions 212 and 222, it is desirable that the areas of the joint extension regions 212 and 222 are as small as possible.

Independent design parameters of the taper patterns 215 and 225 of the joint extension regions 212 and 222 are the taper length $L_{Tpr}$ and the taper width $W_{Tpr}$. The waveguide width $W_0$ is given, and $dW_A = dW_B = (W_0 - W_{Tpr})/2$. As described above, in a case where there is the relative positional deviation $\Delta x$ in the x direction between the photomasks at the time of exposure, it is important to form the tapered portions 256 and 257 for suppressing the loss. Thus, when the maximum value of the assumed relative positional deviation $\Delta x$ is $\Delta x_{Max}$, it is necessary that $dW_A = dW_B \geq \Delta x_{Max}$. Thus, it is sufficient that the taper width $W_{Tpr}$ satisfies $W_{Tpr} \leq W_0 - 2\Delta x_{Max}$. For example, in the case of $\Delta x_{Max} = 0.5$ μm and $W_0 = 5$ μm, since $W_{Tpr} \leq 4$ μm is a requirement, it is sufficient that $W_{Tpr} = 4$ μm is set from a viewpoint of making the areas of the joint extension regions 212 and 222 as small as possible.

In addition, even in a case where there is the relative positional deviation $\Delta x$ in the x direction between the photomasks at the time of exposure, it is important for the positions in the x direction of the waveguide centers of the waveguide cores 261 and 262 to be gradually shifted without being changed rapidly, for suppressing the loss. Thus, it is also necessary that a ratio $(W_0 - W_{Tpr})/L_{Tpr}$ of a change amount $(W_0 - W_{Tpr})$ of the pattern width to the taper length $L_{Tpr}$ of the taper patterns 215 and 225, that is, the width change rate is sufficiently small.

Figure 12A:
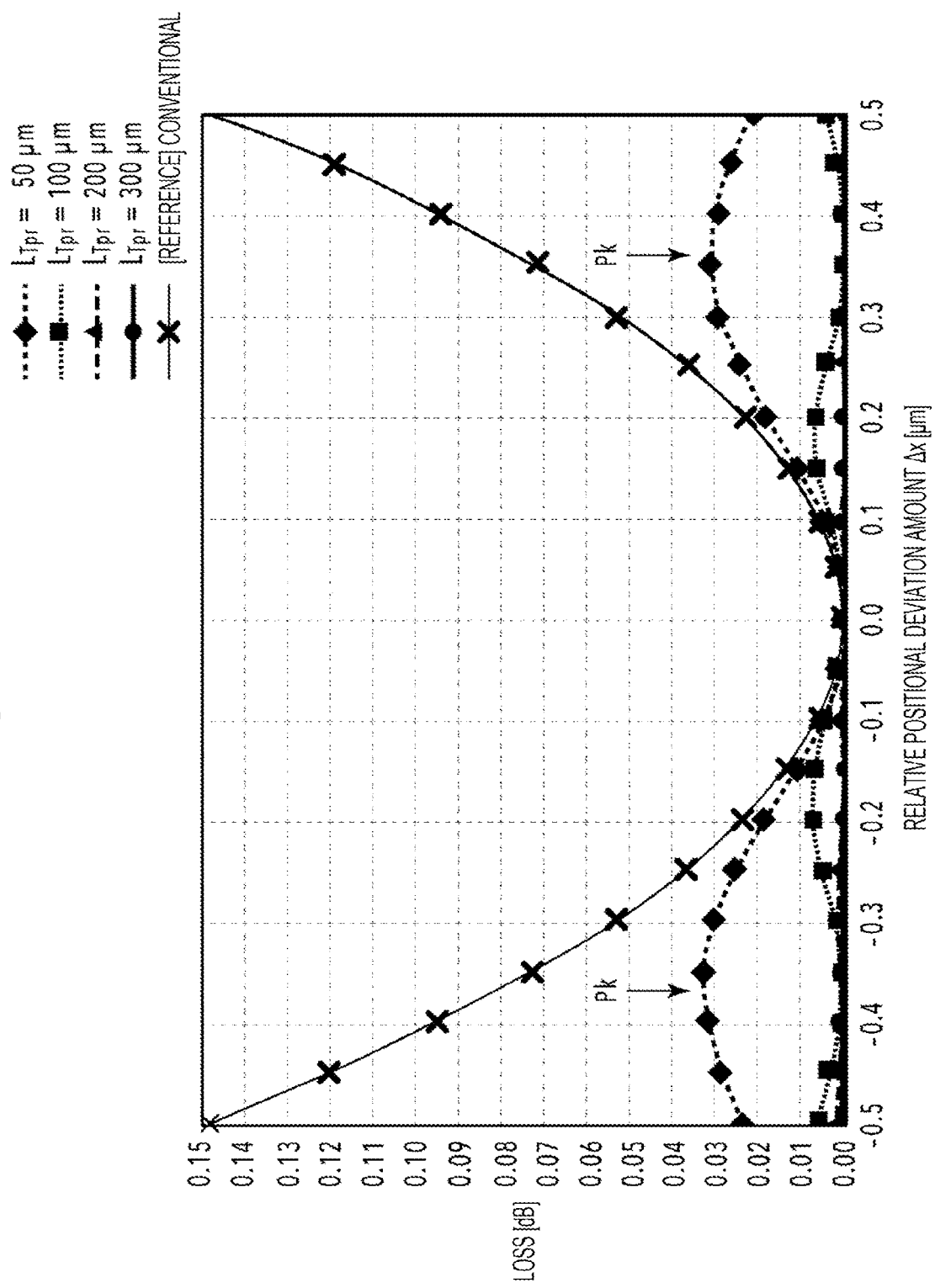
FIG. 12A is a diagram illustrating relative positional deviation amount $\Delta x$ dependency of the loss value in the waveguide pattern of the second embodiment.

FIG. 12A is a diagram illustrating relative positional deviation amount $\Delta x$ dependency of the loss value in the waveguide pattern of the second embodiment. FIG. 12B is a diagram in which the scale of the vertical axis in FIG. 12A is multiplied by 10. In the photomasks 210 and 220, the waveguide width $W_0 = 5$ μm, $W_{Tpr} = 4$ μm, $dW_A = dW_B = (W_0 - W_{Tpr})/2$, and the taper length $L_{Tpr} = 50, 100, 200, 300$ μm are set. In each of the taper lengths $L_{Tpr}$, a loss value with respect to the relative positional deviation amount $\Delta x$ in the x direction is calculated by the beam propagation method. In addition, a loss value in the conventional waveguide pattern at the joint portion is also indicated by x plot. It can be seen that FIG. 12A is a graph substantially similar to FIG. 8A. It can be seen that the loss value in the waveguide pattern of the present embodiment is smaller than the loss value in the conventional waveguide pattern at the joint portion for any taper length $L_{Tpr}$ and relative positional deviation amount $\Delta x$. In addition, in the waveguide pattern of the present embodiment, it can be seen that the loss changes in an oscillatory manner with respect to the relative positional deviation amount $\Delta x$, and has the largest loss value (first peak loss value) at the first peak (first peak) Pk in a range where $\Delta x$ is small. That is, the first peak loss value becomes the worst case loss value in a range of $\Delta x$ that is likely to occur as the relative positional deviation between the photomasks, at least in a range of $-0.5$ to $+0.5$ μm.

Figure 12C:
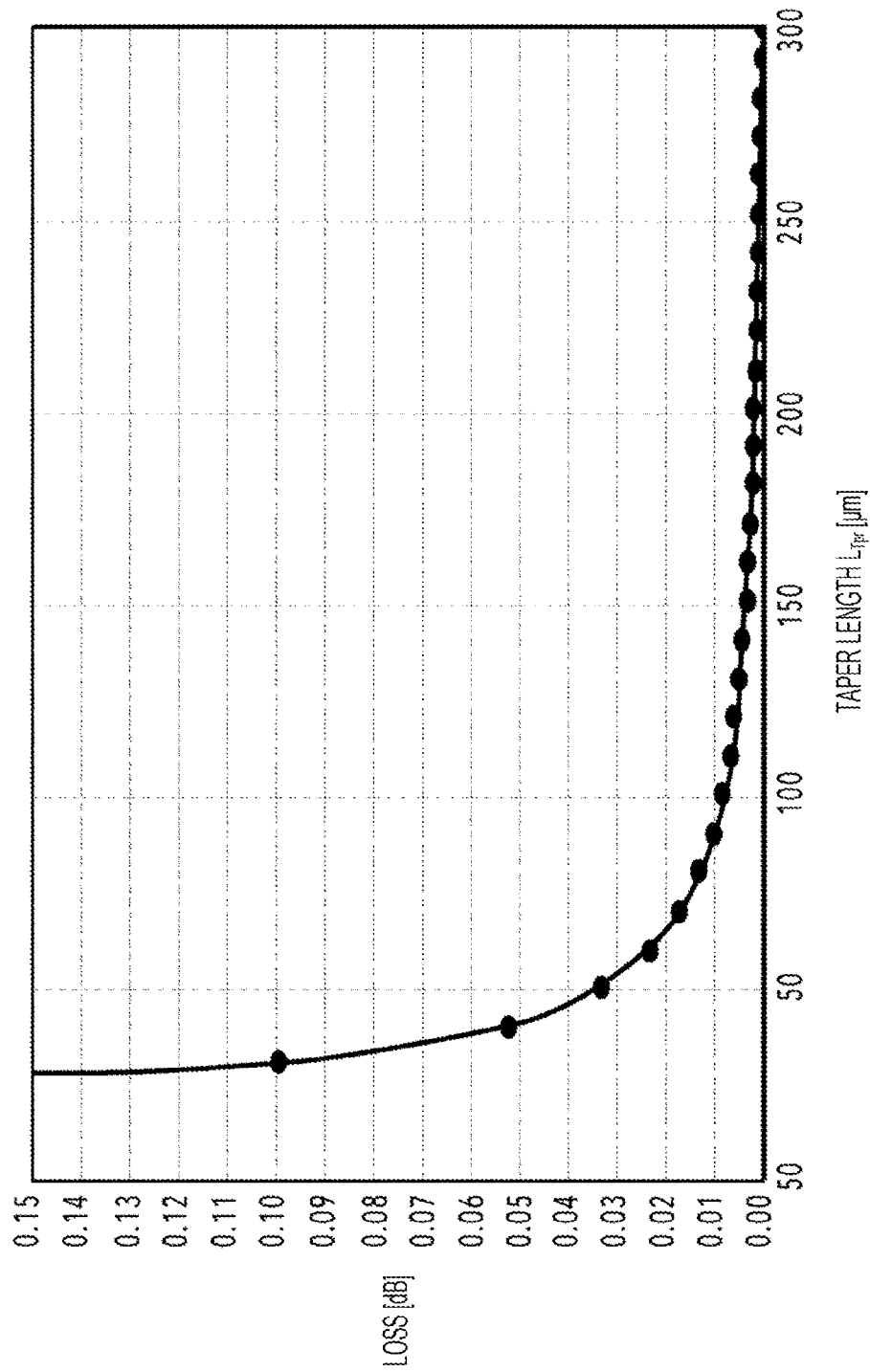
FIG. 12C is a diagram illustrating taper length $L_{Tpr}$ dependency of a first peak loss value in the waveguide pattern of the second embodiment.
Figure 12D:
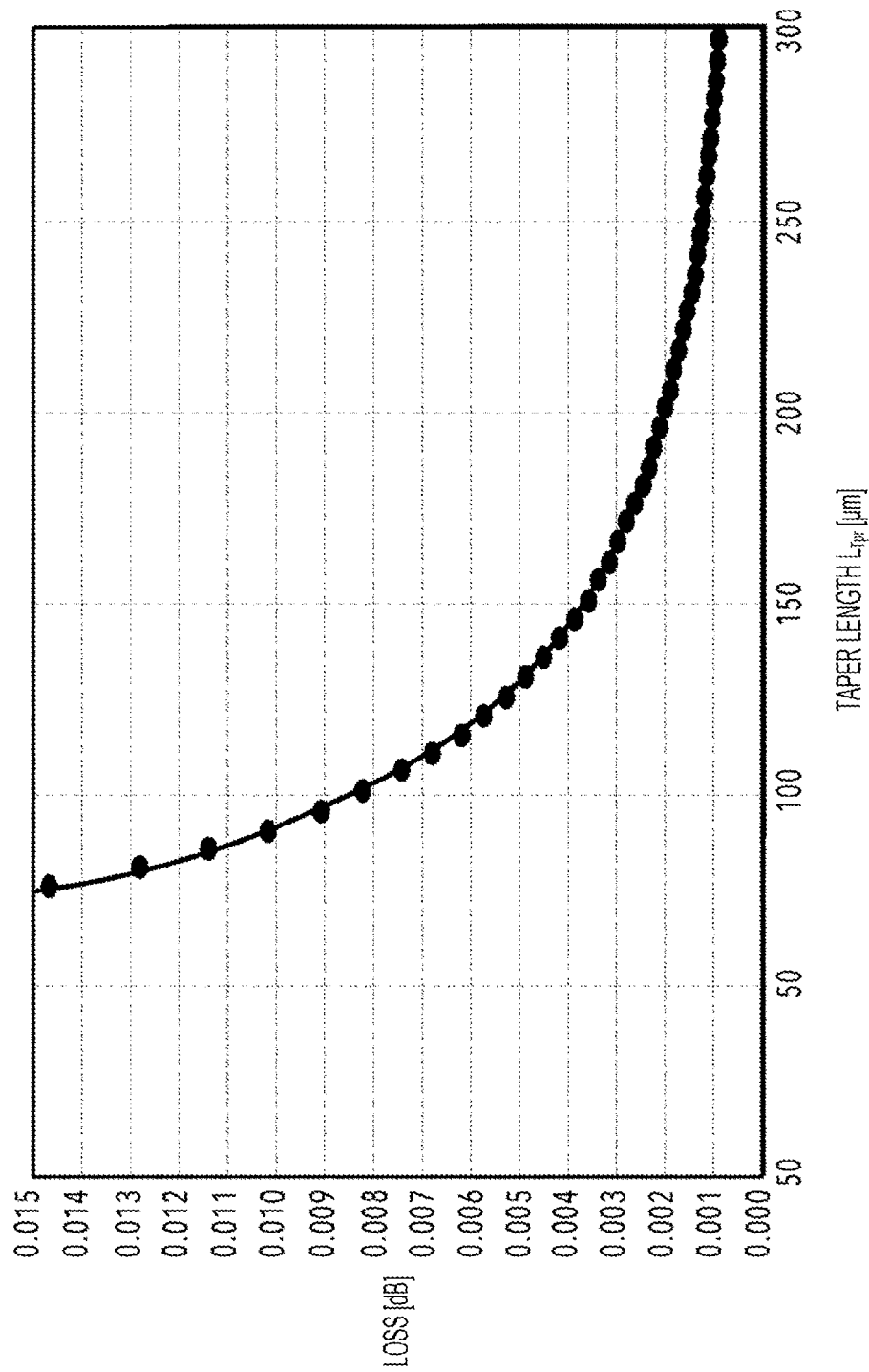
FIG. 12D is a diagram in which the scale of the vertical axis in FIG. 12C is multiplied by 10.

FIG. 12C is a diagram illustrating taper length $L_{Tpr}$ dependency of a first peak loss value in the waveguide pattern of the second embodiment. FIG. 12D is a diagram in which the scale of the vertical axis in FIG. 12C is multiplied by 10. It can be seen that FIG. 12C is also a graph substantially similar to FIG. 8C. In the waveguide pattern of the present embodiment, it can be seen that the first peak loss value decreases as the taper length $L_{Tpr}$ increases, that is, as the width change rate decreases. Thus, it is sufficient that the taper length $L_{Tpr}$ is determined depending on an allowable loss value. For example, even if the relative positional deviation $\Delta x$ between the photomasks occurs in any case of $-0.5$ to $+0.5$ μm, if it is desired to suppress the loss at the joint to less than or equal to 0.002 dB, the taper length $L_{Tpr} \geq$ about 200 μm is a requirement. From the viewpoint of making the areas of the joint extension regions 212 and 222 as small as possible, it is sufficient that the taper length $L_{Tpr} =$ about 200 μm is set. When arrangement is performed with the width change rate $dW/dL = (W_0 - W_{Tpr})/L_{Tpr}$, $dW/dL < 0.5\%$ is a requirement in the case of $W_0 = 5$ μm and $W_{Tpr} = 4$ μm, and thus it is sufficient that $dW/dL = 0.5\%$ is set. Similarly, if it is desired to suppress the loss at the joint to less than or equal to 0.01 dB, it is sufficient that the taper length $L_{Tpr} =$ about 100 μm and $dW/dL = 1\%$ are set. Since these values vary depending on the relative refractive index difference, the core size, and the operating wavelength of the waveguide, it is sufficient that optimization is performed for each waveguide by a similar method.

Also in the second embodiment, since the joint extension regions 212 and 222 are included similarly to the photomask pattern according to the first embodiment, even if the relative positional deviation of each photomask occurs in the z direction parallel to the waveguide direction at the time of exposure, the loss at the joint portion can be suppressed. Similarly to the first embodiment, since the position of the waveguide center in the x direction and the waveguide width change slowly in the pattern regions 265 and 266, the field distribution of the propagation mode of light changes adiabatically, and conversion from the fundamental mode to another mode is suppressed.

In the conventional photomask pattern, there are no joint extension regions 212 and 222, and thus, when the relative positional deviation occurs in the direction in which both the photomasks are separated from each other, the waveguide pattern is arranged to be interrupted, and of course, there is no common exposed portion in both the photomasks, but a gap is generated between an exposed portion of one photomask and an exposed portion of the other photomask. Since the negative photoresist is used, this gap portion becomes a clad and becomes a gap of the waveguide core as it is. Naturally, the gap of the waveguide core causes a loss at the joint, which is not preferable.

In the photomask pattern according to the second embodiment, even if the relative positional deviation occurs in a direction in which both the photomasks 210 and 220 are separated from each other, the joint extension regions 212 and 222 function as margin regions. Thus, the waveguide pattern is not interrupted, and the exposed portions 251 to 252 are always continuous. A gap is not formed in the waveguide core, and a loss caused by the gap is not generated. As described above, by having the joint extension regions 212 and 222, in the photomask pattern according to the present embodiment, even if the relative positional deviation of each photomask occurs in any direction at the time of exposure, it is possible to suppress the loss value at the joint portion to be small.

Also in the second embodiment, similarly to the photomask pattern according to the first embodiment, it is possible to suppress not only the loss at the joint in a case where there is the relative positional deviation of each photomask at the time of exposure, but also the loss at the joint even in a case where an amount of exposure is different in each photomask at the time of exposure.

Third Embodiment: Case Where Waveguide Obliquely Crosses Division Boundary

Figure 13A:
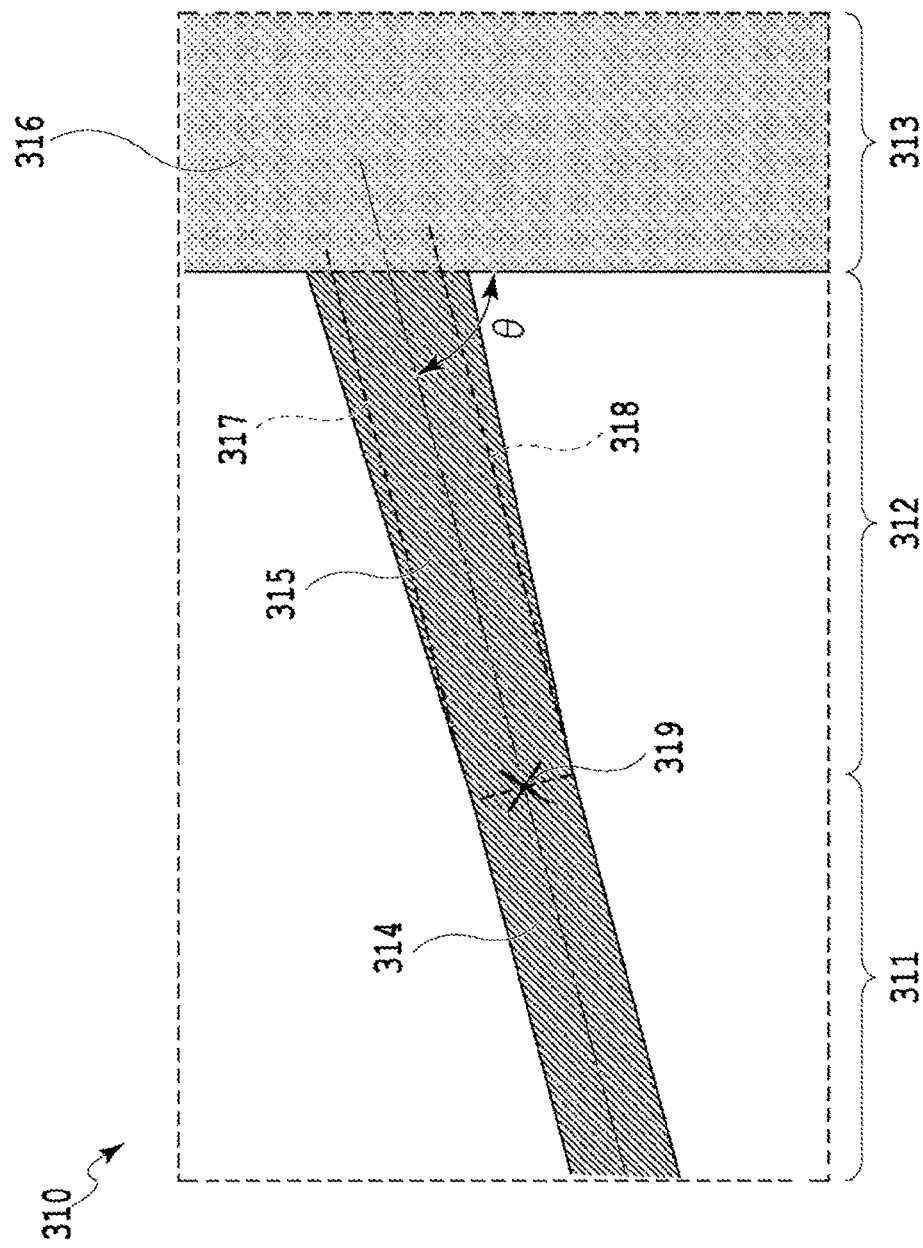
FIG. 13A is a diagram illustrating a photomask pattern in a joint portion of a waveguide of a partial circuit pattern divided into each photomask according to a third embodiment of the present invention.
Figure 13B:
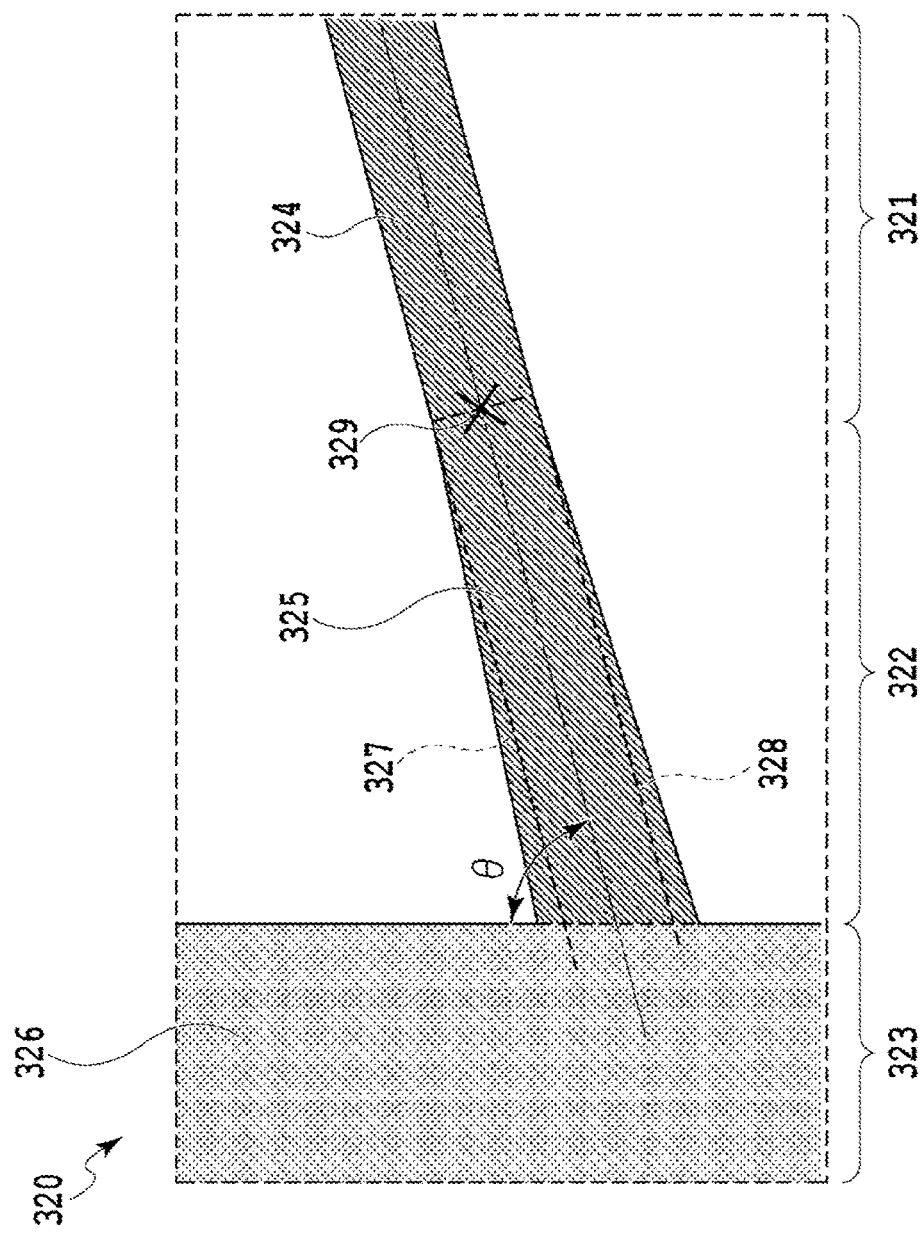
FIG. 13B is a diagram illustrating a photomask pattern in the joint portion of the waveguide of a partial circuit pattern divided into each photomask according to the third embodiment of the present invention.

Each of FIGS. 13A and 13B is a diagram illustrating a photomask pattern in a joint portion of a waveguide of a partial circuit pattern divided into each photomask according to a third embodiment of the present invention. In the photomask pattern according to the first embodiment, the waveguide direction of the divided waveguide pattern is laid out perpendicular ($\theta = 90°$) to the division boundary line to each photomask. The photomask pattern according to the third embodiment is different in that the waveguide direction of the divided waveguide pattern is laid out obliquely ($\theta \neq 90°$) with respect to the division boundary line to each photomask. The photomask pattern is the same as the photomask pattern according to the first embodiment in the basic idea of the configuration of the photomask pattern, and the method of using the photomask pattern. The photomasks 110 and 120 described in the first embodiment respectively correspond to photomasks 310 and 320 in the third embodiment. The pattern of each of the photomasks 310 and 320 has a pattern shape for which a positive photoresist is assumed to be used in the exposure step, similarly to the first embodiment. A hatched portion is a light shielding pattern, and the other portion is a transmissive pattern.

Similarly to the first embodiment, the photomask 310 (320) includes a normal drawing region 311 (321), a joint extension region 312 (322), and an outer peripheral portion 313 (323). Tapered patterns 315 and 325 are drawn in the joint extension regions 312 and 322, respectively. Although the shape is slightly different from that of the first embodiment since $\theta \neq 90°$, it is sufficient that design is performed such that the pattern width is changed at a predetermined width change rate in the taper patterns 315 and 325 similarly to the first embodiment. Also in the present embodiment, the photomasks are used such that exposure is performed by overlapping the alignment positions 319 and 329 in the exposure step.

Also in the third embodiment, advantages similar to those of the first embodiment can be obtained. That is, since the joint extension regions 312 and 322 are included, the loss value at the joint portion can be suppressed to be small even if the relative positional deviation of each photomask occurs in any direction at the time of exposure. In addition, even in a case where the amount of exposure is different in each photomask at the time of exposure, the loss at the joint can be suppressed.

Also in the second embodiment having a pattern shape for which the negative photoresist is assumed to be used in the exposure step, it is possible to arrange the second embodiment in a layout of $\theta \neq 90$ as in the present embodiment.

As described above, even if the waveguide direction of the divided waveguide pattern is oblique ($\theta \neq 90°$) with respect to the division boundary line to each photomask, the loss at the joint is suppressed. Thus, application of the present embodiment provides an advantage of increasing a degree of freedom of a division portion.

Fourth Embodiment: Case Where Waveguide Pattern at Division Boundary is Bent Waveguide So far, the description has been given on the premise that the waveguide at the joint portion of the partial circuit pattern is a straight waveguide having a constant width, that is, the connection portion 25 is a straight waveguide having the waveguide width $W_0$. However, the waveguide at the joint portion of the partial circuit pattern is not limited to the straight waveguide, and may be a bent waveguide, or a tapered waveguide in which the waveguide width changes. That is, a division portion into the partial circuit pattern is not necessarily a portion of the straight waveguide, and may be a portion of the bent waveguide or a portion of the tapered waveguide. Further, the division portion may be a portion of a tapered bent waveguide that is a combination of the bent waveguide and the tapered waveguide.

Figure 14:
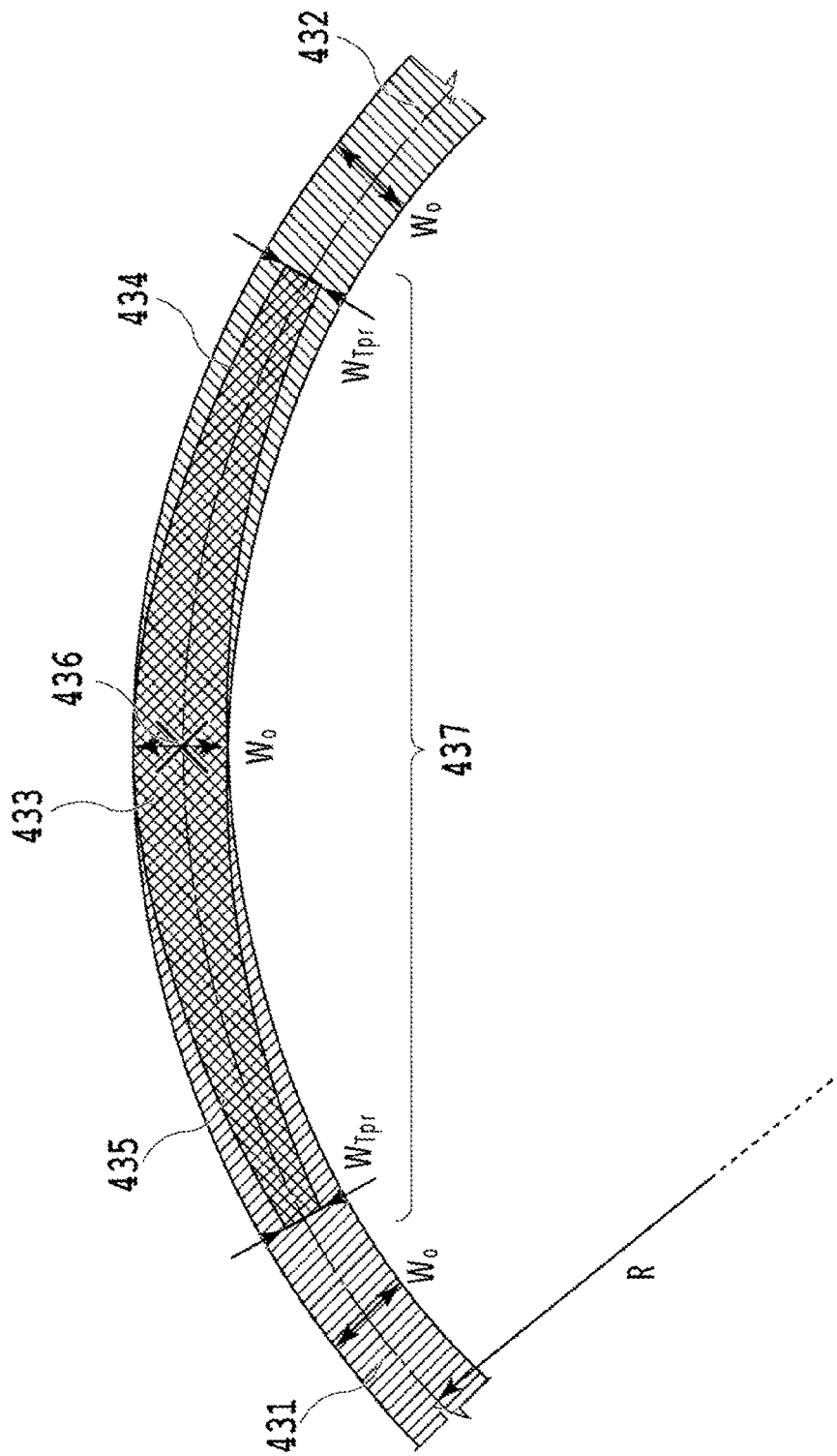
FIG. 14 is a diagram illustrating a state of an exposure pattern when a photomask pattern in a fourth embodiment of the present invention is used.

FIG. 14 is a diagram illustrating a state of an exposure pattern when a photomask pattern in a fourth embodiment of the present invention is used. Only a portion to be a core is described. In the fourth embodiment, the division portion into the partial circuit pattern is a bent waveguide. An exposed portion 431 is a portion exposed with only one photomask, an exposed portion 432 is a portion exposed with only the other photomask, and an exposed portion 433 is a portion exposed with both the photomasks. An overlapping region 437 including the exposed portion 433 is a region in which the pattern is formed by overlapping both the photomasks due to presence of a joint extension region in the photomask pattern in the fourth embodiment. A case is illustrated where a photomask pattern using a negative photoresist in an exposure step is used, which is easy in illustration in an exposure pattern. In addition, a case is illustrated where there is no relative positional deviation of each photomask at the time of exposure.

In the fourth embodiment, the widths of tapered shape exposed portions 434 and 435 are the same as the width $W_0$ of the exposed portions 432 and 431 at a joint center position 436, but gradually become narrower as the distance from the joint center position 436 increases, and become $W_{Tpr}$ ($< W_0$) at the distal ends. In addition, the tapered shape exposed portions 434 and 435 do not have a simple straight tapered shape, but have a curved tapered shape according to the curvature of the bent waveguide.

Also in the fourth embodiment, in the exposure pattern in a case where there is no relative positional deviation of each photomask at the time of exposure, similarly to the second embodiment, the width of the tapered shape exposed portion is the same as the width of all the exposed portions at the joint center position. Then, there is a characteristic of an exposure pattern in which the width gradually decreases as compared with the width of the exposed portion at the same position, as the distance from the joint center position increases. Due to such a characteristic of the exposure pattern, even in a case where there is a relative positional deviation of each photomask at the time of exposure, the position of the waveguide center in a direction perpendicular to the waveguide direction and the waveguide width always change slowly, so that the loss at the joint portion can be suppressed.

Even in a case where a photomask pattern using a positive photoresist is used in the exposure step, the present invention can be applied to the portion of the bent waveguide and the portion of the tapered waveguide on the basis of a similar idea. In addition, even in a case where the waveguide direction of the divided waveguide pattern is laid out obliquely ($\theta \neq 90°$) with respect to the division boundary line to each photomask, the present invention can be applied to the portion of the bent waveguide or the portion of the tapered waveguide based on the basis of a similar idea.

As described above, since the waveguide at the joint portion of the partial circuit pattern can suppress the loss at the joint even in the case of the bent waveguide, it is possible to obtain an advantage that the degree of freedom of the division portion is further increased by the application of the present embodiment.

Figure 15:
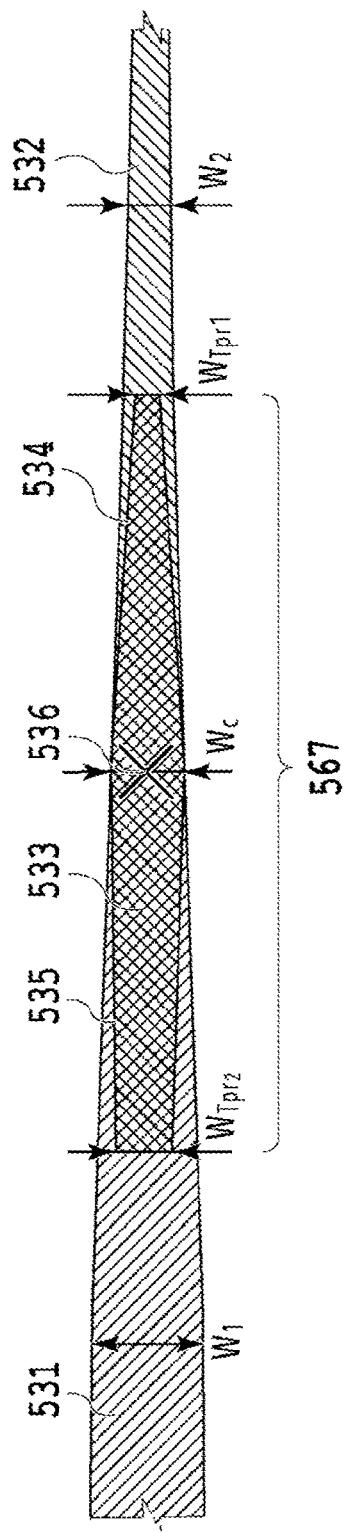
FIG. 15 is a diagram illustrating a state of an exposure pattern when a photomask pattern in a fifth embodiment of the present invention is used.

Fifth Embodiment: Case Where Waveguide Pattern at Division Boundary is Tapered Waveguide FIG. 15 is a diagram illustrating a state of an exposure pattern when a photomask pattern in a fifth embodiment of the present invention is used. Only a portion to be a core is described. In the fifth embodiment, the division portion into the partial circuit pattern is a tapered waveguide. An exposed portion 531 is a portion exposed with only one photomask, an exposed portion 532 is a portion exposed with only the other photomask, and an exposed portion 533 is a portion exposed with both the photomasks. An overlapping region 537 including the exposed portion 533 is a region in which the pattern is formed by overlapping both the photomasks due to presence of a joint extension region in the photomask pattern in the fifth embodiment. A case is illustrated where a photomask pattern using a negative photoresist in an exposure step is used, which is easy in illustration in an exposure pattern. In addition, a case is illustrated where there is no relative positional deviation of each photomask at the time of exposure.

Also in the fifth embodiment, the widths of tapered shape exposed portions 534 and 535 are the same as a width $W_C$ at the joint center of the exposed portions 532 and 531 at a joint center position 536. Further, as the distance from the joint center position 536 increases, the widths gradually decrease as compared with the widths of the exposed portions 532 and 531 at the same positions, and are $W_{Tpr1}$ ($<W_2$) and $W_{Tpr2}$ ($<W_1$) at the distal ends. Here, the tapered shape exposed portions 534 and 535 do not necessarily have a tapered shape. In the exposure pattern illustrated in FIG. 15, the width on the wider side of the original tapered waveguide to be divided is $W_1$, the width on the narrower side is $W_2$, and the width at the joint center position is $W_C$, and the magnitude relationship is $W_1 > W_C > W_2$. Although the width of the distal end portion of the tapered shape exposed portion 535 is $W_{Tpr2}$, the width satisfies $W_{Tpr2} < W_1$, but $W_{Tpr2} < W_C$ is not necessarily satisfied, and $W_{Tpr2} \geq W_C$ may be satisfied. Thus, a shape of the tapered shape exposed portion 535 may be a shape of the same width ($W_{Tpr2} = W_C$) or a shape of reverse taper ($W_{Tpr2} > W_C$). However, even in those cases, the width of $W_{Tpr2}$ is always smaller than the width of the exposed portion 531 at the position of the distal end portion of the tapered shape exposed portion 535.

The fifth embodiment also has the same characteristic of the exposure pattern as the fourth embodiment, and thus, even in a case where there is a relative positional deviation of each photomask at the time of exposure, the position of the waveguide center in a direction perpendicular to the waveguide direction and the waveguide width always change slowly, so that the loss at the joint portion can be suppressed.

Even in a case where a photomask pattern using a positive photoresist is used in the exposure step, the present invention can be applied to the portion of the bent waveguide and the portion of the tapered waveguide on the basis of a similar idea. In addition, even in a case where the waveguide direction of the divided waveguide pattern is laid out obliquely ($\theta \neq 90°$) with respect to the division boundary line to each photomask, the present invention can be applied to the portion of the bent waveguide or the portion of the tapered waveguide based on the basis of a similar idea.

As described above, since the waveguide at the joint portion of the partial circuit pattern can suppress the loss at the joint even in the case of the bent waveguide, it is possible to obtain an advantage that the degree of freedom of the division portion is further increased by the application of the present embodiment.

Sixth Embodiment: Case Where Taper Pattern at Joint Extension Portion is Non-Linear Tapered Waveguide In the first to fifth embodiments, the shape of the taper pattern in the joint extension region is a linear taper pattern in which the width changes by a constant value with respect to the waveguide direction, but is not limited thereto, and may be a non-linear taper pattern in which the width changes non-linearly. For example, there is a non-linear tapered shape in which the waveguide width W is exponentially changed from the initial waveguide width $W_0$ with respect to the coordinate z along the waveguide direction. Specific examples include a tapered shape whose width changes with $$W(z) = (W_0 + b) \cdot e^{a \cdot z} - b \qquad \text{Math. 1}$$

Here, a is a change rate of the waveguide width per unit length of the exponential change component, and b is a parameter for adjusting the exponential change component and the linear change component. In the first embodiment using the positive photoresist, $a>0$, and in the second embodiment using the negative photoresist, $a<0$. When the non-linear tapered shape is used, a change ratio of the field distribution per unit propagation length can be made substantially constant. That is, since the square of the absolute value of the overlap integral of the normalized field distribution of the fundamental modes before and after propagating through a minute section is constant in each section, conversion from the fundamental mode to another mode such as a higher order mode or a radiation mode can be suppressed with a short taper length.

Figure 16:
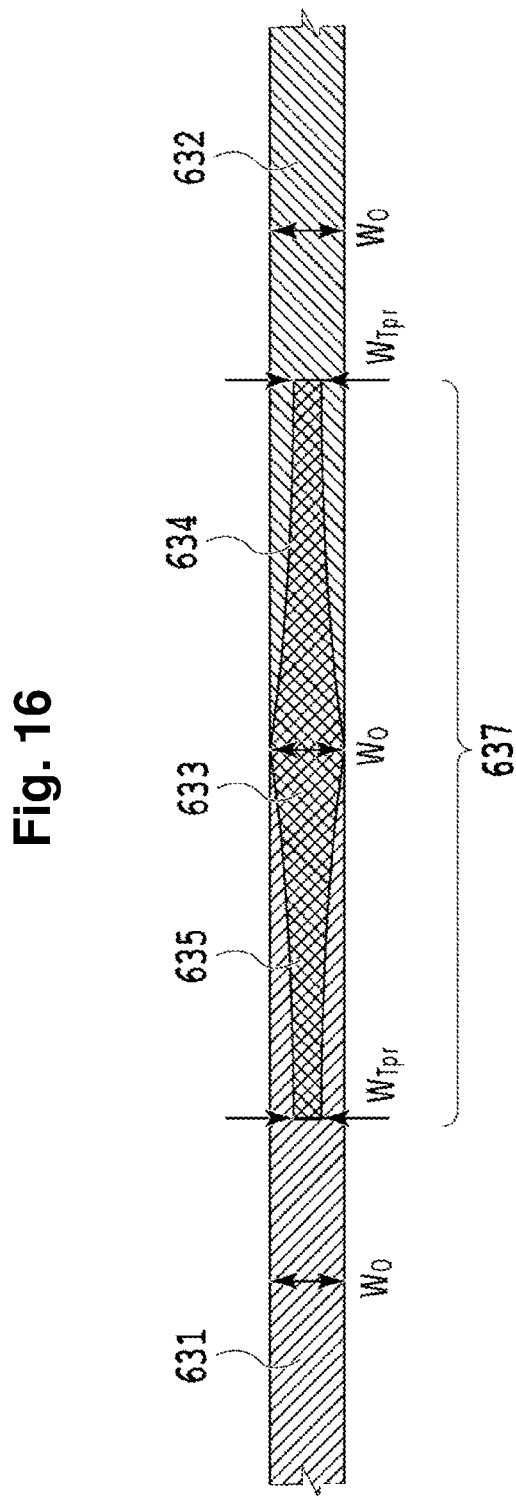
FIG. 16 is a diagram illustrating a state of an exposure pattern when a photomask pattern in a sixth embodiment of the present invention is used.

FIG. 16 is a diagram illustrating a state of an exposure pattern when a photomask pattern in a sixth embodiment of the present invention is used. Only a portion to be a core is described. Also in the present embodiment, a case is illustrated where a photomask pattern using a negative photoresist in an exposure step is used, which is easy in illustration in an exposure pattern. In addition, a case is illustrated where there is no relative positional deviation of each photomask at the time of exposure. An exposed portion 631 is a portion exposed with only one photomask, an exposed portion 632 is a portion exposed with only the other photomask, and an exposed portion 633 is a portion exposed with both the photomasks. An overlapping region 637 including the exposed portion 633 is a region in which the pattern is formed by overlapping both the photomasks due to presence of a joint extension region in the photomask pattern in the sixth embodiment. In the present embodiment, tapered shape exposed portions 634 and 635 have a non-linear tapered shape.

Even in a case where a photomask pattern using a positive photoresist is used in the exposure step, a non-linear taper pattern in which the width of the taper pattern changes non-linearly can be applied on the basis of a similar idea. In addition, in a case where the waveguide direction of the divided waveguide pattern is laid out obliquely ($\theta \neq 90°$) with respect to the division boundary line to each photomask, even in a case where the division portion into the partial circuit pattern is a bent waveguide or a tapered waveguide, the non-linear tapered shape can be applied on the basis of a similar idea.

Seventh Embodiment: Case Where Overlap in Z Direction of Taper Pattern at Joint Extension Portion Is Reduced In the above embodiments, since a portion exposed with both of the photomasks divided into the partial circuit patterns are exposed twice, the amount of exposure is twice as large as that of a portion exposed with only one of the photomasks. For that reason, the portion exposed with both the photomasks is effectively a region slightly wider than an exposure region defined by the photomask.

For example, in the first embodiment, in the example of using the positive photoresist illustrated in FIG. 6A, the amount of exposure of the exposed portion 133 is twice the amount of exposure of the exposed portions 131 and 132. Thus, the exposure region is slightly widened near the joint center position (exposure position 134), and the width of an unexposed region is slightly narrowed, that is, the width of the waveguide core near the center position of the joint is slightly narrowed. In the second embodiment using the negative photoresist, since the exposed region becomes the waveguide core, the width of the waveguide core near the joint center position is slightly widened. To avoid such a problem of an effective increase in the amount of exposure, instead of arranging the taper pattern only in the joint extension region, it is sufficient that the taper pattern is arranged to bite into the normal drawing region.

Figure 17:
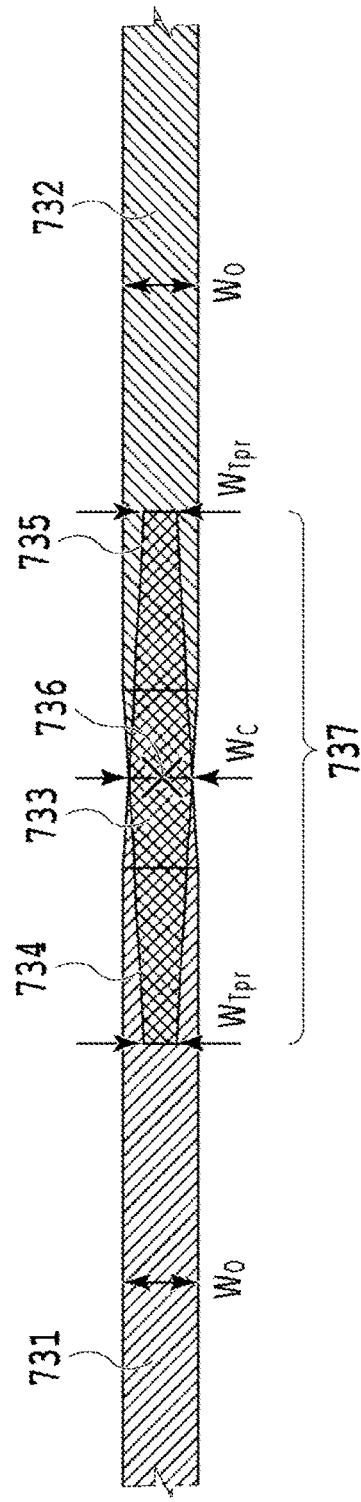
FIG. 17 is a diagram illustrating a state of an exposure pattern when a photomask pattern in a seventh embodiment of the present invention is used.

FIG. 17 is a diagram illustrating a state of an exposure pattern when a photomask pattern in a seventh embodiment of the present invention is used. Only a portion to be a core is described. Also in the present embodiment, a case is illustrated where a photomask pattern using a negative photoresist in an exposure step is used, which is easy in illustration in an exposure pattern. In addition, a case is illustrated where there is no relative positional deviation of each photomask at the time of exposure. An exposed portion 731 is a portion exposed with only one photomask, an exposed portion 732 is a portion exposed with only the other photomask, and an exposed portion 733 is a portion exposed with both the photomasks. An overlapping region 737 including the exposed portion 733 is a region in which the pattern is formed by overlapping both the photomasks due to presence of a joint extension region in the photomask pattern in the seventh embodiment.

In the photomask according to the seventh embodiment, the taper pattern is arranged to bite into the normal drawing region. That is, the taper patterns are arranged on the photomask such that positions inside tapered shape exposed portions 734 and 735 become a joint center position 736. The tapered shape exposed portions are formed in this way, whereby the width $W_C$ of the exposure region is slightly narrowed at the joint center position 736 ($W_C < W_0$). By selecting an amount of bite of the taper pattern into the normal drawing region to achieve $W_C$ that cancels an effective amount of spread of the exposed portion 733 due to the doubled amount of exposure, it is possible to suppress the deviation of the waveguide core width to be finally finished.

The same applies to a case where a photomask pattern using a positive photoresist is used in the exposure step, and if the taper pattern is arranged to bite into the normal drawing region instead of arranging the taper pattern only in the joint extension region, it is possible to suppress the deviation of the waveguide core width to be finally finished.

In a case where the waveguide direction of the divided waveguide pattern is laid out obliquely ($\theta \neq 90°$) with respect to the division boundary line to each photomask, even in a case where the division portion into the partial circuit pattern is a bent waveguide or a tapered waveguide, and further, the shape of the tapered pattern is a non-linear tapered shape, the present embodiment can be applied on the basis of a similar idea.

Other Embodiment

In the above-described embodiments, the waveguide at the joint portion of the partial circuit pattern has been described on the premise that the waveguide basically operates in a single mode (single mode waveguide) and the waveguide mainly guides at least the guided light in the fundamental mode. However, the present invention is not limited thereto, and the waveguide may be a waveguide that operates in multiple modes (multimode waveguide). If the taper length $L_{Tpr}$ is provided so that the field distribution of each mode changes sufficiently slowly, that is, adiabatically, the waveguide at the joint portion may be a multimode waveguide, and the configurations of the above-described embodiments can be applied.

In general, in the multimode waveguide in which a large number of modes may exist, conversion between the modes is likely to occur with a slight disturbance. Thus, the taper length $L_{Tpr}$ required in the multimode waveguide is longer than the taper length $L_{Tpr}$ required in the waveguide that mainly guides the guided light in the fundamental mode. From a viewpoint of making an area of the joint extension region as small as possible, it is desirable that the waveguide is a waveguide that basically operates in a single mode, or a waveguide that mainly guides at least the guided light in the fundamental mode.

Effects of Present Embodiments

According to the above-described embodiments, even if there is a relative positional deviation in the x direction perpendicular to the waveguide direction between the partial circuit patterns, the waveguide pattern at the joint portion has a gentle tapered shape, and the center position of the waveguide gently changes with respect to the waveguide direction. With this pattern shape, the guided light of the fundamental mode propagates while maintaining the fundamental mode, and is hardly converted into a higher order mode and propagates, so that the loss can be suppressed to be extremely small. Further, even if there is a relative positional deviation in the z direction parallel to the waveguide direction between the partial circuit patterns, a gap or an unnecessary transverse waveguide does not occur in the waveguide at the joint portion, and occurrence of the loss can be suppressed. As described above, in a case where the optical circuit is manufactured by joining a plurality of partial circuit patterns in the exposure step, even if alignment accuracy of each partial circuit pattern is low in any direction, the loss at the joint portion can be suppressed to be extremely low in any channel waveguide. In addition, it is possible to provide the optical circuit in which the area of the region of the joint portion is suppressed to be small.

According to the above-described embodiments, it is possible to manufacture a desired optical circuit by joining the plurality of partial circuit patterns in the exposure step with little loss increase. This makes it possible to provide a large-scale optical circuit having low loss optical characteristics. In addition, a plurality of types of element circuits, and element circuits with a plurality of parameters are designed as partial circuit patterns and prepared in advance as photomasks. As a result, a desired optical circuit having low loss optical characteristics can be manufactured from the exposure step, and a design step can be shortened and the photomask can be made common. Further, since a desired optical circuit can be manufactured by combining photomasks having different projection magnifications, a large-scale optical circuit having high performance and low loss optical characteristics can be provided at low cost.

EXAMPLES

In the following, examples will be described of a 16×16 matrix switch in which the above-described embodiments are applied to optical circuits using a silica-based waveguide technology. These optical circuits are manufactured on a silicon substrate using a known combination of a glass film deposition technology such as a flame hydrolysis deposition (FHD) method, and a microfabrication technology such as reactive ion etching (RIE). A waveguide having a relative refractive index difference Δ of 2% is used, and design is performed setting that the minimum bending radius of the bent waveguide is designed is 1 mm.

Example 1: Example of Application to Large-Scale Matrix Switch Using Mask Divided into Two FIG. 18 is a diagram illustrating a configuration of an optical circuit in Example 1 of the present invention. The optical circuit of Example 1 is a 16×16 matrix switch 800 capable of performing switching and connection of input and output in a non-blocking manner by any combination. The 16×16 matrix switch 800 includes 16 input waveguides 831, switch element arrays 801 to 816 of 16 stages subsequent thereto, and 16 output waveguides 832 subsequent thereto. The switch element arrays are connected to each other by 32 inter-switch-element connection waveguides 833.

In the switch element arrays 801 to 816, 16 switch elements are arranged in an array, and the switch element include two Mach-Zehnder interferometers with variable phase shifters. Note that the switch element has an orientation in the vertical direction, and the switch element facing upward and the switch element facing downward are alternately arranged in the switch element array. Depending on whether the uppermost switch element in the switch element array faces upward or downward, the switch element arrays have two types of layouts A and B. The switch element array of the layout A is used for the switch element arrays 801 and 803 to 815 of the odd-numbered stages, and the switch element array of the layout B is used for the switch element arrays 802 and 804 to 816 of the even-numbered stages. A detailed configuration of the 16×16 matrix switch is described in Non Patent Literature 2. Unlike the configuration described in Non Patent Literature 2, in Example 1, the switch element arrays 801 to 816 are arranged in a zigzag manner, and the input waveguides 831 and the output waveguides 832 are arranged on the same side.

The size of the 16×16 matrix switch 800 is approximately 70×30 mm. In a case where this optical circuit is manufactured using an exposure machine having a reduction ratio of 1/2, it is necessary to divide the optical circuit into regions of partial circuit patterns 821 and 822 and draw the partial circuit pattern due to a constraint of the size of the photomask. On one photomask, the partial circuit pattern 821, that is, the input waveguides 831, the output waveguides 832, the switch element arrays 801, 802, 807 to 810, 815, and 816, and switch connection waveguides 833a, 833b, 833f to 833j, 833n, and 833o connecting them to each other are drawn. On the other photomask, the partial circuit pattern 822, that is, the switch element arrays 803 to 806 and 811 to 814, and the switch connection waveguides 833b to 833f and 833nj to 833n connecting them to each other are drawn. Since the exposure machine having the reduction ratio of 1/2 is used for both the photomasks, the patterns are drawn at a magnification ratio of 2.

A waveguide pattern of any one of the above-described embodiments or a combination thereof is used, for a joint portion 834 of the waveguide straddling the partial circuit patterns 821 and 822. Specific design parameters of the waveguide pattern at the joint portion are $W_0=5$ μm, $W_{Tpr}=6$ μm, the taper length $L_{Tpr}=200$ μm, and $dW_A=dW_B=(W_{Tpr}-W_0)/2$.

Thus, light guided through the manufactured 16×16 matrix switch 800 passes through four joints while being guided from the input waveguides 831 to the output waveguides 832. In a case where the conventional waveguide pattern at the joint portion is used, when a relative positional deviation of 0.5 μm occurs in the x direction perpendicular to the waveguide direction in the partial circuit patterns 821 and 822, the loss increase caused by the joint portion is 0.6 dB, which is a significant loss increase.

On the other hand, in a case where the waveguide pattern at the joint portion of the above-described embodiments is used, even if a relative positional deviation of 0 to 0.5 μm occurs, the loss increase caused by the joint portion can be suppressed to less than or equal to 0.008 dB, and becomes a value that can be almost ignored. In the matrix switch, the number of joints is approximately proportional to the number of input/output ports. For example, in a 32×32 matrix switch, the pattern is divided into four photomasks and drawn, and there are nine joints. Thus, in a case where the waveguide pattern at the joint portion of the present embodiment is used, the larger the scale of the circuit, the more significantly the loss caused by the joint portion can be suppressed as compared with the conventional case.

According to Example 1, since it is possible to manufacture a desired optical circuit by joining a plurality of partial circuit patterns in the exposure step with little loss increase, it is possible to provide a large-scale optical circuit having low loss optical characteristics.

Example 2: Example in Which Switch Element Array is Divided as Another Mask

An optical circuit of Example 2 is also a 16×16 matrix switch, and a configuration of the manufactured optical circuit is the same as that of Example 1. A difference from Example 1 is that, regarding division into the partial circuit patterns, not only the optical circuit is divided into the regions of the partial circuit patterns 821 and 822, but also the portion of the switch element arrays 801 to 816 is divided.

Figure 19A:
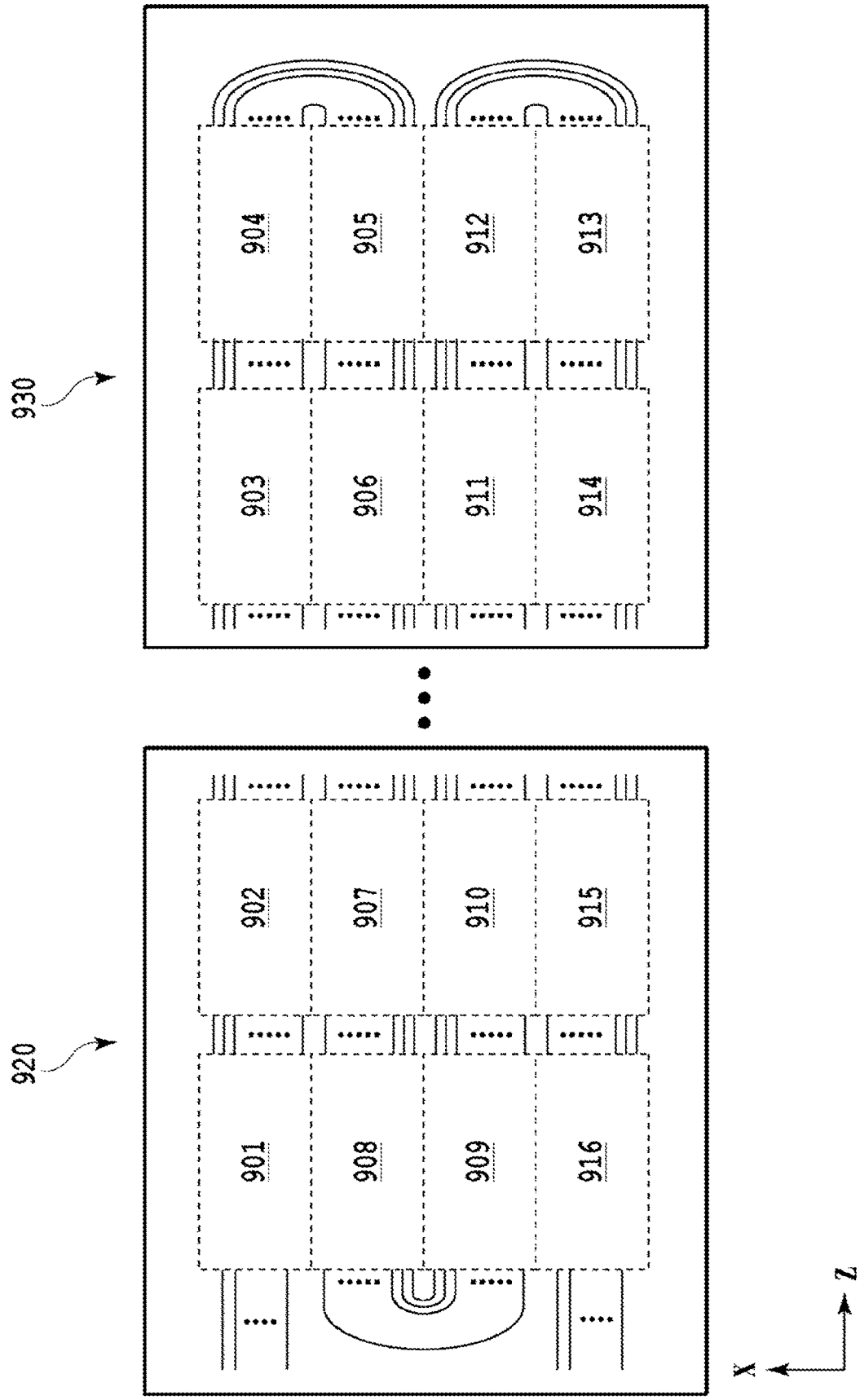
FIG. 19A is a diagram illustrating a layout on a photomask in Example 2 of the present invention.

FIG. 19A is a diagram illustrating a layout on a photomask in Example 2 of the present invention. In a photomask 920, only a pattern obtained by removing the switch element arrays 801, 802, 807 to 810, 815, and 816 that are optical function circuits from the partial circuit pattern 821 of Example 1, that is, only a waveguide for connecting the optical function circuits to each other is drawn. Removed portions are blank portions 901, 902, 907 to 910, 915, and 916, and waveguide patterns are not drawn. In a photomask 930, a pattern obtained by removing the switch element arrays 803 to 806 and 811 to 814 from the partial circuit pattern 822 of Example 1 is drawn. Removed portions are blank portions 903 to 906 and 911 to 914, and waveguide patterns are not drawn.

FIG. 19B is a diagram illustrating a layout on a photomask of a switch element array of Example 2. A plurality of types of patterns of the switch element arrays of the layouts A and B is drawn on a photomask 940 while changing circuit characteristic parameters. For example, three types are drawn as the patterns of the switch element array of the layout A (941, 943, 945), and three types are similarly drawn as the patterns of the switch element array of the layout B (942, 944, 946). An exposure machine having a reduction ratio of 1/2 is used for each of the photomasks 920, 930, and 940, so that the patterns are drawn at the magnification ratio of 2 as in Example 1.

A waveguide pattern of any one of the above-described embodiments or a combination thereof is used, for a joint portion of the waveguide straddling the circuit patterns of the photomasks 920 and 930, and joint portions of the waveguides straddling the blank portions 901 to 916 and the switch element array patterns 941 to 946. Specific design parameters of the waveguide patterns at the joint portions are the same as those in Example 1.

When the optical circuit is actually manufactured, exposure is performed by combining the photomasks 920 and 930 and switch element array patterns (for example, 943 and 944) of the layouts A and B of appropriate circuit characteristic parameters. By allowing an appropriate combination to be selected in this way, it is possible to suppress the number of photomasks to be prepared when optical function circuits of a plurality of specifications are manufactured.

For example, a basic element of the matrix switch is a Mach-Zehnder interferometer with a variable phase shifter as described above, but its design varies depending on the operating wavelength band (S band: 1460 to 1530 nm, C band: 1530 to 1565 nm, L band: 1565 to 1625 nm). In Example 1, in a case where the S band, C band, and L band matrix switches are manufactured, it is necessary to prepare individual photomasks, and a total of six photomasks are required. On the other hand, in Example 2, three types of circuit characteristic patterns are prepared for the photomask 940 and it is sufficient that selection is made from the three types of circuit characteristic patterns, so that only three photomasks are required.

In addition, a plurality of designs may be prepared for manufacturing reasons as well as a difference in the specification of the matrix switch. For example, even in a case where it is desired to slightly change a design value depending on a position of the circuit on the wafer in a case where the film thickness or refractive index of the core layer have a distribution in the wafer plane, the total number of photomasks to be prepared can be suppressed to be small.

In Example 2, light guided through the manufactured 16×16 matrix switch passes through 36 joints while being guided from the input waveguide to the output waveguide. In a case where the conventional waveguide pattern at the joint portion is used, when a relative positional deviation of 0.5 μm occurs in each photomask, the loss increase caused by the joint portion is 5.4 dB in the worst case, which is not an allowable loss increase. On the other hand, in a case where the waveguide pattern at the joint portion of the above-described embodiments is used with the same design parameters as in Example 1, even if a relative positional deviation of 0 to 0.5 μm occurs, the loss increase caused by the joint portion can be suppressed to less than or equal to 0.072 dB even in the worst case, and remains at a sufficiently allowable value.

As described above, a plurality of types of element circuits, optical function circuits with a plurality of parameters, and the like are designed as partial circuit patterns and prepared in advance as photomasks. As a result, a desired optical circuit having low loss optical characteristics can be manufactured from the exposure step, and a design step can be shortened and the photomask can be made common.

Example 3: Example of Combining Photomasks of Equal Magnification Exposure and Reduction Exposure An optical circuit of Example 3 is also a 16×16 matrix switch, and a configuration of the manufactured optical circuit is the same as that of Example 1. In addition, regarding division into the partial circuit patterns, not only the optical circuit is divided into the regions of the partial circuit patterns 821 and 822, but also the portion of the switch element arrays 801 to 816 that are optical function circuits is divided, which is the same as in Example 2. Example 3 is different from Example 2 in that reduction ratios of the photomasks are set to different values between the waveguide patterns of the switch element arrays 801 to 816 and the waveguide pattern in which only the waveguide for connecting the optical function circuits each other is drawn.

Figure 20:
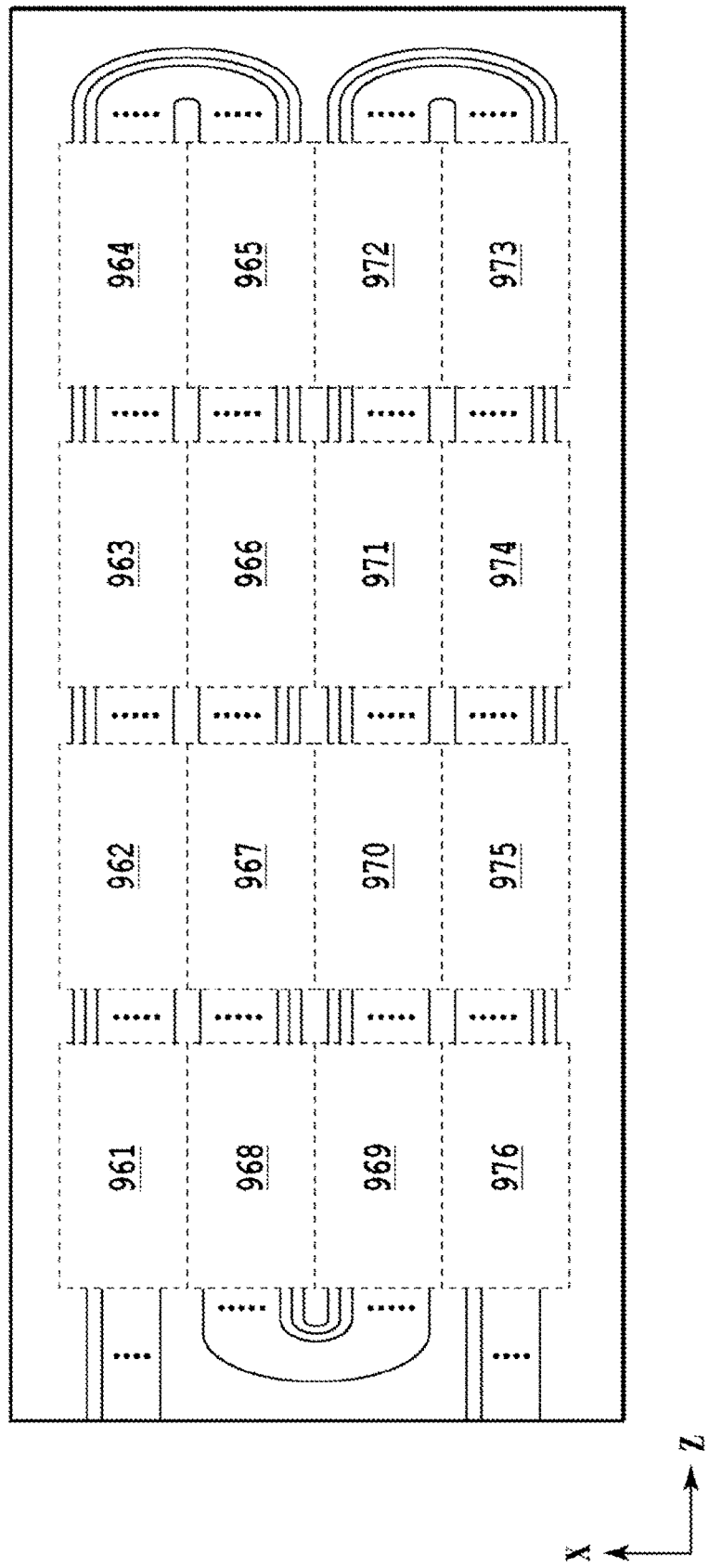
FIG. 20 is a diagram illustrating a layout on a photomask in Example 3 of the present invention.

FIG. 20 is a diagram illustrating a layout on a photomask in Example 3 of the present invention. In a photomask 950, a pattern obtained by removing the switch element arrays 801 to 816 from the pattern 800 of the entire 16×16 matrix switch of Example 1 is drawn at an equal magnification reduction ratio. Removed portions are blank portions 961 to 976, and waveguide patterns are not drawn. In Example 3, the photomask 940 illustrated in FIG. 19B of Example 2 is used in combination with the photomask 950.

The photomask 950 is used for exposure on a substrate using an exposure machine of equal magnification, and the photomask 940 is used for exposure on the substrate using an exposure machine of 1/2 reduction ratio. A waveguide pattern of any one of the above-described embodiments or a combination thereof is used, for joint portions of the wave guides straddling the blank portions 961 to 976 of the photomask 950 and the switch element array patterns 941 to 946. Specific design parameters of the waveguide patterns at the joint portions are the same as those in Example 1.

In the 16×16 matrix switch 800, the switch element arrays 801 to 816 including the Mach-Zehnder interferometer need to be manufactured with high accuracy to obtain desired interference characteristics. On the other hand, input/output waveguides and inter-switch-element connection waveguides do not require so much accuracy. Thus, a reduction exposure machine capable of highly accurate pattern transfer is used for the switch element arrays 801 to 816, and an exposure machine of equal magnification is used for the input/output waveguides and the inter-switch-element connection waveguides. As described above, by changing a drawing magnification of the photomask depending on required accuracy, the number of photomasks required in total three in Example 2 can be reduced to two in Example 3.

In Example 3, since the exposure machine to be used is different depending on the photomask, and the projection reduction ratio is also different, there is a high possibility that the effective amount of exposure is different in each photomask. However, as described above, the joint of the waveguide in the present embodiment can not only suppress the loss at the joint in a case where there is a relative positional deviation of each photomask at the time of exposure, but also suppress the loss at the joint in a case where the amount of exposure is different in each photomask.

As described above, since a desired optical circuit can be manufactured by combining photomasks having different projection magnifications, a large-scale optical circuit having high performance and low loss optical characteristics can be provided at low cost.

In Examples 1 to 3, the matrix switch was taken as an example of the optical circuit. The present invention is not limited thereto, and can also be applied to an optical switch having another configuration such as a splitter switch (also referred to as a multicast switch) described in Non Patent Literature 3. Further, the optical circuit may be an optical circuit including a wavelength multiplexer/demultiplexer such as an arrayed waveguide grating, an optical circuit including an optical modulator and a demodulator, or the like.

Example 4: Example of Preparing Plurality of Mask Patterns on One Mask Substrate In Examples 1 to 3, the divided partial circuit patterns are drawn on a plurality of different photomask substrates, but the present invention is not limited thereto. The divided partial circuit patterns may be drawn on the same photomask substrate.

Figure 21:
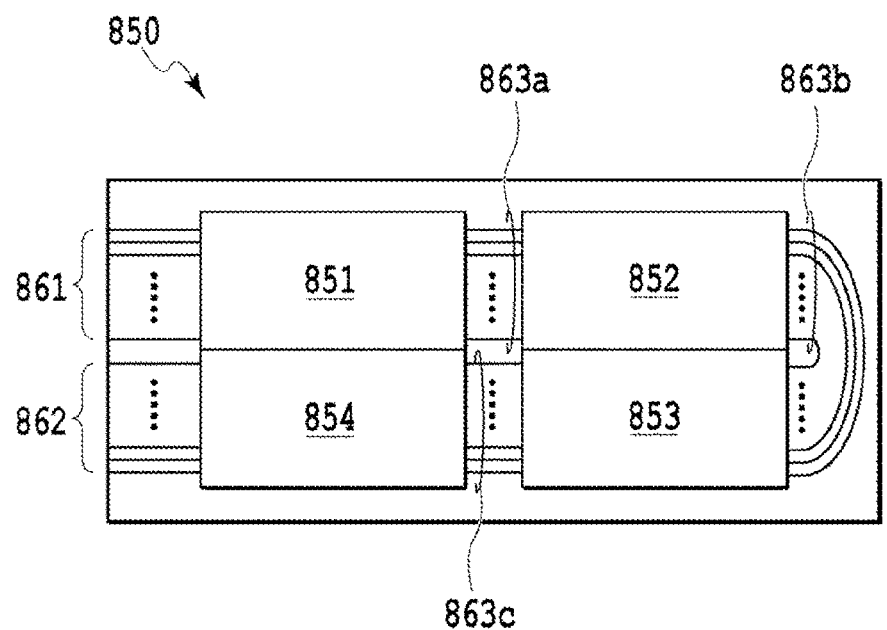
FIG. 21 is a diagram illustrating a conceptual configuration of an optical circuit in Example 4 of the present invention.

FIG. 21 is a diagram illustrating a conceptual configuration of an optical circuit in Example 4 of the present invention. An optical circuit 850 of Example 4 is illustrated as a conceptual configuration. The optical circuit 850 includes an input waveguide 861, circuit element blocks 851 to 854 of N=4 stages subsequent thereto, and an output waveguide 862 subsequent thereto. The circuit element blocks that are optical function circuits are connected to each other by inter-element connection waveguides 863*a* to 863*c*.

It is assumed that various circuit element blocks are combined and incorporated in each circuit element block. For example, an optical circuit is conceivable in which a circuit element block A is incorporated in all of the circuit element blocks 851 to 854. In addition, an optical circuit is conceivable in which circuit element blocks having different functions of A, B, C, and D are respectively incorporated in the circuit element blocks 851 to 854. Assuming that there are four types of circuit element block types M, combinations of $MN=4^4=256$ types are conceivable.

Figure 22:
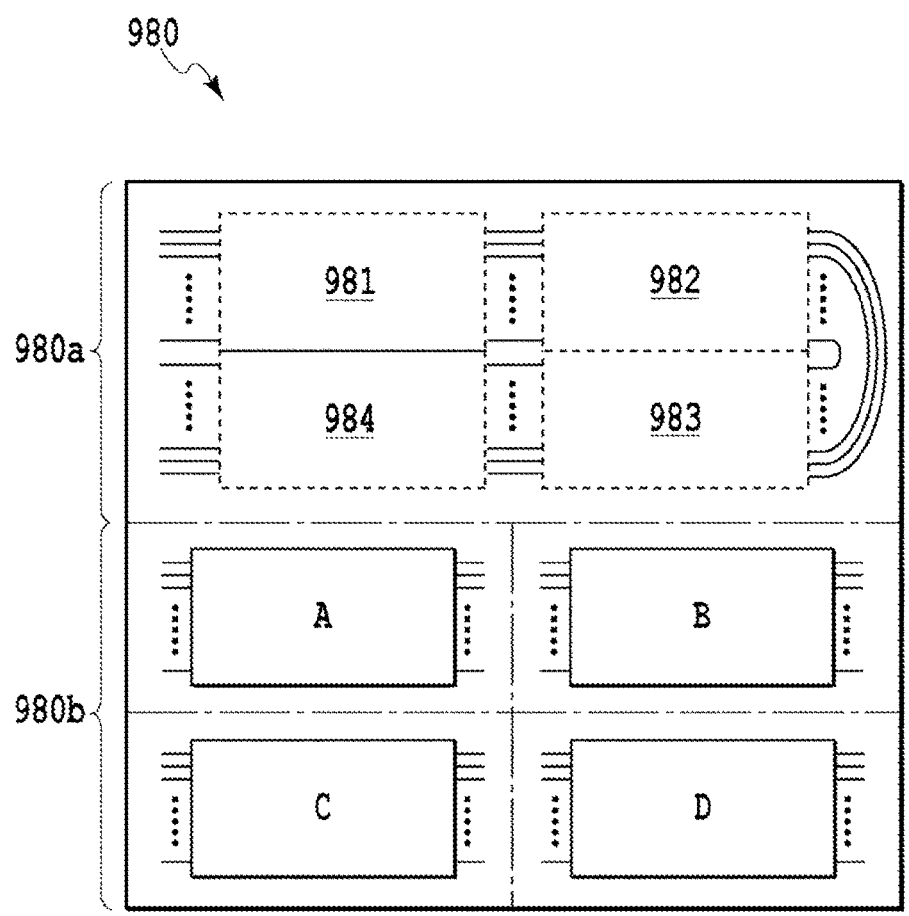
FIG. 22 is a diagram illustrating a layout example on a photomask in Example 4.

FIG. 22 is a diagram illustrating a layout example on a photomask in Example 4. On an upper half 980*a* of a photomask 980, a pattern of only a framework of the optical circuit obtained by removing the circuit element blocks 851 to 854 from the optical circuit 850 is drawn. Removed portions are blank portions 981 to 984, and waveguide patterns are not drawn. Element block patterns A, B, C, and D for circuit element blocks are drawn on a lower half 980*b* of the photomask 980. A waveguide pattern of any one of the above-described embodiments or a combination thereof is used, for joint portions of the wave guides straddling the blank portions 981 to 984 and the element block patterns A, B, C, and D. Specific design parameters of the waveguide patterns at the joint portions are the same as those in Example 1.

By using the photomask 980 and using a framework pattern of the optical circuit and an element block pattern of any combination, as described above, all 256 optical circuits can be manufactured by one photomask. As described above, any of the above-described embodiments can be applied by drawing the divided partial circuit patterns on the same photomask substrate.

In Examples 1 to 4, the division portion into the plurality of partial circuit patterns is the waveguide portion between the interferometers, but division may be performed at the waveguide portion inside the interferometer. However, the division inside the interferometer causes not only an increase in loss at a divided portion but also a shift in optical path length, and thus it is desirable to avoid the division if possible.

The invention claimed is:

1. A photomask in which a waveguide pattern of an optical circuit is divided into a plurality of regions and drawn, the photomask comprising:
    a first photomask and a second photomask;
    in order to connect waveguides divided and drawn to each other in the first and second photomasks, a waveguide pattern for drawing a joint region in which a width of each waveguide changes as the each waveguide goes toward an outer peripheral portion is formed in each of the first and second photomasks, wherein
    the first and second photomasks are overlapped and exposed so that the joint regions of the first and second photomasks are adjacent to each other across the boundary of the joint region where the change in the waveguide width begins, and the sides of the joint region where the waveguide width becomes wider are located on opposite sides of the boundary, thereby connecting the waveguides in the first and second photomasks to each other.

2. The photomask according to claim 1, wherein in the waveguide pattern, the width of each waveguide changes such that overlapping of the joint regions decreases.

3. The photomask according to claim 1, wherein the waveguide pattern is a linear taper pattern in which the width of each waveguide changes linearly as the each waveguide goes toward the outer peripheral portion or a non-linear taper pattern in which the width of each waveguide changes non-linearly.

4. The photomask according to claim 1, wherein a waveguide width of the joint region exposed with the first and second photomasks in an overlapping manner is different from a waveguide width of another region depending on an amount of exposure.

5. An optical waveguide manufactured with the photomask according to claim 1, wherein the optical waveguide is manufactured by overlapping the joint regions of the first and second photomasks and performing exposure.

6. An optical circuit comprising the optical waveguide according to claim 5, wherein
the photomask is divided into the first photomask including waveguide patterns of a plurality of optical function circuits, and the second photomask including a waveguide pattern of a waveguide connected to each of the optical function circuits,
the waveguide patterns of the optical function circuits have different circuit characteristic parameters or different functions, and
the optical circuit is manufactured by combining the first photomask of an optical function circuit selected from the plurality of optical function circuits with the second photomask.

7. The optical circuit according to claim 6, wherein a drawing magnification of the first photomask is different from a drawing magnification of the second photomask.

8. A method of manufacturing an optical waveguide with a photomask in which a waveguide pattern of an optical circuit is divided into a plurality of regions and drawn, the photomask including two photomasks, the method comprising:
overlapping and exposing the two photomasks so that the joint regions of the two photomasks are adjacent to each other across the boundary of the joint region where the change in the waveguide width begins, and the sides of the joint region where the waveguide width becomes wider are located on opposite sides of the boundary, thereby connecting the waveguides to each other.

* * * * *